（12） United States Patent
Fujita et al.

(10) Patent No.: US 9,698,353 B2
(45) Date of Patent: Jul. 4, 2017

(54) LIGHT-EMITTING ELEMENT, LIGHT EMISSION APPARATUS, AUTHENTICATION APPARATUS, AND ELECTRONIC MACHINE

(71) Applicant: SEIKO EPSON CORPORATION, Tokyo (JP)

(72) Inventors: Tetsuji Fujita, Nagano (JP); Yuiga Hamade, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 301 days.

(21) Appl. No.: 14/681,558

(22) Filed: Apr. 8, 2015

(65) Prior Publication Data

US 2015/0295182 A1  Oct. 15, 2015

(30) Foreign Application Priority Data

Apr. 9, 2014  (JP) .................................. 2014-080469
Apr. 6, 2015  (JP) .................................. 2015-077344

(51) Int. Cl.
*H01L 51/00* (2006.01)
*H01L 51/50* (2006.01)

(52) U.S. Cl.
CPC ...... *H01L 51/0061* (2013.01); *H01L 51/0054* (2013.01); *H01L 51/0055* (2013.01);
(Continued)

(58) Field of Classification Search
CPC ............. H01L 51/0061; H01L 51/0055; H01L 51/0071; H01L 51/0068; H01L 51/0058;
(Continued)

(56) References Cited

U.S. PATENT DOCUMENTS 4,769,292 A    9/1988  Tang et al.
5,104,740 A    4/1992  Shinkai et al.
(Continued)

FOREIGN PATENT DOCUMENTS

EP    0281381 B1    7/1992
JP    63-264692 A   11/1988
(Continued)

OTHER PUBLICATIONS

Debad et al.; Dibenzotetraphenylperiflanthene: Synthesis, Photophysical Properties, and Electrogenerated Chemiluminescence; Journal of the American Chemical Society 118; 1996; pp. 2374-2379.
(Continued)

*Primary Examiner* — Michael M Bernshteyn
(74) *Attorney, Agent, or Firm* — Global IP Counselors, LLP

(57) ABSTRACT

A light-emitting element includes an anode, a cathode, and a light emission layer. The light emission layer is arranged between the anode and the cathode and configured to emit light by energization between the anode and the cathode. The light emission layer includes a compound represented by a general formula NIR-D as a light emission material and a compound represented by a formula IRH-1 as a host material of the light emission material. The general formula NIR-D is (Continued)

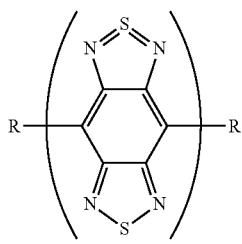

in which each R independently indicates group comprising a phenyl group, a thiophenyl group, a furyl group, or at least one species of derivatives thereof. The formula IRH-1 is

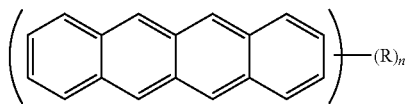

in which n indicates a natural number 1 to 12, and each R independently indicates a hydrogen atom, an alkyl group, an optionally substituted aryl group, or an arylamino group.

16 Claims, 7 Drawing Sheets

(52) U.S. Cl.
CPC ...... *H01L 51/0058* (2013.01); *H01L 51/0068* (2013.01); *H01L 51/0071* (2013.01); *H01L 51/5012* (2013.01); *H01L 51/5072* (2013.01); *H01L 2251/558* (2013.01)

(58) Field of Classification Search
CPC ............ H01L 51/0065; H01L 51/0069; H01L 51/0054; H01L 51/0052; H01L 51/0072; H01L 2251/558
USPC ......................................................... 428/690
See application file for complete search history.

(56) References Cited

U.S. PATENT DOCUMENTS

| | | | |
|---|---|---|---|
| 5,294,869 A | 3/1994 | Tang et al. | |
| 5,449,564 A | 9/1995 | Nishio et al. | |
| 6,004,685 A | 12/1999 | Antoniadis et al. | |
| 6,680,131 B1 | 1/2004 | Ishibashi et al. | |
| 2012/0262057 A1* | 10/2012 | Fujita | C07D 471/04 313/504 |
| 2013/0037784 A1 | 2/2013 | Yamamoto et al. | |
| 2013/0221334 A1* | 8/2013 | Yamamoto | C07D 513/04 257/40 |
| 2014/0110686 A1* | 4/2014 | Fujita | C07D 513/04 257/40 |

FOREIGN PATENT DOCUMENTS

| | | |
|---|---|---|
| JP | 02-255788 A | 10/1990 |
| JP | 03-000791 A | 1/1991 |
| JP | 03-000792 A | 1/1991 |
| JP | 03-162481 A | 7/1991 |
| JP | 03-177486 A | 8/1991 |
| JP | 05-032966 A | 2/1993 |
| JP | 05-214334 A | 8/1993 |
| JP | 05-258859 A | 10/1993 |
| JP | 06-073374 A | 3/1994 |
| JP | 06-093257 A | 4/1994 |
| JP | 06-136359 A | 5/1994 |
| JP | 06-145146 A | 5/1994 |
| JP | 06-240246 | 8/1994 |
| JP | 10-330295 A | 12/1998 |
| JP | 11-233261 A | 8/1999 |
| JP | 2000-091073 A | 3/2000 |
| JP | 2001-110570 A | 4/2001 |
| JP | 2012-224567 A | 11/2012 |
| JP | 2013-035784 A | 2/2013 |
| JP | 2013-124231 A | 6/2013 |
| JP | 2013-177327 A | 9/2013 |
| JP | 2014-080400 A | 5/2014 |
| JP | 2014-080401 A | 5/2014 |
| JP | 2014-080402 A | 5/2014 |
| JP | 2014-082406 A | 5/2014 |

OTHER PUBLICATIONS

Kawabe et al.; Electroluminescence of Green Light Region in Doped Anthracene; Japanese Journal of Applied Physics 10; 1971; pp. 527-528.

Qian et al.; Near-Infrared Organic Compounds and Emerging Applications; Chemistry Asian Journal 5; 2010; pp. 1006-1029.

* cited by examiner

LIGHT-EMITTING ELEMENT, LIGHT EMISSION APPARATUS, AUTHENTICATION APPARATUS, AND ELECTRONIC MACHINE

CROSS-REFERENCE TO RELATED APPLICATIONS

This application claims priority to Japanese Patent Application No. 2014-080469 filed on Apr. 9, 2014 and Japanese Patent Application No. 2015-077344 filed on Apr. 6, 2015. The entire disclosures of Japanese Patent Application Nos. 2014-080469 and 2015-077344 are hereby incorporated herein by reference.

BACKGROUND

Technical Field

The present invention relates to a light-emitting element, a light emission apparatus, an authentication apparatus, and an electronic machine.

Related Art

An organic electroluminescent element (a so-called organic EL element) is a light-emitting element having a structure where at least one light-emitting organic layer is interposed between an anode and a cathode. With such a light-emitting element, applying an electric field between the cathode and the anode causes electrons to be injected to the light emission layer from the cathode side and causes positive holes to be injected from the anode side; recoupling of the electrons and positive holes in the light emission layer generates excitons, and when the excitons return to the ground state, the energy content thereof is released as light.

One known form of such a light-emitting element emits light at a long wavelength region exceeding 700 nm (for example, see Japanese laid-open patent publication No. 2000-091073 and Japanese laid-open patent publication No. 2001-110570).

For example, in the light-emitting elements disclosed in Japanese laid-open patent publication No. 2000-091073 and Japanese laid-open patent publication No. 2001-110570, the light emission wavelength is lengthened by using, as a dopant of the light emission layer, a material in which the molecule has an amine that is an electron donor and nitrile group that is an electron acceptor as coexistent functional groups.

The use of a benzo-bis-thiadiazole-based compound as a light emission material of a light emission layer not containing a host material has also been reported (for example, see Chem. Asian J. 2010, 5, 1006-1029).

However, it has conventionally been impossible to achieve a high-efficiency and long-lasting element that emits light in the near-infrared region.

A high-efficiency and long-lasting light-emitting element that emits light perpendicular to the surface plane in the near-infrared region has also been desired as a biometric authentication light source for using biometric information such as, for example, the veins, fingerprints, or the like to authentic an individual.

SUMMARY

An objective of the present invention is to provide a high-efficiency and long-lasting light-emitting element that emits light in the near-infrared region, as well as a light emission apparatus, authentication apparatus, and electronic machine that are provided with this light-emitting element.

Such objectives are achieved by the invention described below.

A light-emitting element of one aspect of the invention includes an anode, a cathode, and a light emission layer. The light emission layer is arranged between the anode and the cathode and configured to emit light by energization between the anode and the cathode. The light emission layer includes a compound represented by a general formula (NIR-D) as a light emission material and a compound represented by a formula IRH-1 as a host material for holding the light emission material. The general formula (NIR-D) is

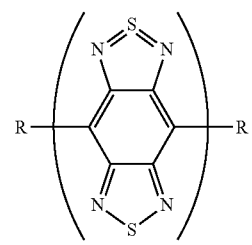

wherein each R independently indicates group comprising a phenyl group, a thiophenyl group, a furyl group, or at least one species of derivatives thereof. The formula IRH-1 is

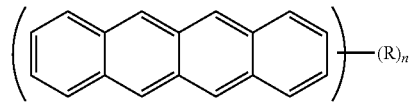

wherein n indicates a natural number 1 to 12, and each R independently indicates a hydrogen atom, an alkyl group, an optionally substituted aryl group, or an arylamino group.

In the light-emitting element of one aspect of the invention, preferably, the host material is a compound represented by a formula IRH-2, which is

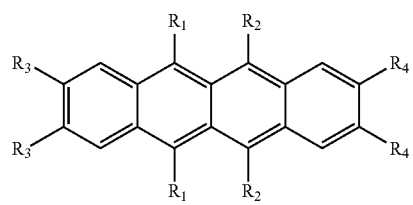

wherein $R_1$ to $R_4$ each independently indicate a hydrogen atom, an alkyl group, an optionally substituted aryl group, or an arylamino group, and $R_1$ to $R_4$ are the same as one another or different from one another.

In the light-emitting element of one aspect of the invention, preferably, the host material is a compound represented by a formula IRH-3, which is

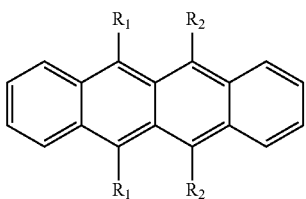

wherein $R_1$ and $R_2$ each independently indicate a hydrogen atom, an alkyl group, an optionally substituted aryl group, or an arylamino group, and $R_1$ and $R_2$ are the same as one another or different from one another.

In the light-emitting element of one aspect of the invention, preferably, the host material is constituted of carbon atoms and hydrogen atoms.

In the light-emitting element of one aspect of the invention, preferably, a content of the light emission material in the light emission layer is 0.5 wt % to 5.0 wt %.

In the light-emitting element of one aspect of the invention, preferably, the light-emitting element further includes an electron transport layer that is arranged between the light emission layer and the cathode and includes a compound that has an anthracene skeleton.

In light-emitting element of one aspect of the invention, preferably, the electron transport layer has a first electron transport layer including an azaindolizine-based compound that has an azaindolizine skeleton and the anthracene skeleton in a molecule, and a second electron transport layer arranged between the first electron transport layer and the light emission layer and including an anthracene-based compound that has an anthracene skeleton in a molecule and is constituted of carbon atoms and hydrogen atoms.

In the light-emitting element of one aspect of the invention, preferably, a thickness of the second electron transport layer is greater than a thickness of the first electron transport layer.

In the light-emitting element of one aspect of the invention, preferably, a thickness of the second electron transport layer is 30 nm to 150 nm.

In the light-emitting element of one aspect of the invention, preferably, a thickness of the electron transport layer is 55 nm to 200 nm.

In the light-emitting element of one aspect of the invention, preferably, a thickness of the light emission layer is 10 nm to 50 nm.

In the light-emitting element of one aspect of the invention, the light emission material is a compound represented by formula IRD-4, which is

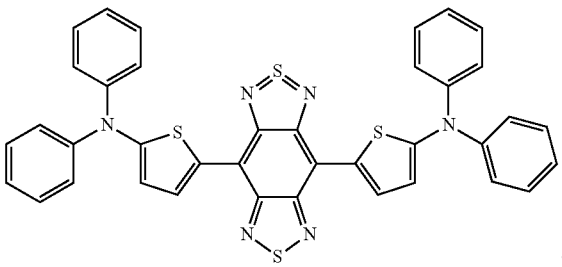

IRD-4

Also, in the light-emitting element of one aspect of the invention, the light emission material may be a compound represented by formula IRD-5, which is

IRD-5

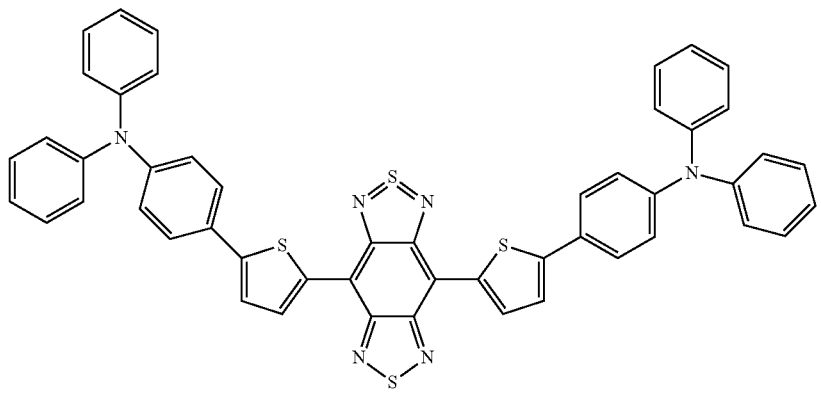

A light emission apparatus of one aspect of the invention is characterized by including the light-emitting element of the one aspect of the invention.

An authentication apparatus of one aspect of the invention is characterized by including with the light-emitting element of the one aspect of the invention.

An electronic machine of one aspect of the invention is characterized by including with the light-emitting element of the one aspect of the invention.

BRIEF DESCRIPTION OF THE DRAWINGS

Referring now to the attached drawings which form a part of this original disclosure.

DETAILED DESCRIPTION OF EXEMPLARY EMBODIMENTS

Preferred embodiments of a light-emitting element, light emission apparatus, authentication apparatus, and electronic machine of the embodiment, as illustrated in the accompanying drawings, shall be described below.

Figure 1:
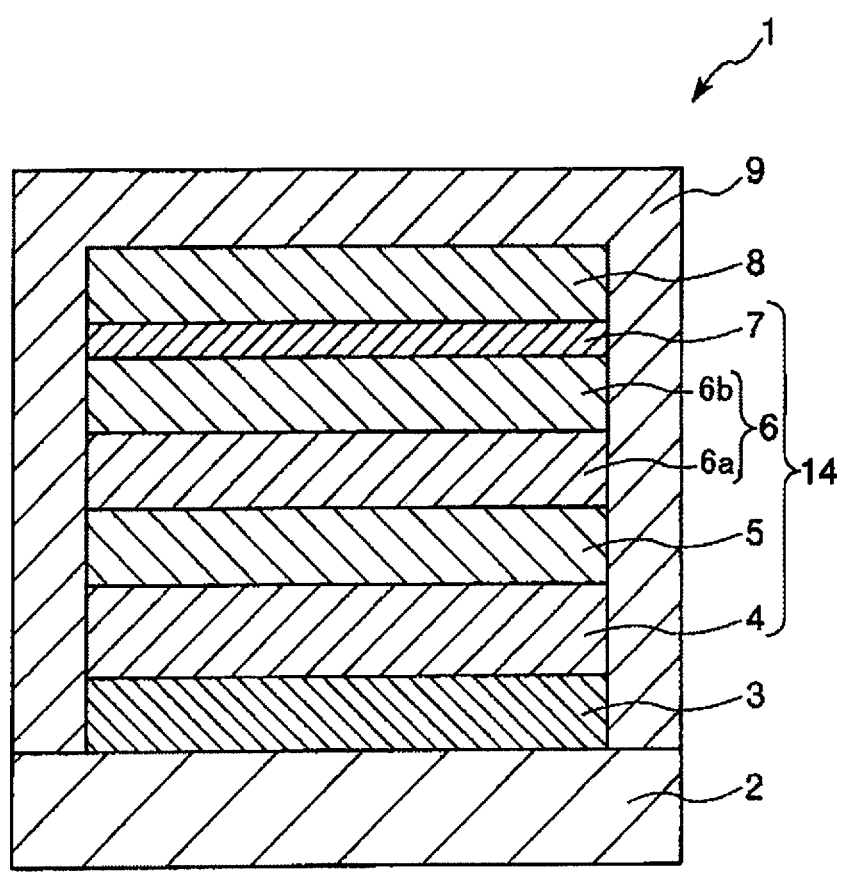
FIG. 1 is a cross-sectional view schematically illustrating a light-emitting element as in an embodiment.

FIG. 1 is a cross-sectional view schematically illustrating a light-emitting element as in an embodiment of the present invention. For convenience of description, the following description shall have the upper side in FIG. 1 as "up", "above", or "upper", and shall have the lower side as "down", "below", or "lower".

A light-emitting element (electroluminescent element) 1 illustrated in FIG. 1 is obtained by layering an anode 3, a hole injection layer 4, a light emission layer 5, an electron transport layer 6, an electron injection layer 7, and a cathode 8, in the stated order. That is to say, in the light-emitting element 1, interposed between the anode 3 and the cathode 8 is a laminate 14 obtained when the hole injection layer 4, the light emission layer 5, the electron transport layer 6, and the electron injection layer 7 are layered in the stated order from the anode 3 side to the cathode 8 side.

The entirety of the light-emitting element 1 is provided on a substrate 2 and sealed with a sealing member 9.

In this light-emitting element 1, applying a drive voltage to the anode 3 and the cathode 8 causes the light emission layer 5 to receive the supply (injection) of electrons from the cathode 8 side and the supply (injection) of positive holes from the anode 3 side. In the light emission layer 5, the positive holes and electrons are recombined, and the energy released during this recombination generates excitons; when the excitons return to the ground state, energy (fluorescence or phosphorescence) is released (emitted). The light-emitting element 1 thereby emits light.

In particular, the use of a benzo-bis-thiadiazole-based compound represented by the general formula (NIR-D) described below as a light emission material of the light emission layer 5, as shall be described below, causes the light-emitting element 1 to emit light at 850 nm to 500 nm, which can be said to be a longer wavelength region than the near-infrared region. In the present specification, the "near-infrared region" refers to the wavelength range of 700 nm to 1,500 nm.

The substrate 2 is intended to support the anode 3. The light-emitting element 1 of the present embodiment is a configuration with which light is extracted from the substrate 2 side (a bottom emission configuration), and therefore the substrate 2 and the anode 3 are each understood to be substantially transparent (colorless and transparent, colored and transparent, or semi-transparent).

Examples of the constituent material of the substrate 2 include: a resin material such as polyethylene terephthalate, polyethylene naphthalate, polypropylene, cycloolefin polymer, polyamide, polyether sulfone, polymethyl methacrylate, polycarbonate, or polyarylate; or a glass material such as quartz glass or soda glass; it would be possible to use one of these species or a combination of two or more of these species.

Though not particularly limited, the mean thickness of the substrate 2 is preferably about 0.1 nm to 30 mm, more preferably about 0.1 nm to 10 mm.

In the case where the light-emitting element 1 is of a configuration where light is extracted from the opposite side to the substrate 2 (a top emission type), then either or a transparent substrate or a non-transparent substrate could be used for the substrate 2.

Examples of a non-transparent substrate include a substrate constituted of a ceramic material such as alumina, one where an oxide film (insulating film) has been formed on the surface of a metal substrate such as stainless steel, or a substrate constituted of a resin material.

In the light-emitting element 1, the distance between the anode 3 and the cathode 8 (i.e., the mean thickness of the laminate 14) is preferably 100 nm to 500 nm, more preferably 100 nm to 300 nm, even more preferably 100 nm to 250 nm. This makes it possible to easily and reliably have the drive voltage of the light-emitting element 1 be within a practical range.

Each of the parts constituting the light-emitting element 1 shall be sequentially described below.

Anode

The anode 3 is an electrode for injecting holes into the hole injection layer 4. As the constituent material of this anode 3, it is preferable to use a material that has a high work function and excellent electroconductivity.

Examples of the constituent material of the anode 3 include oxides such as indium tin oxide (ITO), indium zinc oxide (IZO), $In_2O_3$, $SnO_2$, Sb-containing $SnO_2$, and Al-containing ZnO, or Au, Pt, Ag, Cu, or an alloy comprising same; it would be possible to use one of these species or a combination of two or more of these species.

The anode 3 is particularly preferably constituted of ITO. ITO is a material that is transparent, has a high work function, and has excellent electroconductivity. This makes it possible to efficiently inject holes from the anode 3 to the hole injection layer 4.

Preferable, the surface of the anode 3 on the hole injection layer 4 side (the upper surface in FIG. 1) has undergone a plasma treatment. This makes it possible to raise the chemical and mechanical stability of the interface between the anode 3 and the hole injection layer 4. As a result, the hole injection performance from the anode 3 to the hole injection layer 4 can be enhanced. This plasma treatment shall be described in greater detail in a subsequent description of a method of manufacturing the light-emitting element 1.

Though not particularly limited, the mean thickness of the anode 3 is preferably about 10 nm to 200 nm, more preferably about 50 nm to 150 nm.

Negative Electrode

In turn, the negative electrode 8 is an electrode for injecting electrons to the electron transport layer 6 via the electron injection layer 7 (described below). As the constituent material of the negative electrode 8, it is preferable to use a material having a low work function.

Examples of the constituent material of the negative electrode 8 include Li, Mg, Ca, Sr, La, Ce, Er, Eu, Sc, Y, Yb, Ag, Cu, Al, Cs, Rb, or an alloy comprising same; it would be possible to use one of these species or a combination of two or more of these species (for example, as a laminate of a plurality of layers, a mixed layer of a plurality of species, or the like).

In particular, in a case where an alloy is used as the constituent material of the negative electrode 8, it would be preferable to use an alloy comprising a stable metal element such as Ag, Al, or Cu (more specifically, an alloy such as MgAg, AlLi, or CuLi). Using such an alloy as the constituent material of the negative electrode 8 makes it possible to enhance the electron injection efficiency and stability of the negative electrode 8.

Though not particularly limited, the mean thickness of the negative electrode 8 is preferably about 100 nm to 10,000 nm, more preferably about 100 nm to 500 nm.

Because the light-emitting element 1 of the present embodiment is of the bottom emission type, optical transparency is not especially required for the negative electrode 8. In the case of the top emission type, it would be necessary for light to be transmitted through from the negative electrode 8 side, and therefore the mean thickness of the negative electrode 8 would preferably be about 1 nm to 50 nm.

Hole Injection Layer

The hole injection layer 4 is one that has the function of enhancing the efficiency of hole injection from the anode 3 (i.e. is one that has a hole injecting property). This makes it possible to raise the light emission efficiency of the light-emitting element 1. Herein, the hole injection layer 4 is one that also has a function whereby holes that have been injected from the anode 3 are transported to the light emission layer 5 (i.e., has a hole transporting property). As such, the hole injection layer 4 could also be said to be a hole transport layer, on account of having the hole transporting property as stated earlier. Between the hole injection layer 4 and the light emission layer 5, there may be separately provided a hole transport layer constituted of a different material (for example, an amine-based compound such as a benzidine derivative) than the hole injection layer 4.

This hole injection layer 4 comprises a material having a hole injection property (a hole-injecting material).

Though not particularly limited, examples of the hole-injecting material included in the hole injection layer 4 include copper phthalocyanine or an amine-based material such as 4,4',4"-tris(N,N-phenyl-3-methylphenylamino)triphenylamine (m-MTDATA) or N,N'-bis-(4-diphenylaminophenyl)-N,N'-diphenyl-biphenyl-4-4'-diamine.

Of these, in terms of having an excellent hole injection property and hole transport property, it would be preferable to use an amine-based material as the hole-injecting material included in the hole injection layer 4; it would be even more preferable to use a diaminobenzene derivative, a benzidine derivative (material having a benzidine skeleton), or a triamine-based compound or tetraamine-based compound that has both a "diaminobenzene" unit and a "benzidine" unit in the molecule (a specific example being a compound such as is represented by the following formulas HIL1 to HIL27).

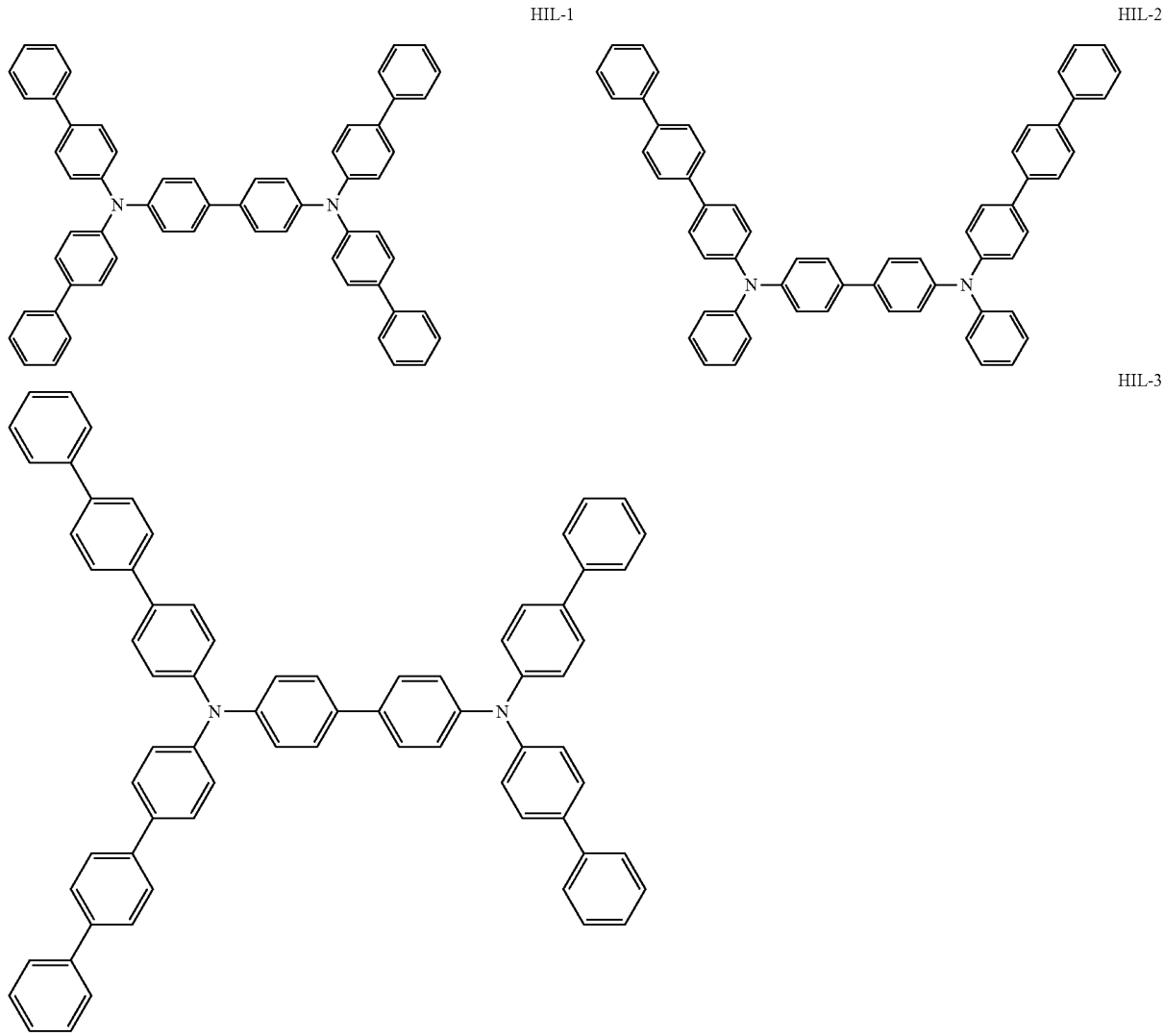

-continued
HIL-4
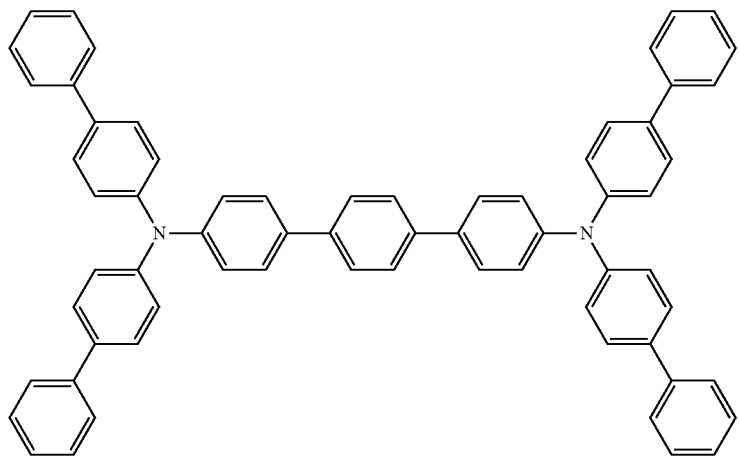
HIL-5
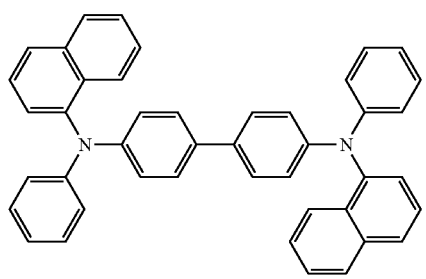
HIL-6
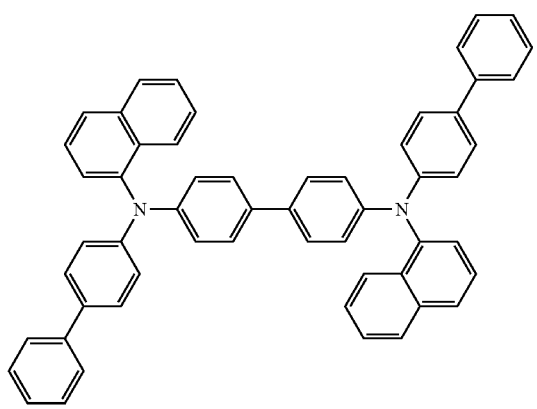
HIL-7
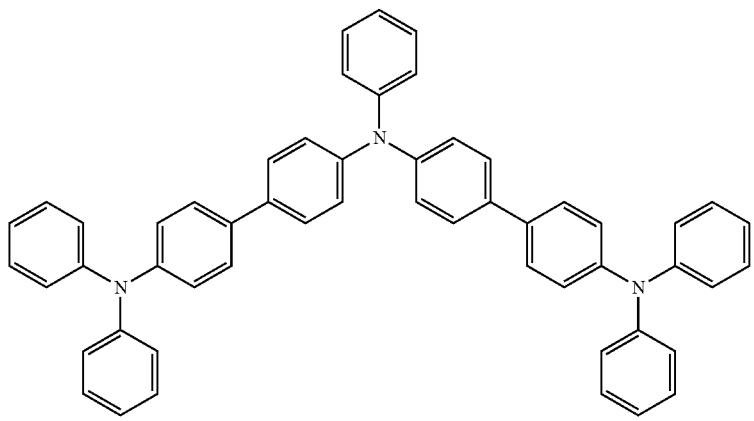

-continued
HIL-8
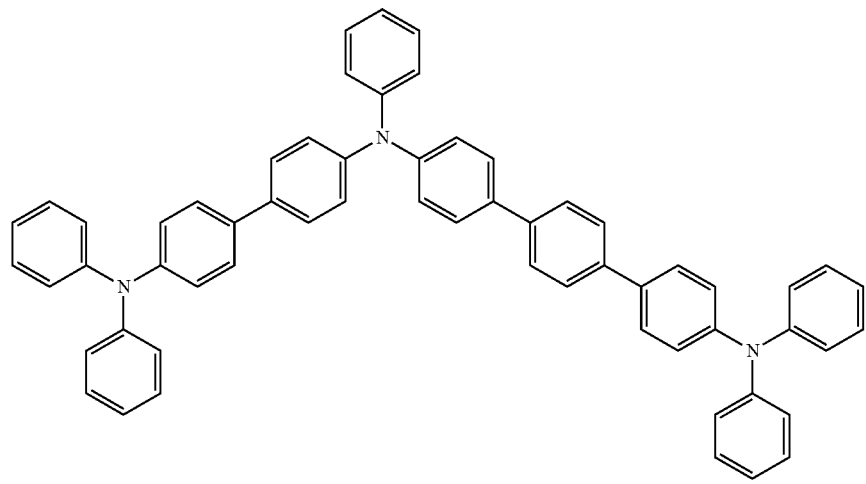
HIL-9
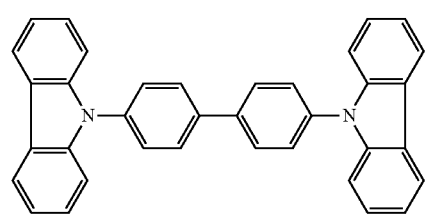
HIL-10
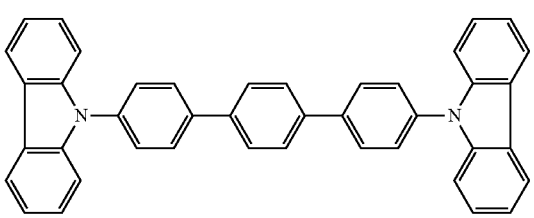
HIL-11
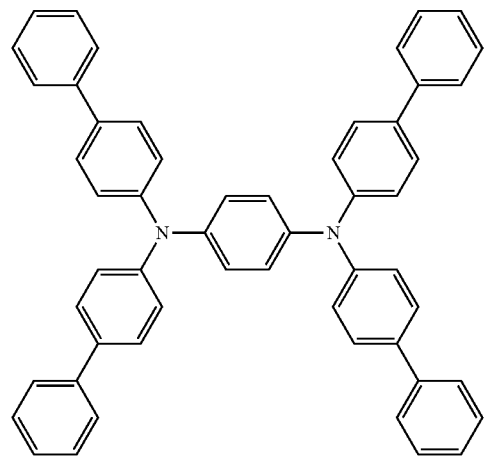
HIL-12
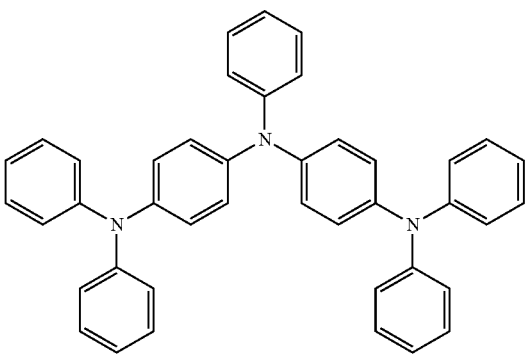
HIL-13
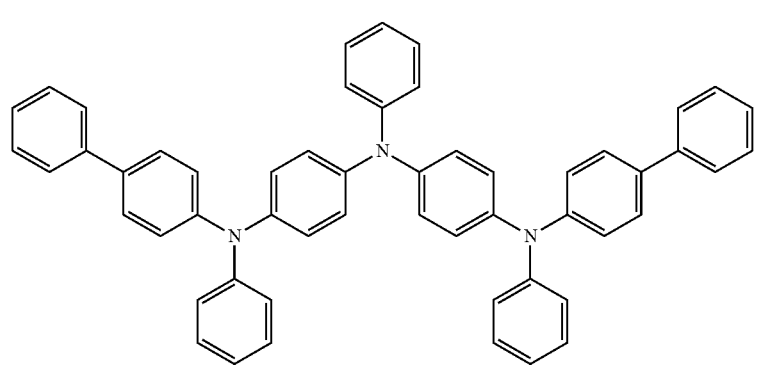

HIL-14
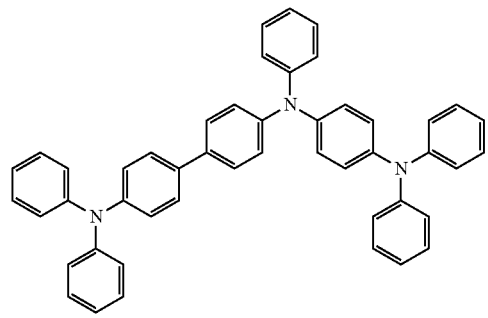
HIL-15
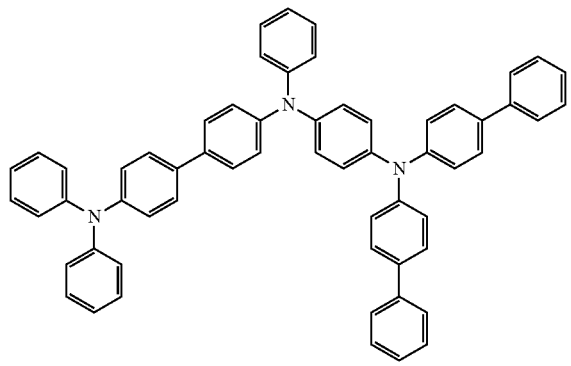
HIL-16
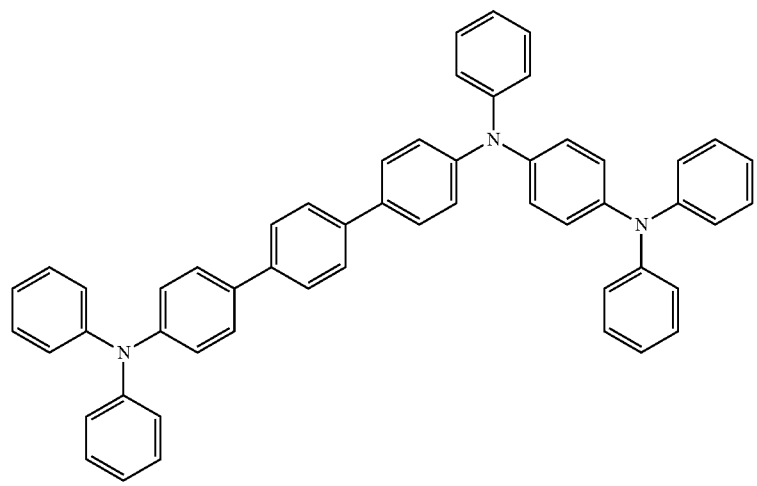
HIL-17
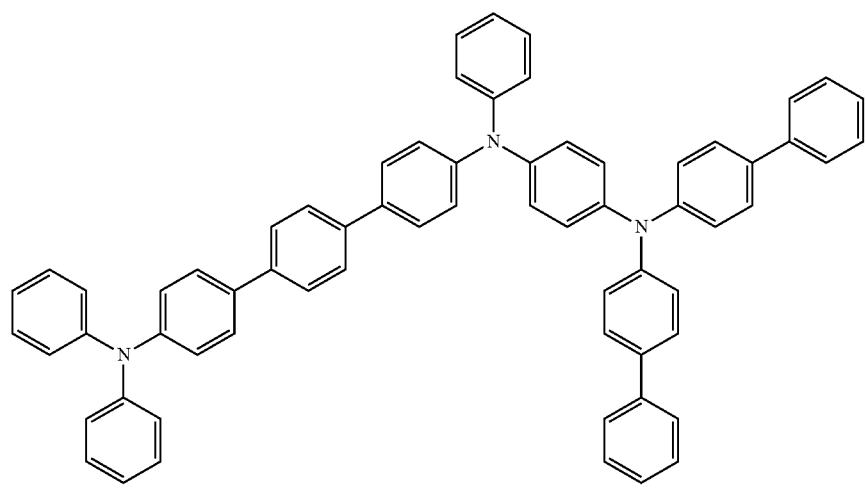

-continued
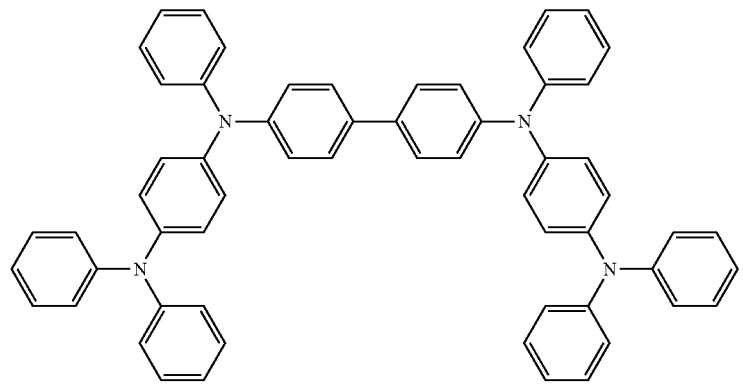
HIL-18
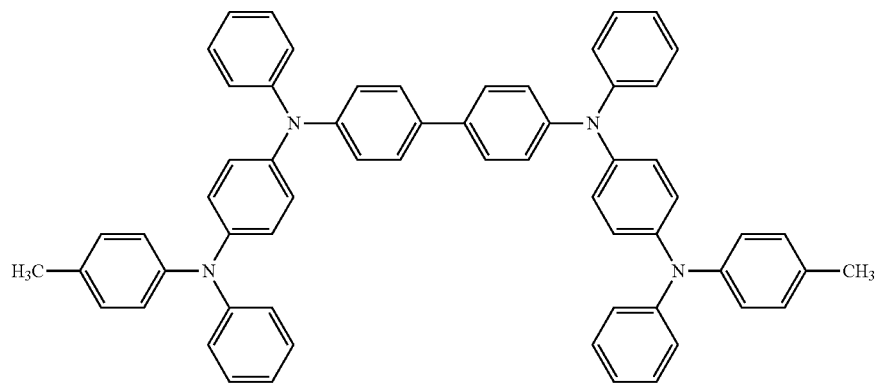
HIL-19
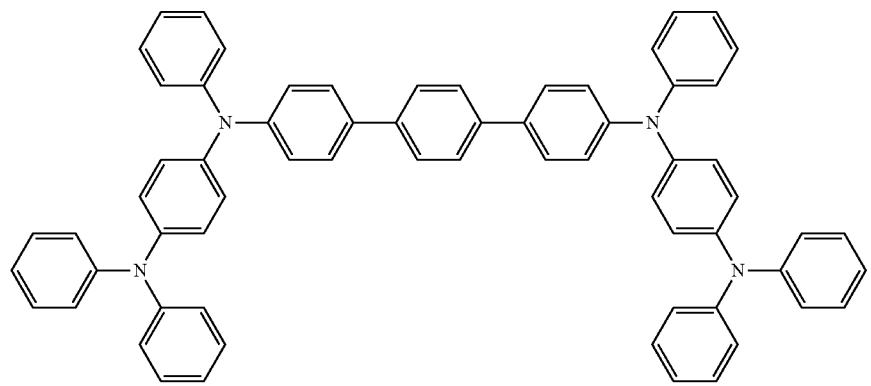
HIL-20
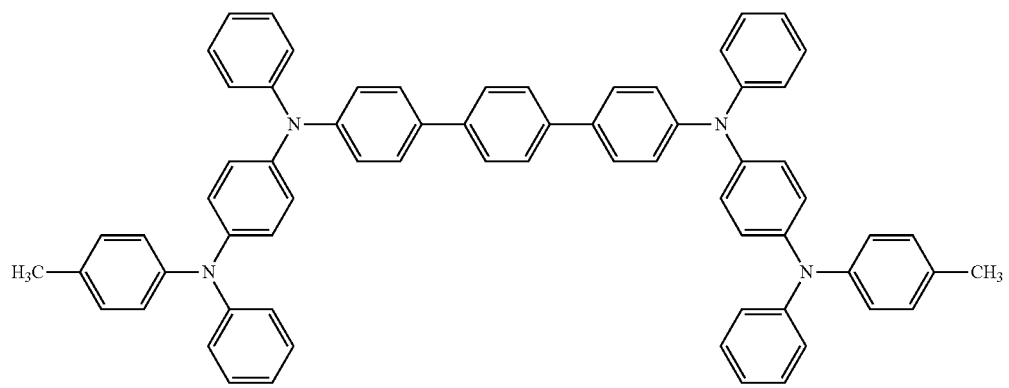
HIL-21

-continued
HIL-22
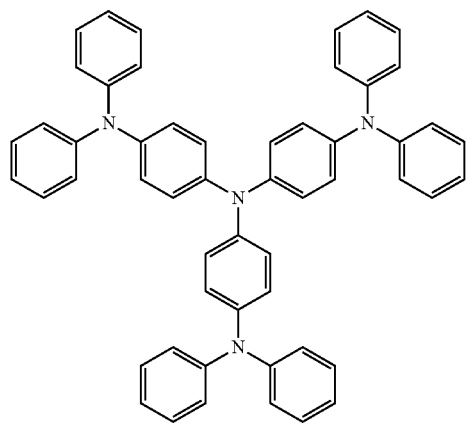
HIL-23
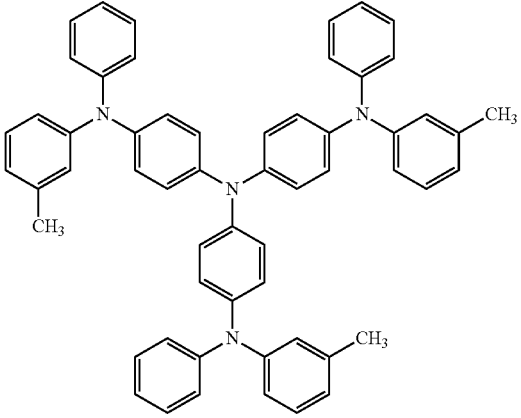
HIL-24
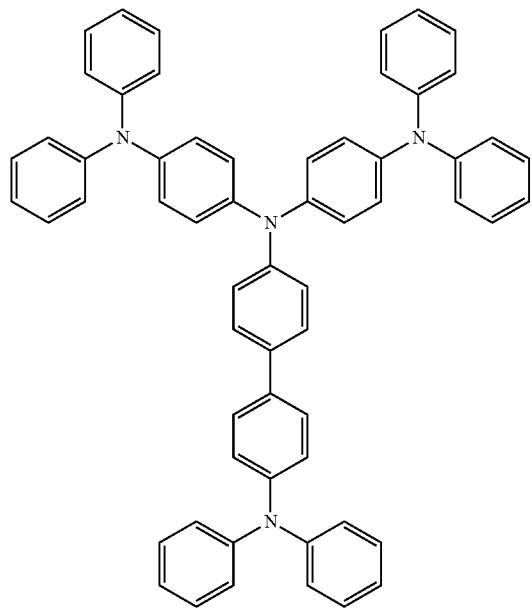
HIL-25
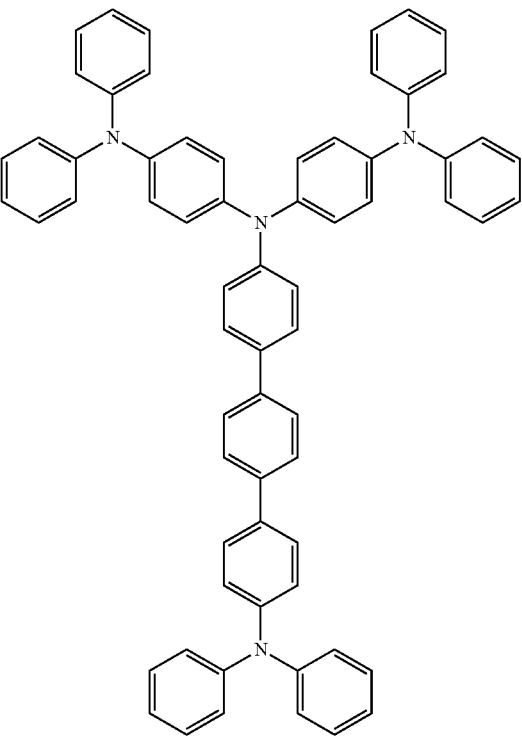

HIL-26

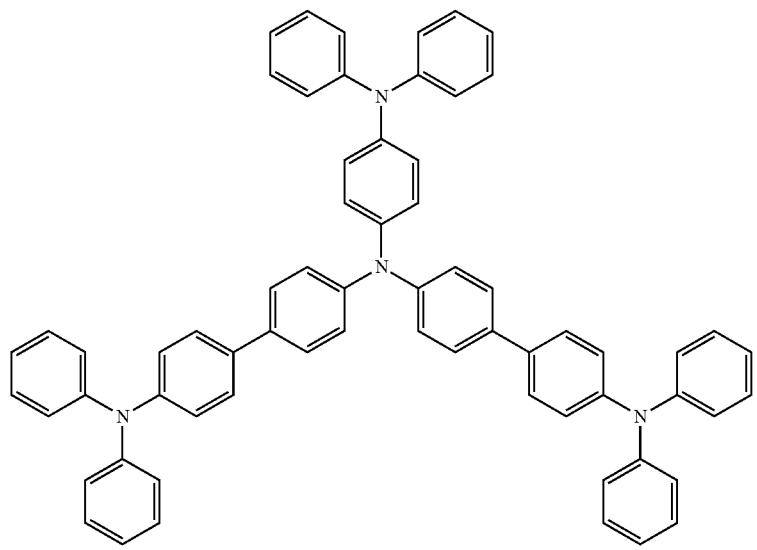

HIL-27

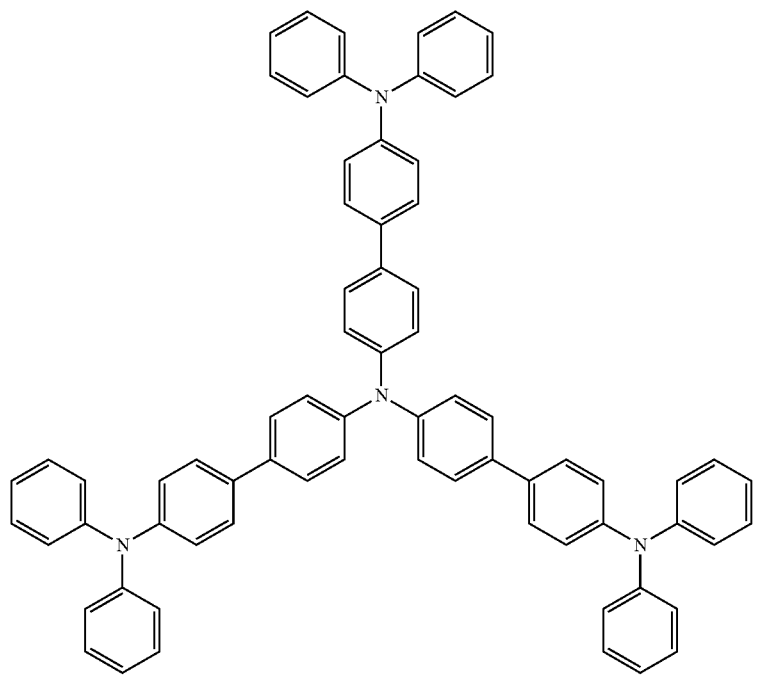

Preferably, the LUMO of the constituent material of the hole injection layer 4 has a difference of at least 0.5 eV from the LUMO of the host material used for the light emission layer 5. This makes it possible to reduce loss of electrons from the light emission layer 5 to the hole injection layer 4 and to raise the light emission efficiency.

The HOMO of the constituent material of the hole injection layer 4 is preferably 4.7 eV to 5.6 eV, and the LUMO of the constituent material of the hole injection layer 4 is preferably 2.2 eV to 3.0 eV.

Though not particularly limited, the mean thickness of this hole injection layer 4 is preferably about 5 nm to 90 nm, more preferably about 10 nm to 70 nm.

Light Emission Layer

The light emission layer 5 is for emitting light by energizing between the aforementioned anode 3 and negative electrode 8.

The light emission layer 5 is configured to include a light emission material. In the embodiment, the light emission layer 5 is configured to comprise a benzo-bis-thiadiazole-based compound that is a compound represented by the following general formula (NIR-D) (hereinafter also simply called a "benzo-bis-thiadiazole-based compound") as the light emission material.

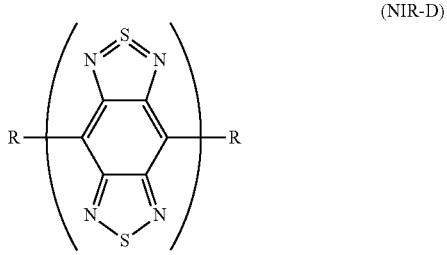

(NIR-D)

[In the general formula (NIR-D), each group R independently indicates group comprising a phenyl group, a thiophenyl group, a furyl group, or at least one species of the derivatives thereof.]

Though not particularly limited, provided that a phenyl group, a thiophenyl group, a furyl group, or at least one species of the derivatives thereof is included, examples of the groups R in the general formula (NIR-D) include ones that include a phenyl group, a thiophenyl group (thiophene group), a furyl group (furan group), an oxazole group, an oxadiazole group, or the like; preferably, two or more species thereof are combined. This causes the light emission layer 5, which includes the benzo-bis-thiadiazole-based compound provided with such groups R as a light-emitting dopant, to produce light emission in a wavelength range of 700 nm and higher (the near-infrared region), and in particular to produce light emission in a wavelength range of 850 nm to 1500 nm, which can be said to be a longer wavelength region.

Specific examples of the benzo-bis-thiadiazole-based compound provided with such groups R as described above include compounds represented by the following formulae IRD-1 to IRD-13 or derivatives thereof.

IRD-1

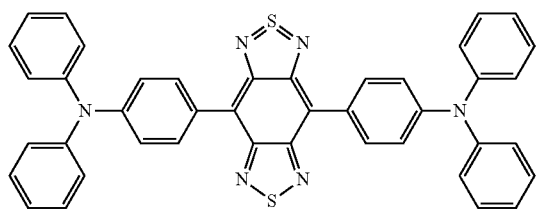

IRD-2

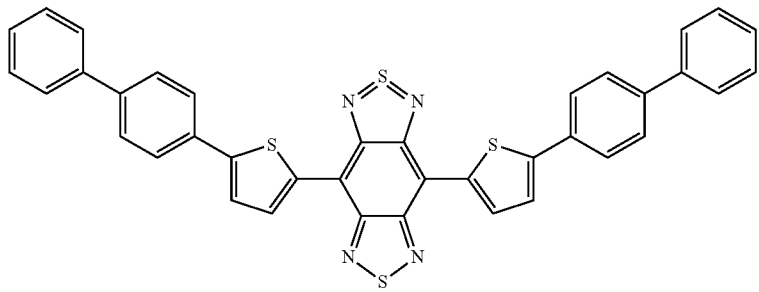

IRD-3

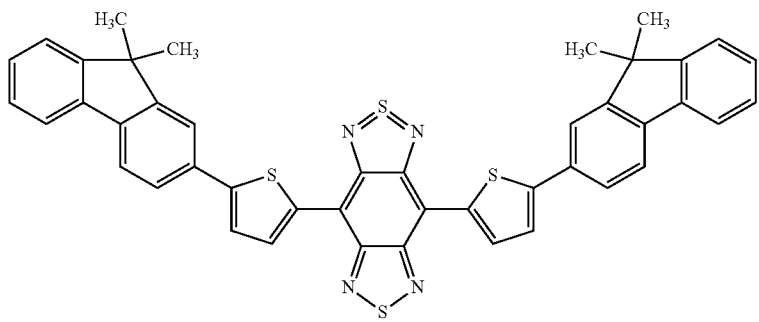

IRD-4

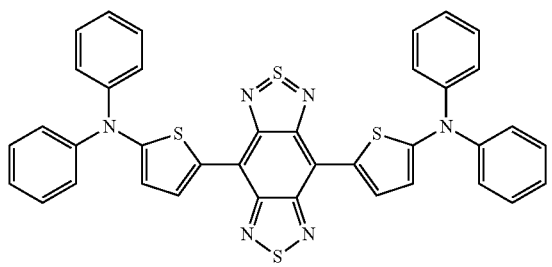

-continued
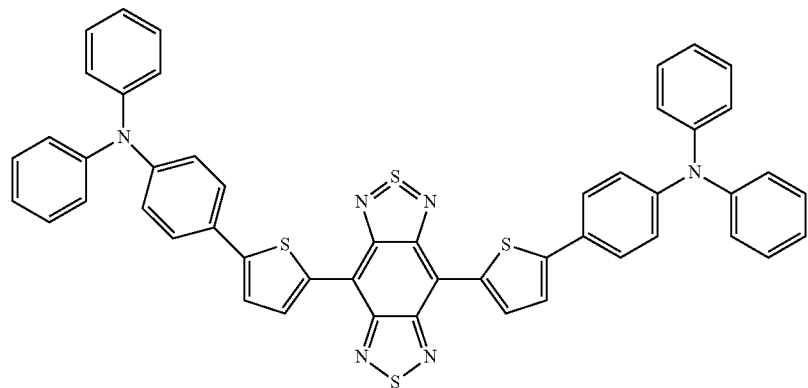
IRD-5
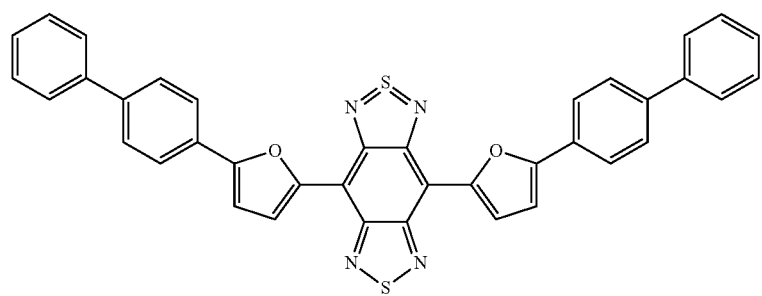
IRD-6
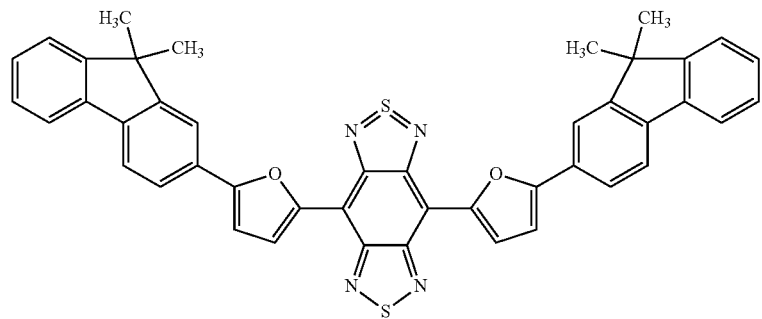
IRD-7
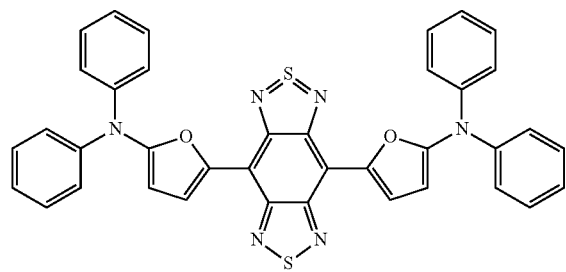
IRD-8

-continued
IRD-9
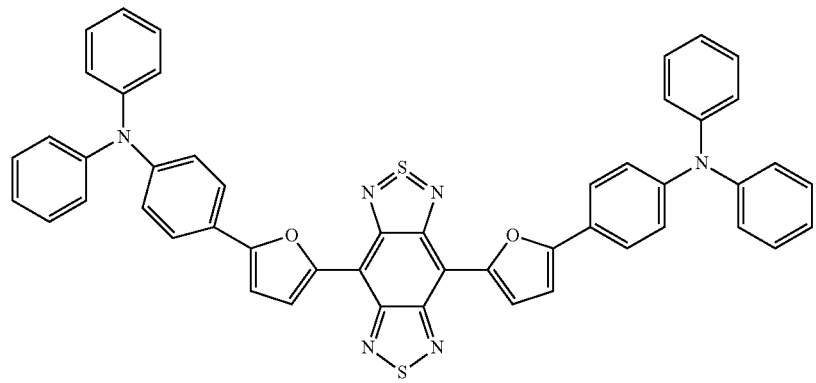
IRD-10
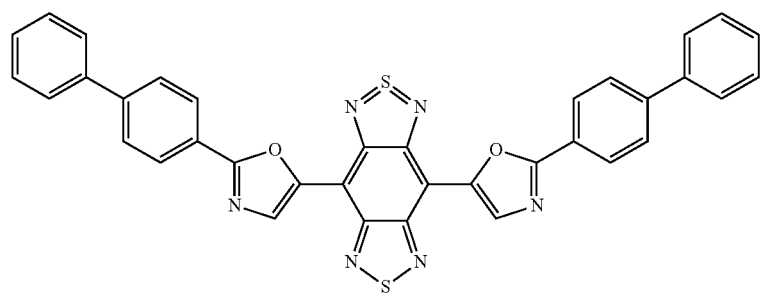
IRD-11
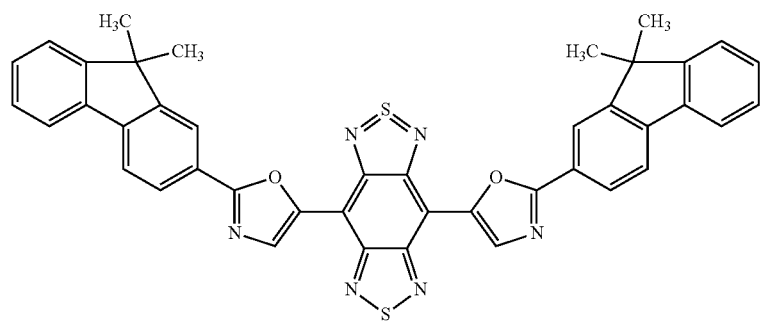
IRD-12
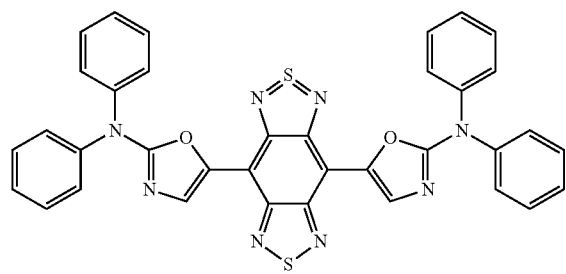

IRD-13

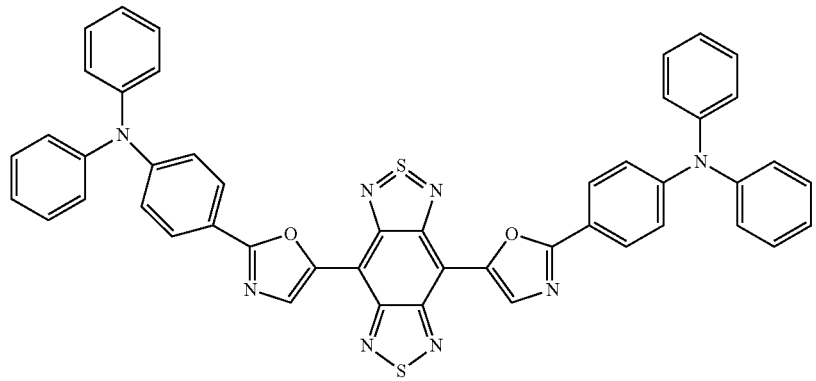

The light emission layer 5 may also include a light emission material (a variety of fluorescent materials or a variety of phosphorescent materials) other than the aforementioned light emission material.

In addition to the light emission material such as is described above, the light emission layer 5 is also configured to include a host material in which the light emission material is added (carried) as a guest material (dopant). This host material has the function of recombining the positive holes and electrons to generate the excitons, and of causing the energy of the excitons to transfer (Förster resonance energy transfer or Dexter electron transfer) to the light emission material, thus exciting the light emission material. Therefore, the light emission efficiency of the light-emitting element 1 can be increased. Such a host material can be used, for example, by doping the host material with the light emission material, which is the guest material, as a dopant.

In particular, the host material used in the light emission layer 5 is, in the embodiment, an anthracene-based material that is a compound represented by the following formula IRH-1.

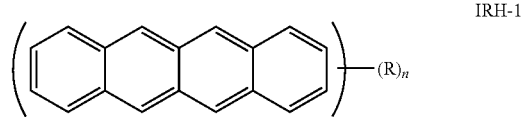

IRH-1

[In the formula IRH-1, n indicates a natural number 1 to 12, and each R independently indicates a hydrogen atom, an alkyl group, an optionally substituted aryl group, or an arylamino group.]

The benzo-bis-thiadiazole-based compound as described above has a high polarity (has considerable polarization), and therefore readily produces concentration quenching, which is a phenomenon where interactions between the molecules of a light emission material lower the light emission efficiency, when there is a high concentration in the light emission layer in the case of use as the light emission material.

The aforementioned tetracene-based material, however, has low polarity (little polarization). Therefore, using the tetracene-based material as the host material makes it possible to reduce the interactions between the molecules of the light emission material as described above, and to reduce the concentration quenching property.

By contrast, in a case where, for example, Alq$_3$, which has a high polarity (considerable polarization) is used as the host material, there will be high polarity (considerable polarization) in both the host material and the light emission material and therefore interactions between the molecules of the light emission material end up occurring more readily, and the concentration quenching property ends up becoming higher.

An anthracene-based material, which is an acene-based material the same as tetracene-based material, does have the effect of reducing the concentration quenching when used as the host material, but has a lower light emission efficiency as compared to when a tetracene-based material is used as the host material. This is presumably because when an anthracene-based material is used as the host material, there is not ample energy transfer from the host material to the light emission material, and there is a high probability that electrons that have been injected to the LUMO of the host material will penetrate through to the anode side. For these reasons, an anthracene-based material cannot be said to be a suitable host material. Such a phenomenon does not occur only in anthracene-based materials, but likewise in pentacene-based materials, as well.

For this reason, using a tetracene-based material (acene-based material) as the host material makes it possible to increase the light emission efficiency of the light-emitting element 1.

Tetracene-based materials also excel in resistance to electrons and positive holes. Tetracene-based materials furthermore have excellent thermal stability. Therefore, the lifetime of the light-emitting element 1 can be extended. Moreover, because tetracene-based materials have excellent thermal stability, it is possible to prevent degradation of the host material by heat during film formation in a case where a vapor deposition method is used to form the light emission layer. Therefore, a light emission layer having excellent film quality can be formed; as a result, in this regard as well, the light-emitting element 1 can be given a higher light emission efficiency and an extended lifetime.

Furthermore, tetracene-based materials themselves less readily emit light, and therefore, the host material can also be prevented from adversely affecting the light emission spectrum of the light-emitting element 1.

The tetracene-based material used as the host material is not particularly limited, provided that the tetracene-based material be represented by the formula IRH-1 and be able to exhibit the function of the host material as described above, but it would be preferable to use a compound represented by the following formula IRH-2, and more preferable to use a compound represented by the following formula IRH-3.

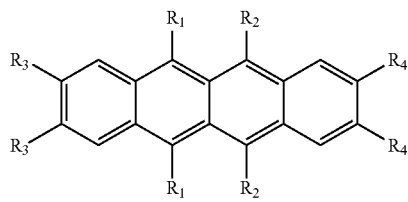

IRH-2

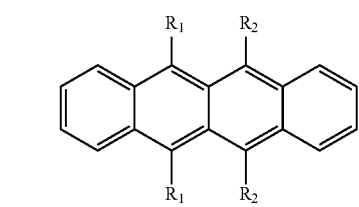

IRH-3

[In the formulae IRH-2 and IRH-3, $R_1$ to $R_4$ each independently indicate a hydrogen atom, an alkyl group, an optionally substituted aryl group, or an arylamino group. $R_1$ to $R_4$ may be the same as one another or may be different from one another.]

The tetracene-based material used as the host material is preferably constituted of carbon atoms and hydrogen atoms. This makes it possible to lower the polarity of the host material and prevent the occurrence of undesirable interactions between the host material and the light emission material. Therefore, the light emission efficiency of the light-emitting element 1 can be increased. Additionally, the resistance of the host material to electrons and positive holes can be raised. Therefore, the lifetime of the light-emitting element 1 can be extended.

As a specific example of the tetracene-based material, it would be preferable to use a compound represented by the following formulae H-1 to H-27.

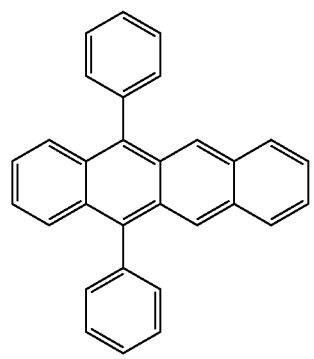

H-1

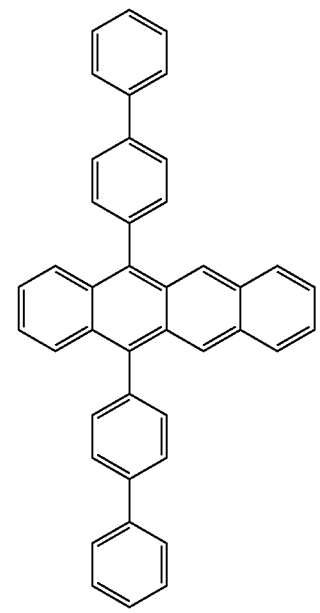

H-2

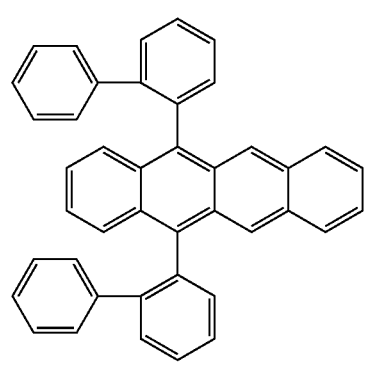

H-3

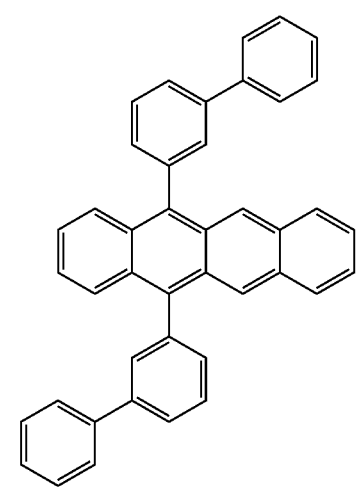

H-4

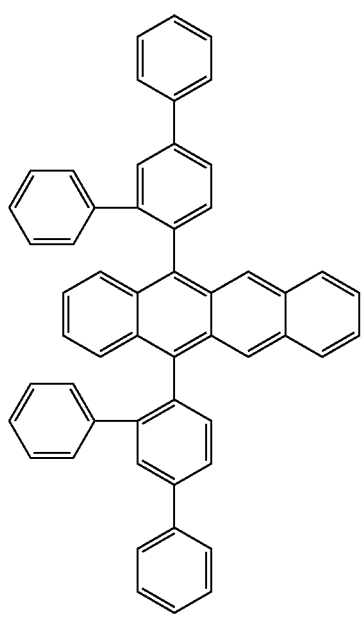
H-5
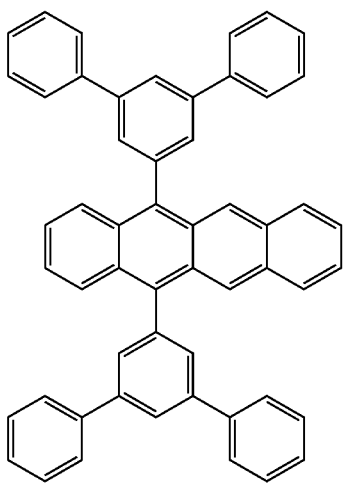
H-8
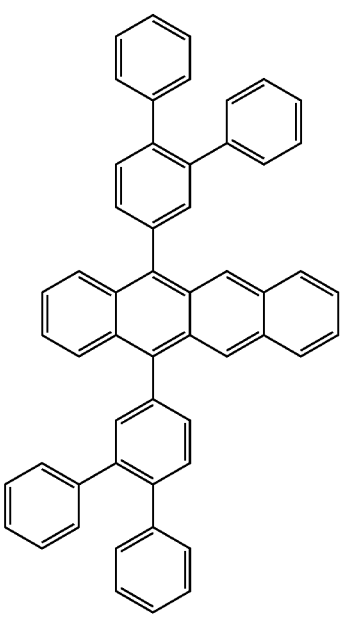
H-9
H-6
H-7

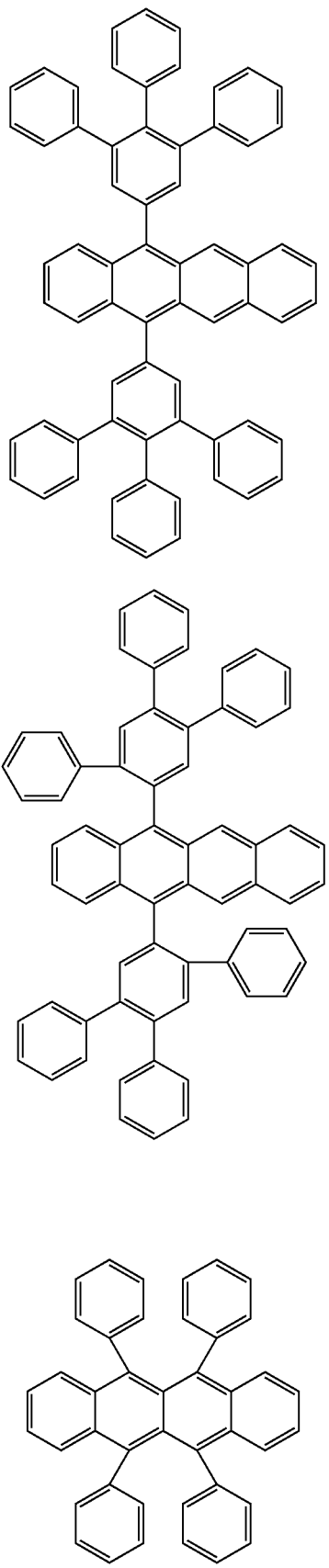
H-10
H-11
H-12
H-13
H-14
H-15

H-16
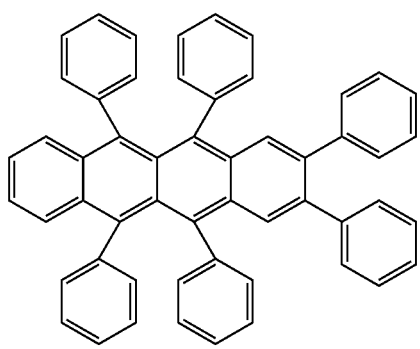
H-17
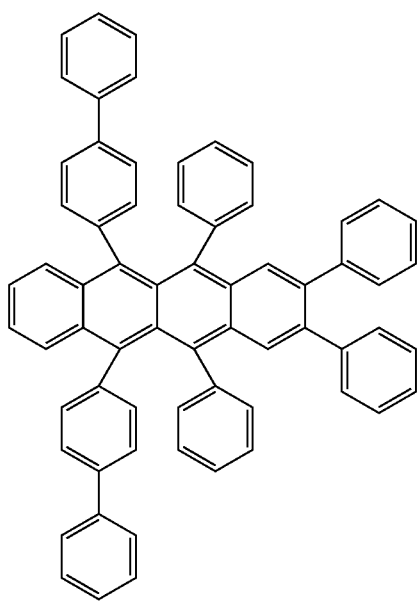
H-18
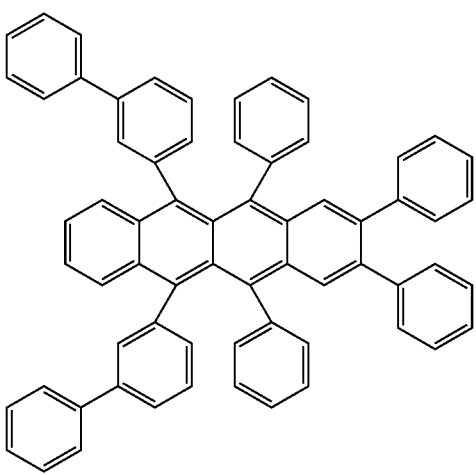
H-19
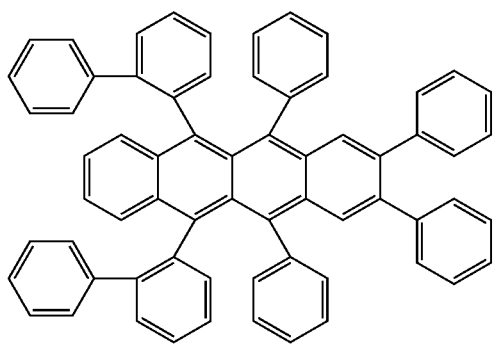
H-20
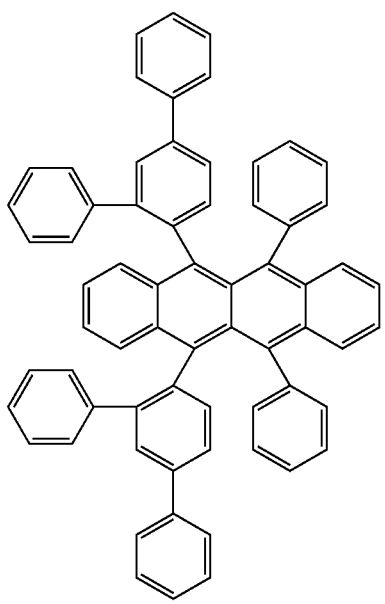
H-21
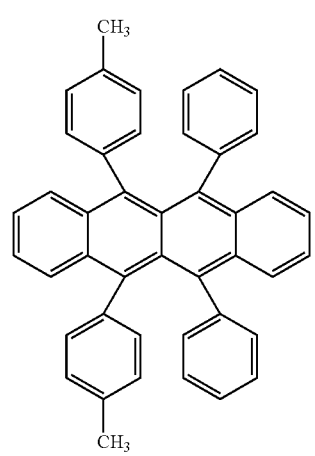

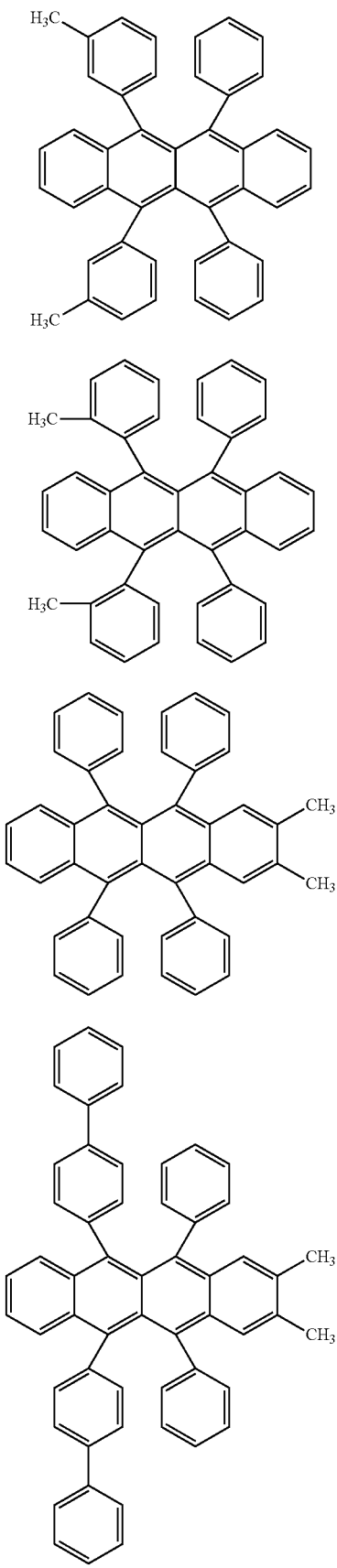

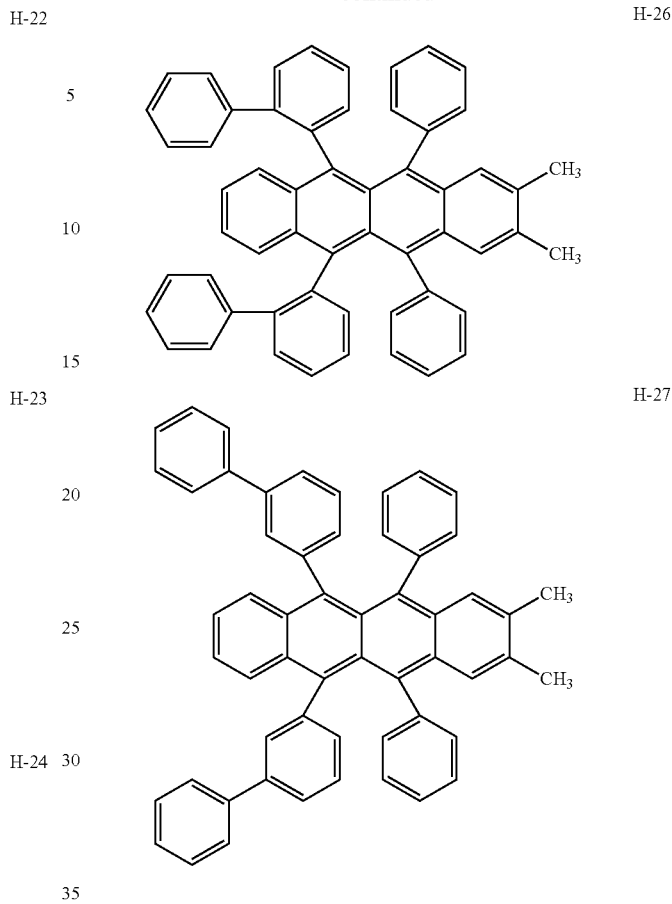

The HOMO of the host material used for the light emission layer 5 is preferably 5.0 eV to 5.8 eV, and the LUMO of host material is preferably 2.5 eV to 3.6 eV.

The content (doping amount) of the light emission material in the light emission layer 5 comprising the light emission material and the host material is preferably 0.5 wt % to 5.0 wt %, more preferably 0.75 wt % to 2.0 wt %, even more preferably 1.5 wt % to 2.0 wt %. This makes it possible to give the light-emitting element 1 an excellent balance between light emission efficiency and longevity.

The mean thickness of the light emission layer 5 is preferably 10 nm to 50 nm, more preferably 25 nm to 50 nm. This makes it possible to extend the lifetime of the light-emitting element 1, even while also keeping the drive voltage of the light-emitting element 1 low.

Electron Transport Layer

The electron transport layer 6 has is one that has a function whereby electrons that have been injected from the negative electrode 8 via the electron injection layer 7 are transported to the light emission layer 5.

Examples of the constituent material of the electron transport layer 6 (an electron-transporting material include: a phenanthroline derivative such as 2,9-dimethyl-4,7-diphenyl-1,10-phenanthroline (BCP); a quinoline derivative such as an organometallic complex in which the ligand is 8-quinolinol or a derivative thereof, such as tris(8-quinolinolato) aluminum (Alq3); an azaindolizine derivative; an oxadiazole derivative; a perylene derivative; a pyridine derivative; a pyrimidine derivative; a quinoxaline derivative; a diphenylquinone derivative; a nitro-substituted fluorene derivative; an acene-based material such as an anthracene-based material; or the like. It would be possible to use one of these species or a combination of two or more of these species.

Of these, it is particularly preferable to use a compound that has an anthracene skeleton as the electron-transporting material used in the electron transport layer 6. It is also preferable to use phenanthroline derivative or a nitrogen-containing compound provided with nitrogen atoms in the skeleton as with a phenanthroline derivative. Among these, it is in particular more preferable to use an azaindolizine-based compound that has both an azaindolizine skeleton and an anthracene skeleton in the molecule (which hereinafter is also called simply an "azaindolizine-based compound"). This makes it possible to efficiently transport and inject electrons to the light emission layer 5. As a result, the light emission efficiency of the light-emitting element 1 can be raised.

In a case where the electron transport layer 6 is used by combining two or more species of the aforementioned electron-transporting materials, then the electron transport layer 6 may be constituted of a mixed material obtained by mixing two or more types of electron-transporting material, or may be configured by layering a plurality of layers constituted of different electron-transporting materials. In the present embodiment, as illustrated in FIG. 1, the electron transport layer 6 has a first electron transport layer 6*b* and a second electron transport layer 6*a* that is provided between the first electron transport layer 6*b* and the light emission layer 5.

A compound having an anthracene skeleton that is used as the constituent material of the first electron transport layer 6*b* is preferably an azaindolizine-based compound that has both an azaindolizine skeleton and an anthracene skeleton in the molecule. A compound having an anthracene skeleton that is used as the constituent material of the second electron transport layer 6*a* is preferably an anthracene-based compound that has an anthracene skeleton in the molecule and is constituted of carbon atoms and hydrogen atoms. This makes it possible to efficiently transport and inject electrons to the light emission layer 5, as well as to reduce deterioration of the electron transport layer 6. As a result, the light-emitting element 1 can be given a higher light emission efficiency and the lifetime of the light-emitting element 1 can be extended.

Herein, the thickness of the first electron transport layer 6*b* can be reduced and the lifetime can be extended even while the thickness of the electron transport layer 6 that is necessary for optical light extraction is being ensured by the second electron transport layer 6*a*.

The azaindolizine-based compound used for the electron transport layer 6 is preferably ones where one molecule contains either one or two azaindolizine skeletons and anthracene skeletons each. This makes it possible to give the electron transport layer 6 excellent electron transport and electron injection.

As specific examples of the azaindolizine-based compound used for the electron transport layer 6, it is preferable to use a compound such as is represented by the following formulae ETL1-1 to 24, a compound such as is represented by the following formulae ETL-1-25 to 36, or a compound represented by the following formulae ETL1-37 to 56.

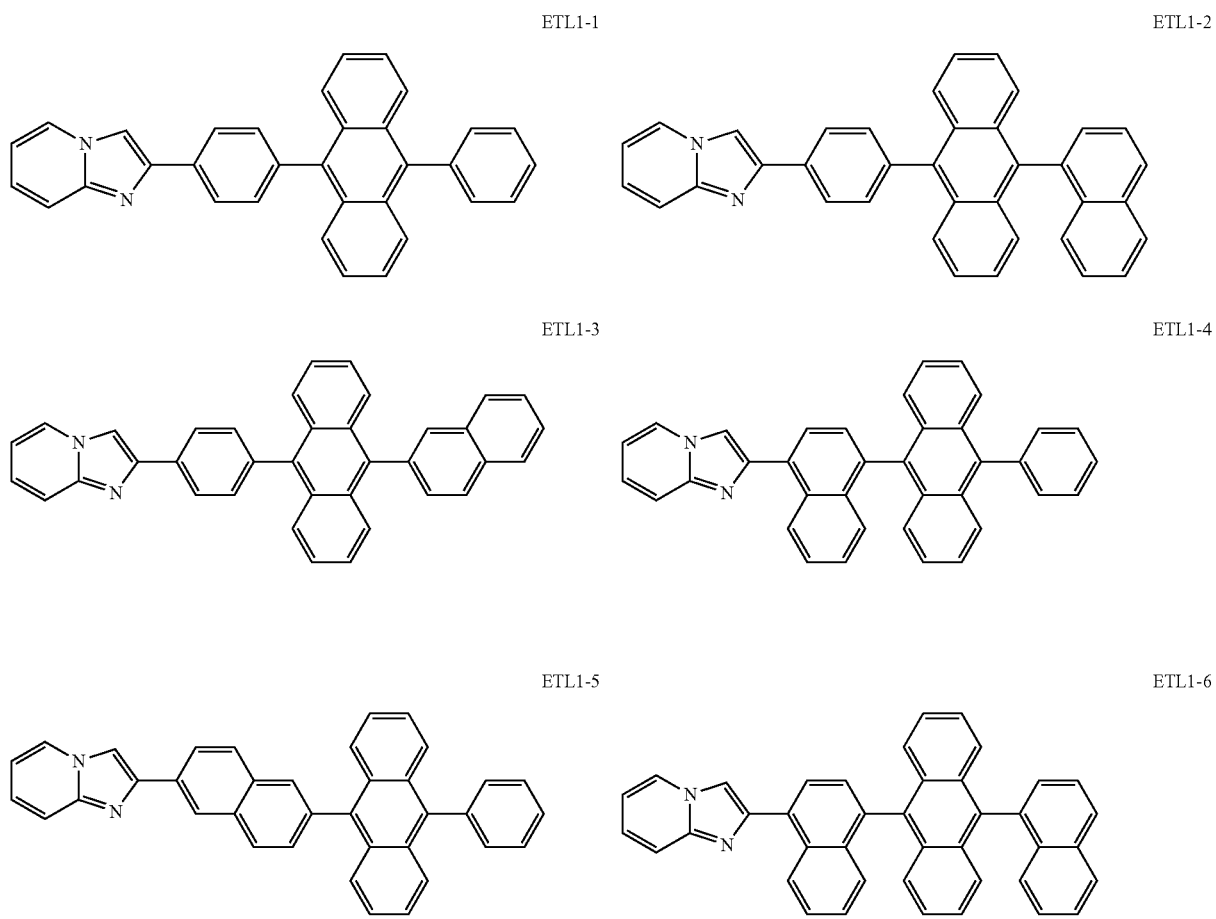

-continued
ETL1-7
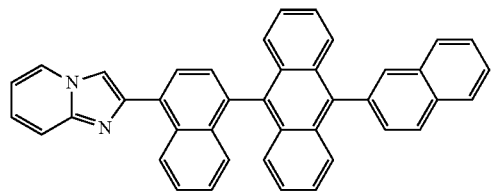
ETL1-8
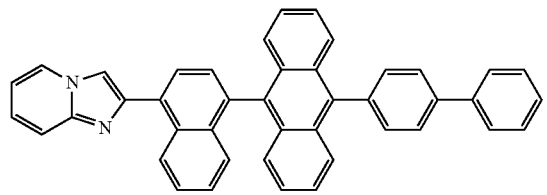
ETL1-9
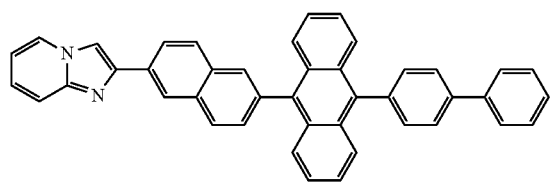
ETL1-10
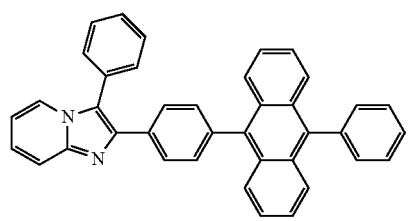
ETL1-11
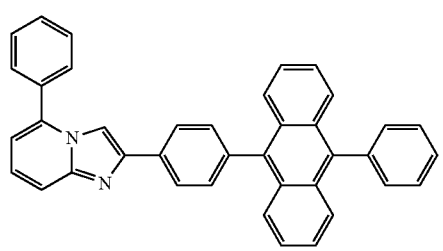
ETL1-12
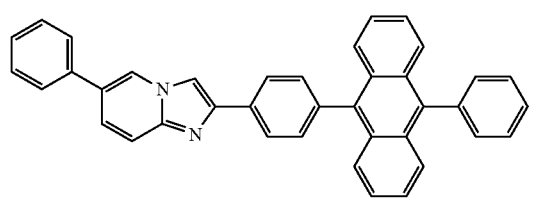
ETL1-13
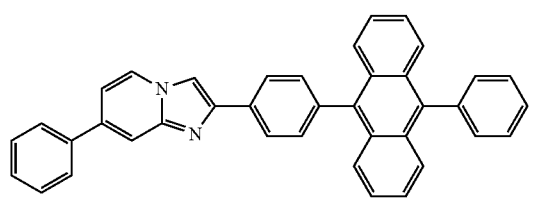
ETL1-14
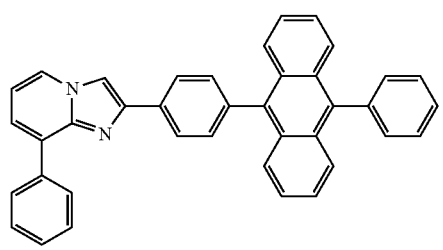
ETL1-15
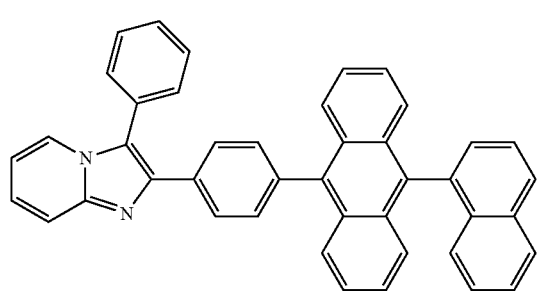
ETL1-16
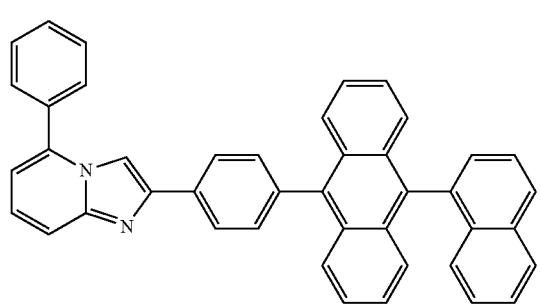
ETL1-17
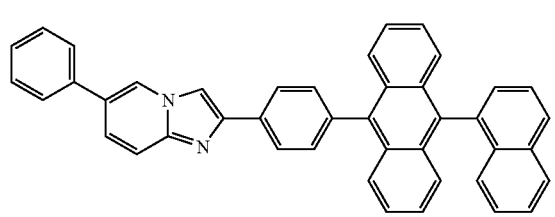
ETL1-18
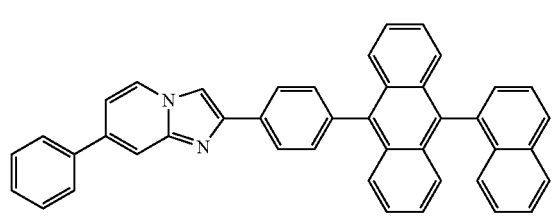

-continued
ETL1-19
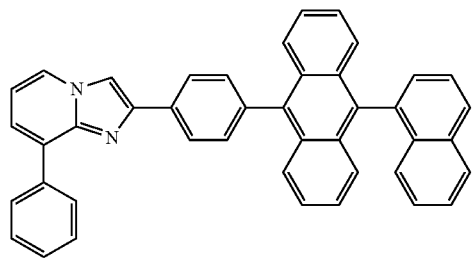
ETL1-20
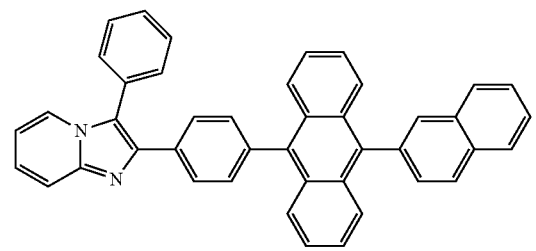
ETL1-21
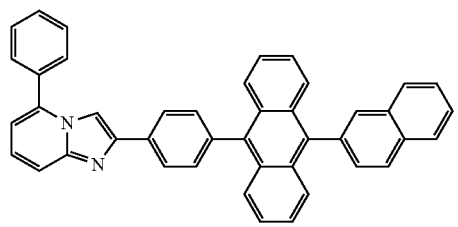
ETL1-22
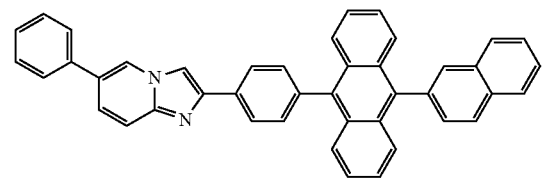
ETL1-23
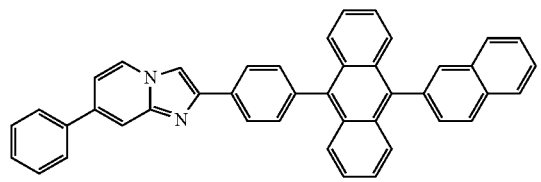
ETL1-24
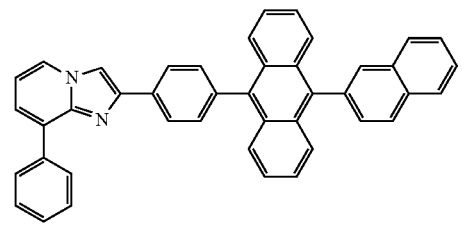
ETL1-25
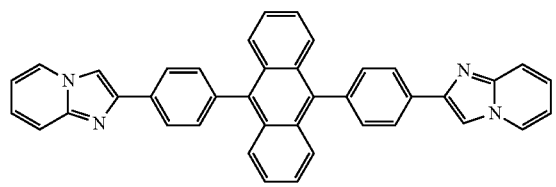
ETL1-26
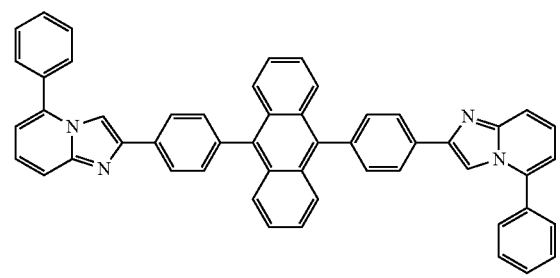
ETL1-27
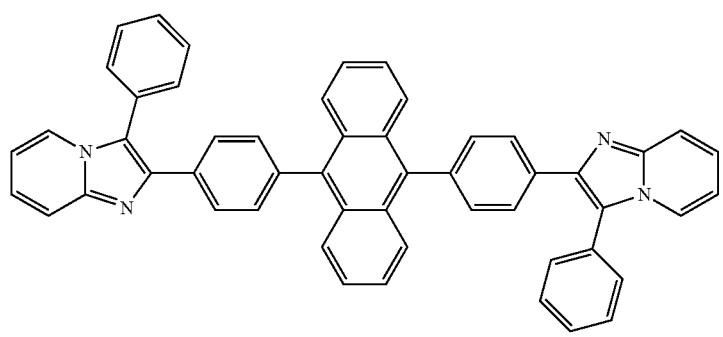
ETL1-28
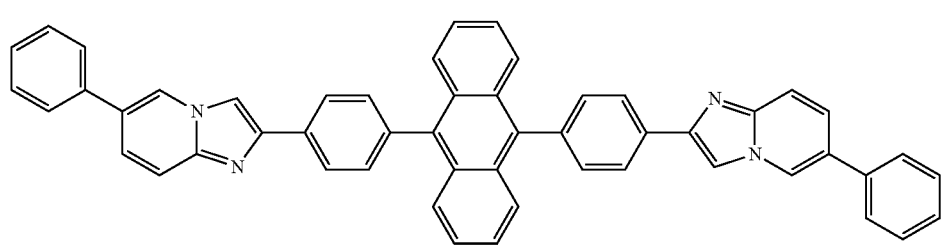

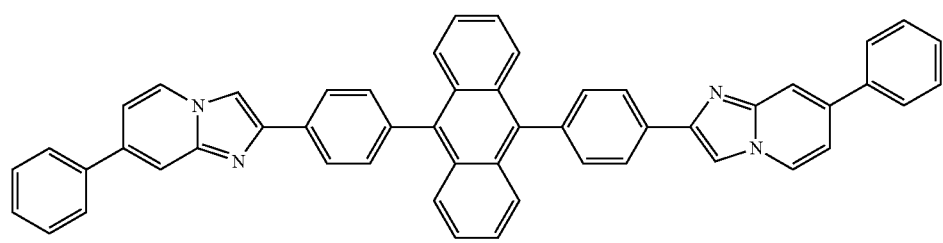
ETL1-29
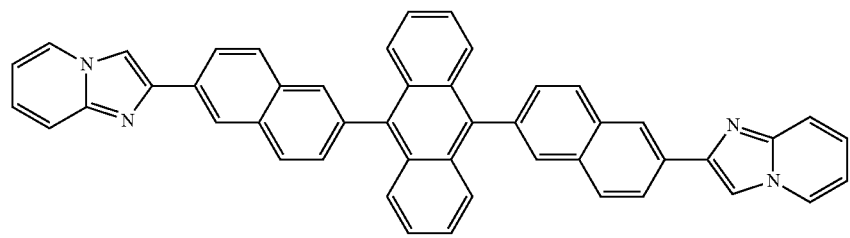
ETL1-30
ETL1-31
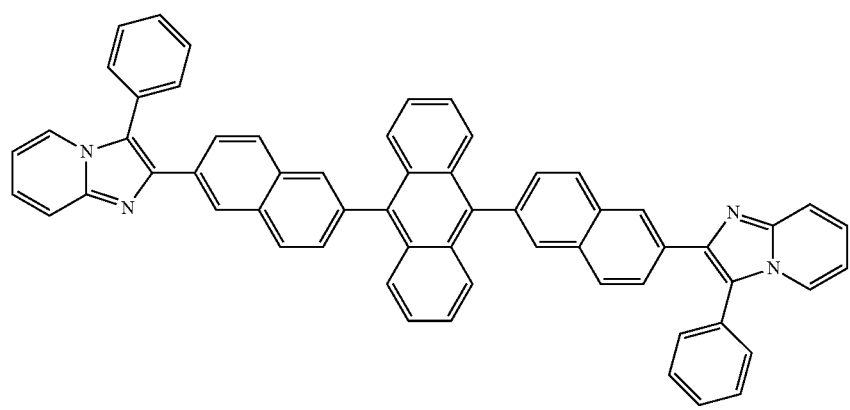
ETL1-32

-continued
ETL1-33
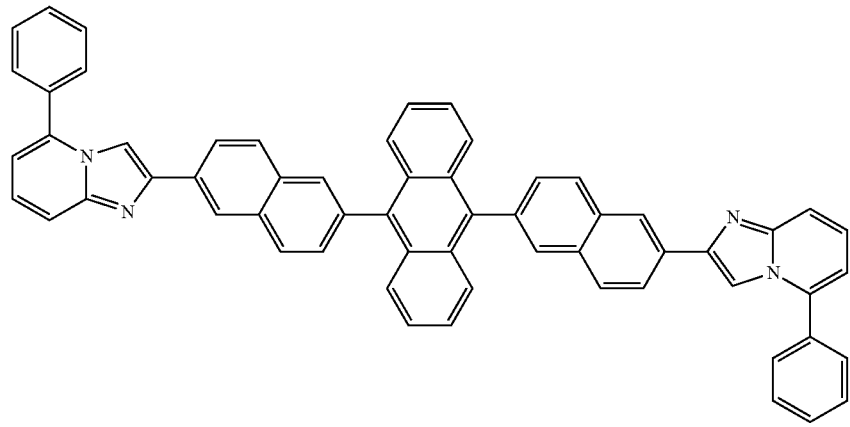
ETL1-34
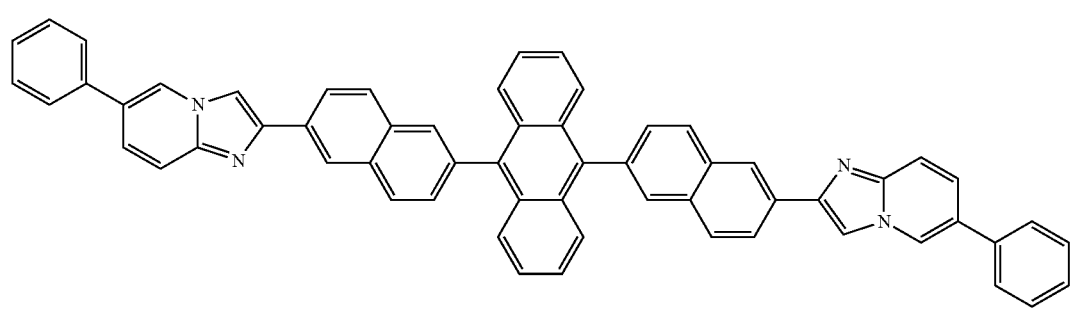
ETL1-35
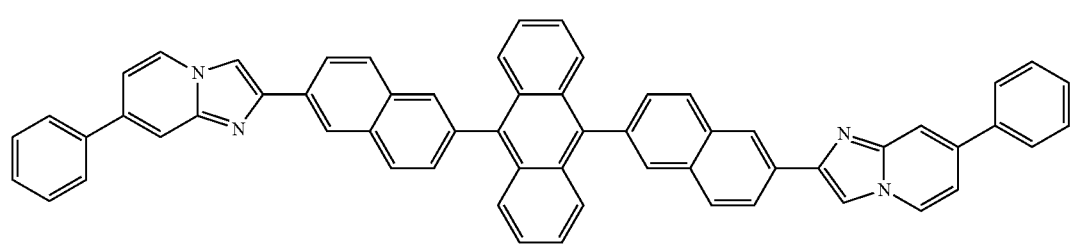
ETL1-36
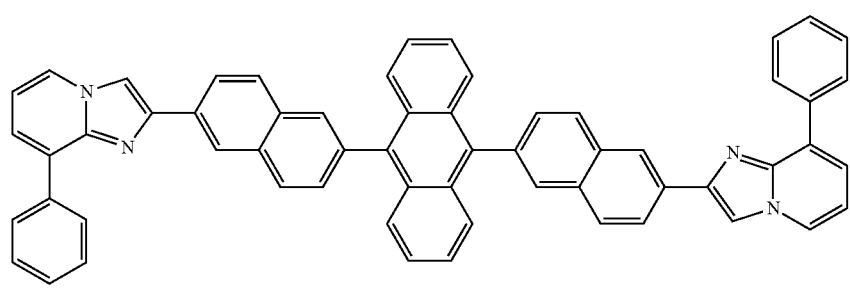
ETL1-37
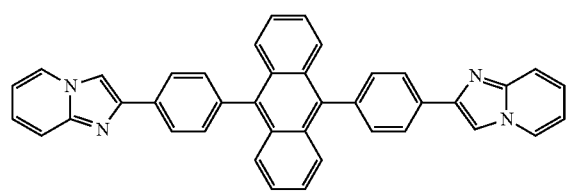
ETL1-38
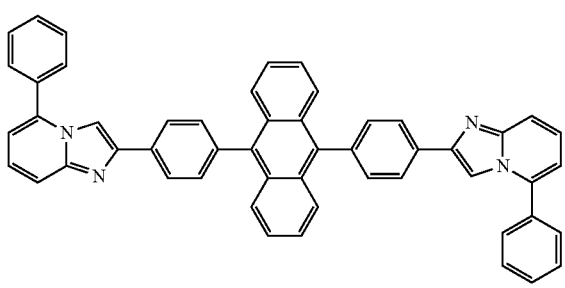

-continued
ETL1-39
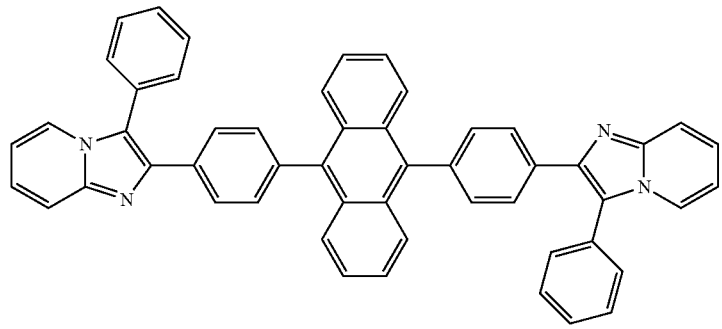
ETL1-40
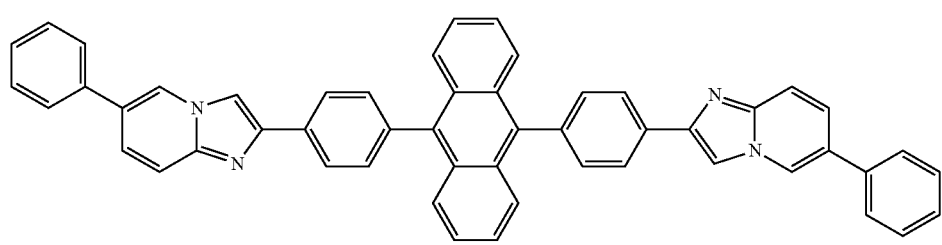
ETL1-41
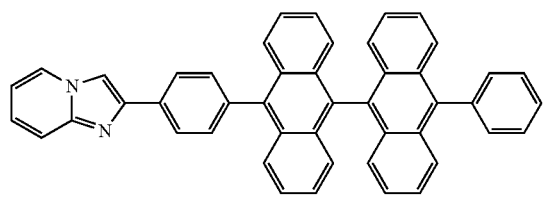
ETL1-42
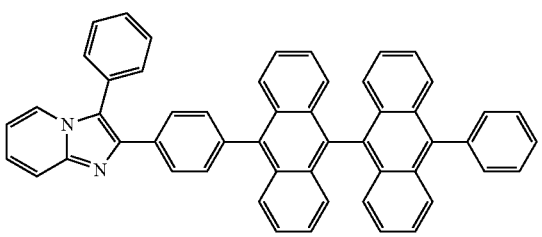
ETL1-43
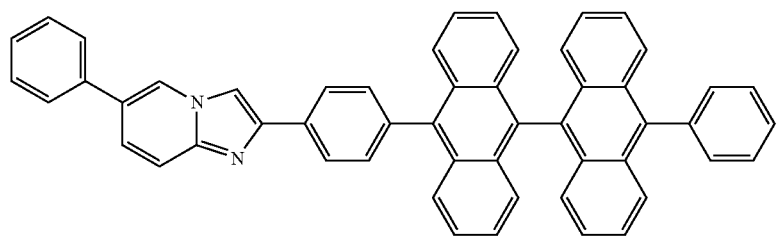
ETL1-44
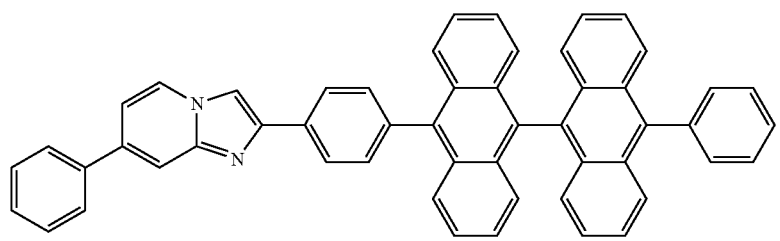
ETL1-45
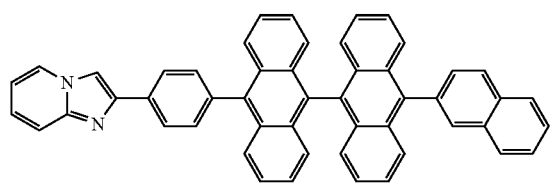
ETL1-46
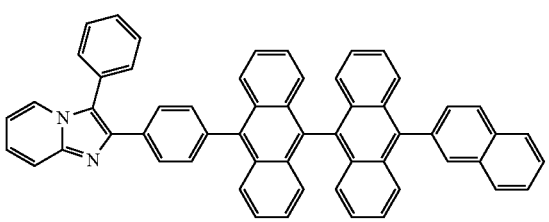

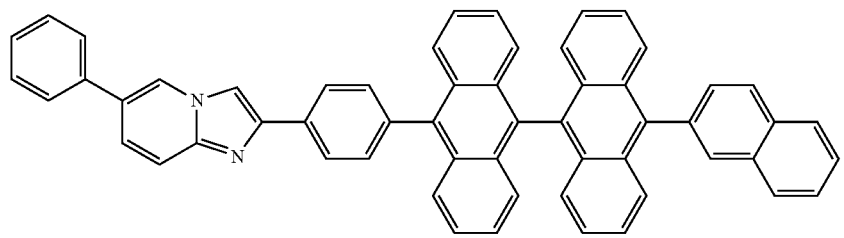
ETL1-47
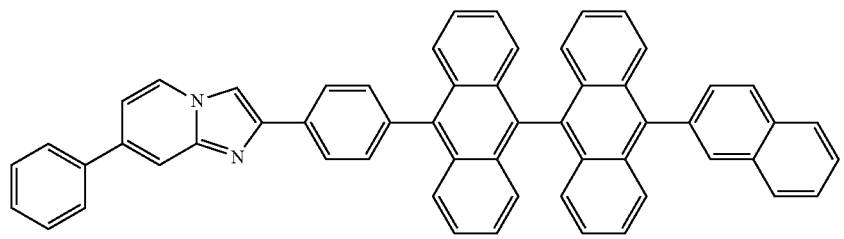
ETL1-48
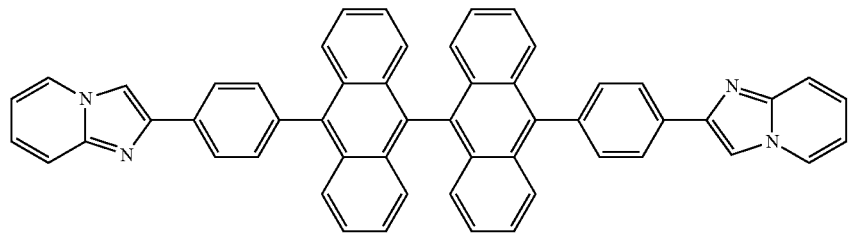
ETL1-49
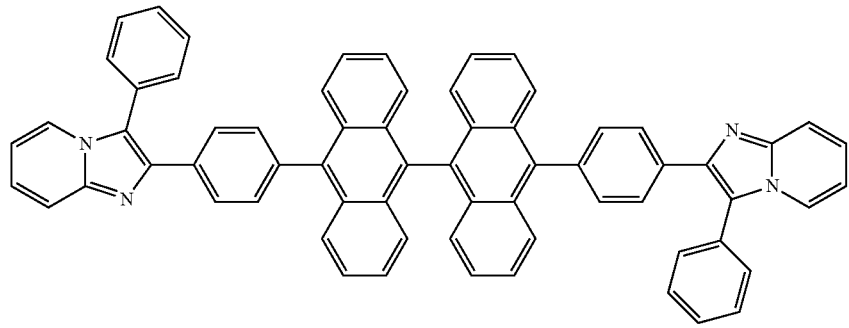
ETL1-50
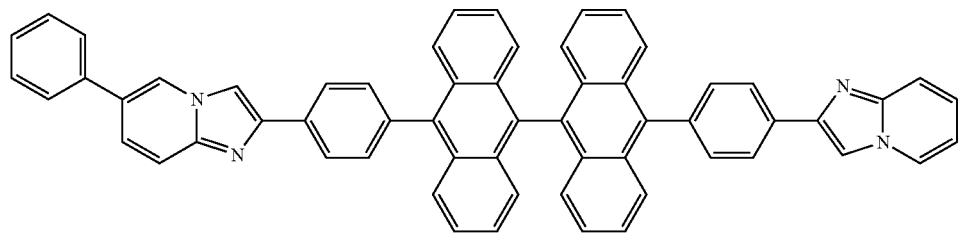
ETL1-51
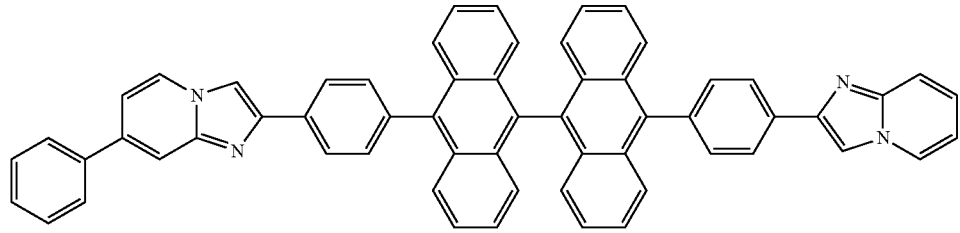
ETL1-52

ETL1-53
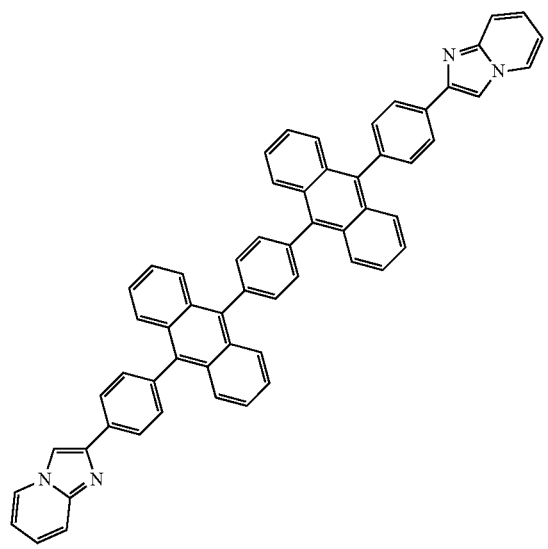
ETL1-54
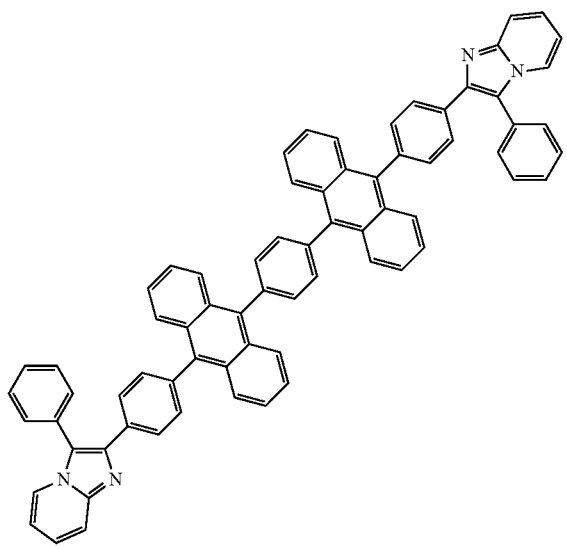
ETL1-55
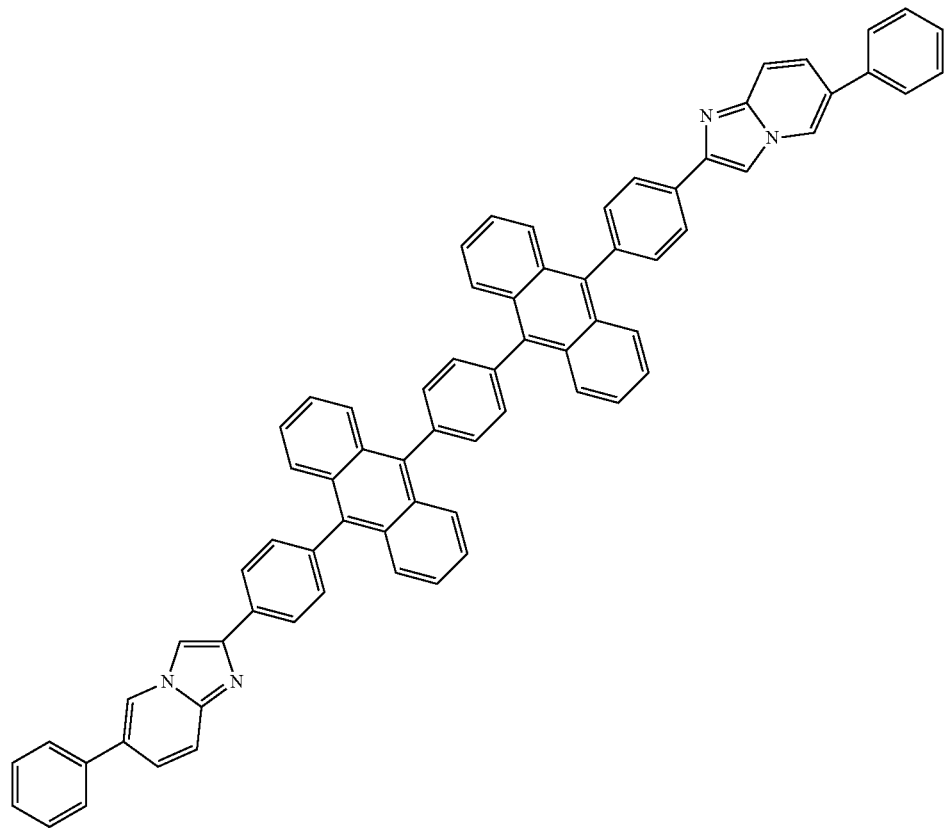

ETL1-56

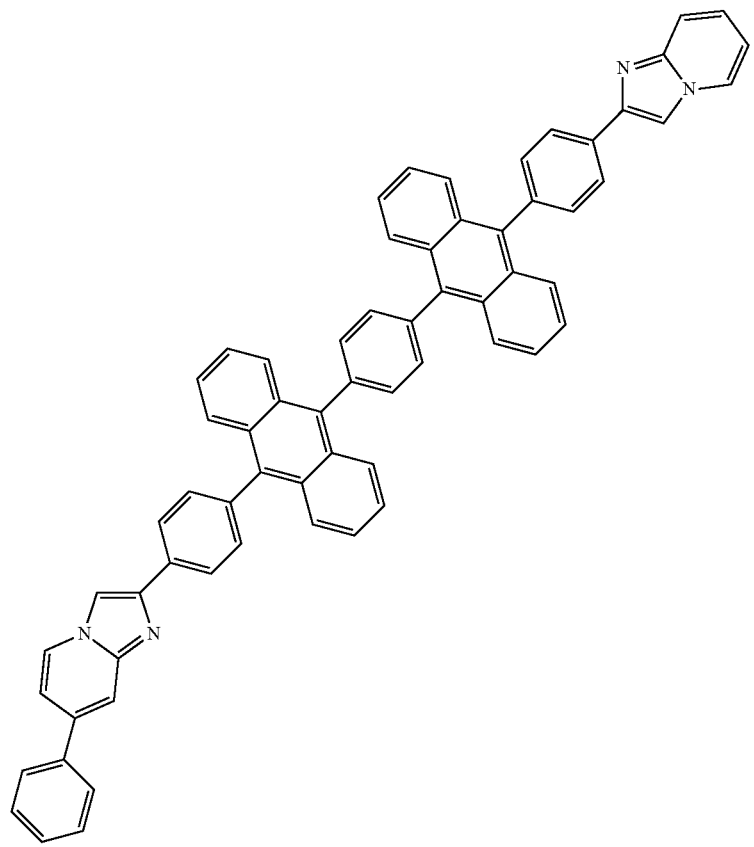

Such an azaindolizine-based compound excels in electron transport and electron injection. Therefore, the light emission efficiency of the light-emitting element 1 can be enhanced.

The reason why such an azaindolizine-based compound excels in electron transport and electron injection is thought to be as follows.

In an azaindolizine-based compound that has an azaindolizine skeleton and anthracene skeleton in the molecule as described above, the entire molecule is connected by a t-conjugated system, and therefore the electron cloud is spread over the entire molecule.

The portion of the azaindolizine skeleton in such an azaindolizine-based compound has a function whereby electrons are accepted and a function whereby the accepted electrons are sent to the portion of the anthracene skeleton. The portion of the anthracene skeleton of the azaindolizine-based compound has a function whereby electrons are accepted from the portion of the azaindolizine skeleton and a function whereby the accepted electrons are delivered to the layer adjacent to the anode 3 side of the electron transport layer 6, i.e., to the light emission layer 5.

In a more specific description, the portion of the azaindolizine skeleton of the azaindolizine-based compound has two nitrogen atoms, and one of the nitrogen atoms (on the side proximal to the portion of the anthracene skeleton) has $sp^2$ hybrid orbitals while the other nitrogen atom (on the side distal to the portion of the anthracene skeleton) has $sp^3$ hybrid orbitals. The nitrogen atom that has the $sp^2$ hybrid orbitals constitutes a part of a conjugated system of the molecule of the azaindolizine-based compound and has a higher electronegativity and greater strength in attracting electrons than the carbon atoms, and therefore functions as a portion that accepts electrons. In turn, the nitrogen atom that has the $sp^3$ orbitals is not a normal conjugated system but rather has an unshared electron pair, and therefore functions as a portion where the electrons thereof send electrons out toward the conjugated system of the molecule of the azaindolizine-based compound.

In turn, the portion of the anthracene skeleton of the azaindolizine-based compound is electrically neutral, and therefore is able to easily accept electrons from the portion of the azaindolizine skeleton. The portion of the anthracene skeleton of the azaindolizine-based compound also has considerable overlapping of the orbitals with the constituent material of the light emission layer 5, in particular, with the host material (tetracene-based material), and therefore is able to easily deliver electrons to the host material of the light emission layer 5.

The azaindolizine-based compound has excellent electron transport and electron injection properties, as stated previously, and therefore it is consequently possible to lower the drive voltage of the light-emitting element 1.

The portion of the azaindolizine skeleton remains stable even though the nitrogen atom having the $sp^2$ hybrid orbitals may be reduced, and remains stable even though the nitrogen atom having the $sp^3$ hybrid orbitals may be reduced. Therefore, the azaindolizine-based compound will possess high stability with respect to electrons and positive holes. As a result, the lifetime of the light-emitting element 1 can be extended.

Though it suffices for the anthracene-based compound used for the electron transport layer 6 (in particular, the second electron transport layer 6a, in the case where the electron transport layer 6 has the second electron transport layer 6a) to be a compound represented by the following formula ETL2, it is preferable for the anthracene-based compound to be a compound represented by the following formula ETL2-A, the following formula ETL2-B, the following formula ETL2-C, or the following formula ETL2-D; in a more specific example, a compound represented by following formulae ETL2-1 to 56 is preferable.

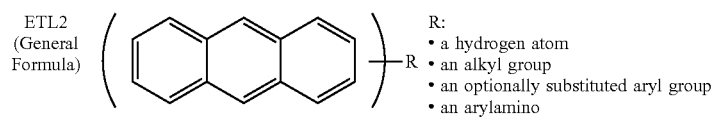

ETL2 (General Formula)

R:
• a hydrogen atom
• an alkyl group
• an optionally substituted aryl group
• an arylamino

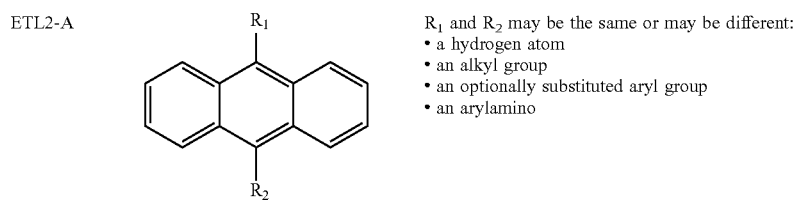

ETL2-A $R_1$ and $R_2$ may be the same or may be different:
• a hydrogen atom
• an alkyl group
• an optionally substituted aryl group
• an arylamino

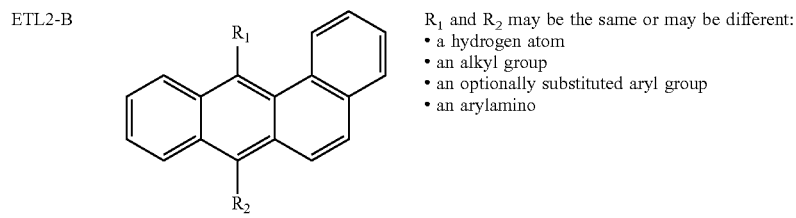

ETL2-B $R_1$ and $R_2$ may be the same or may be different:
• a hydrogen atom
• an alkyl group
• an optionally substituted aryl group
• an arylamino

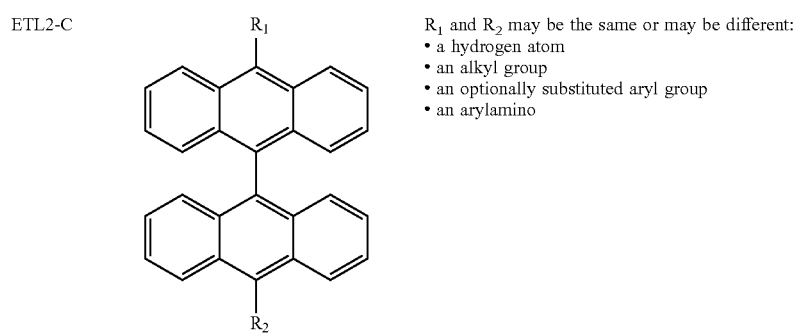

ETL2-C $R_1$ and $R_2$ may be the same or may be different:
• a hydrogen atom
• an alkyl group
• an optionally substituted aryl group
• an arylamino

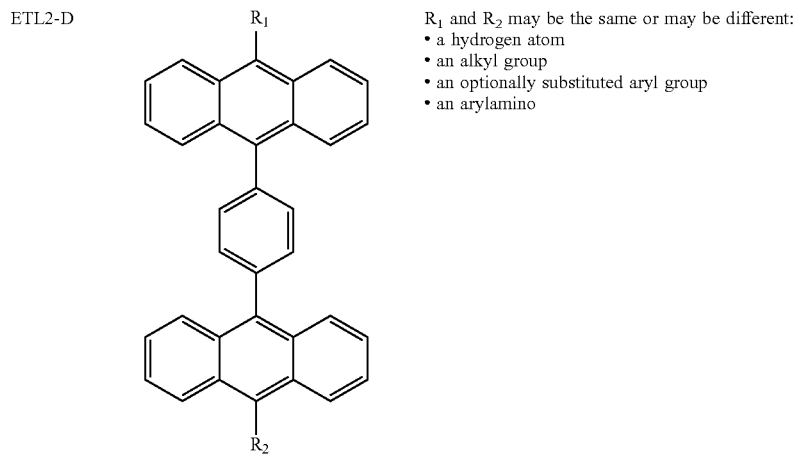

ETL2-D $R_1$ and $R_2$ may be the same or may be different:
• a hydrogen atom
• an alkyl group
• an optionally substituted aryl group
• an arylamino ETL2-1
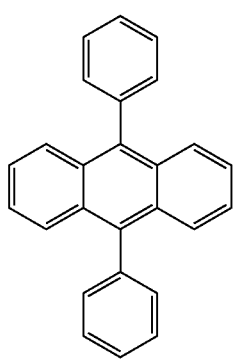
ETL2-2
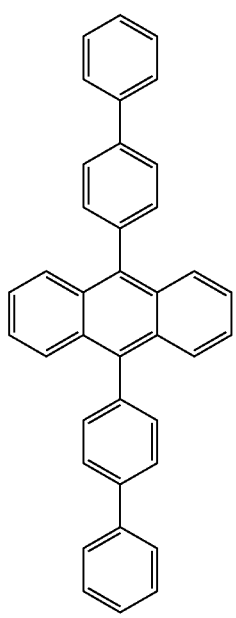
ETL2-3
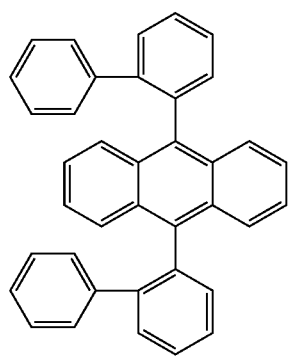
ETL2-4
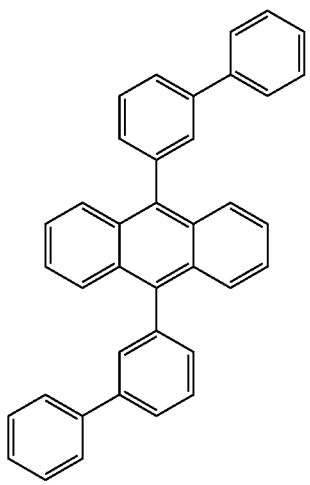
ETL2-5
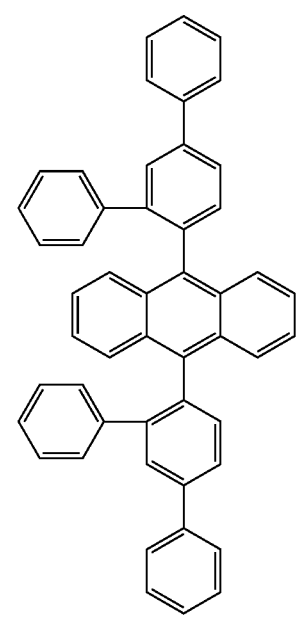
ETL2-6
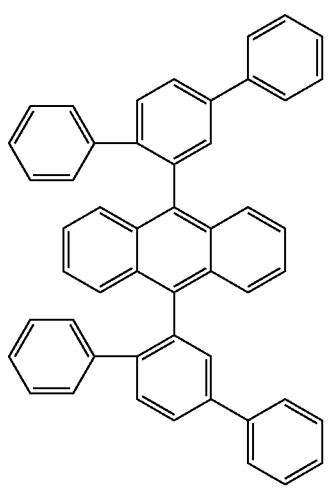

ETL2-7
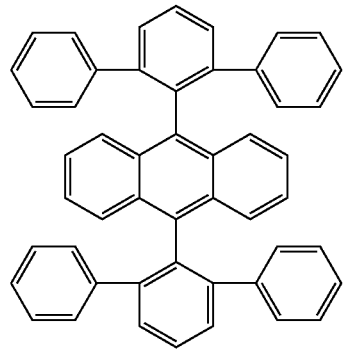
ETL2-8
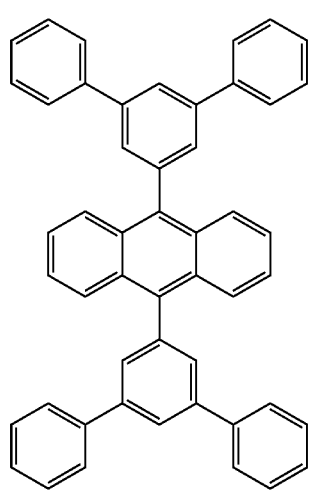
ETL2-9
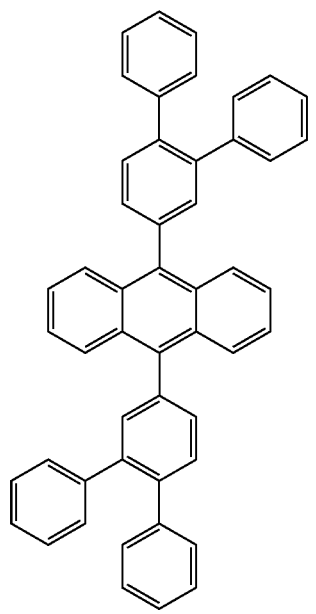
ETL2-10
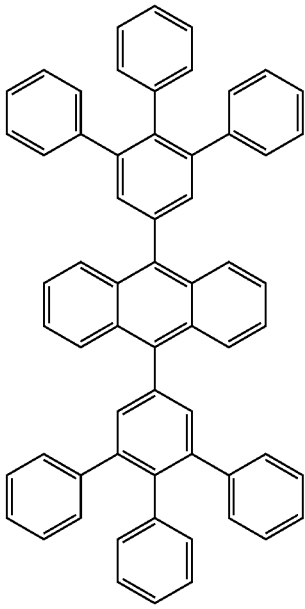
ETL2-11
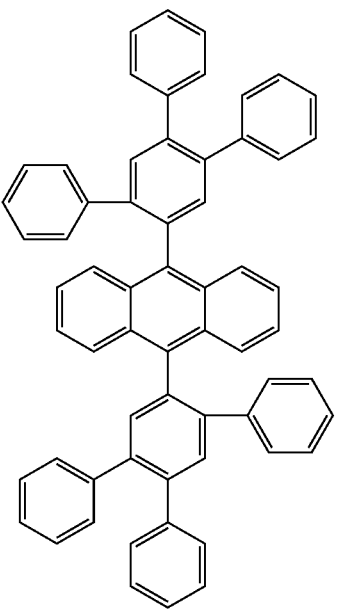
ETL2-12
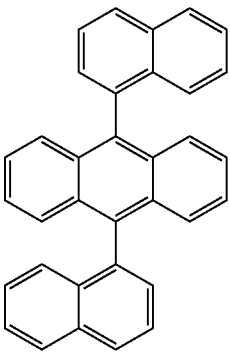

ETL2-13
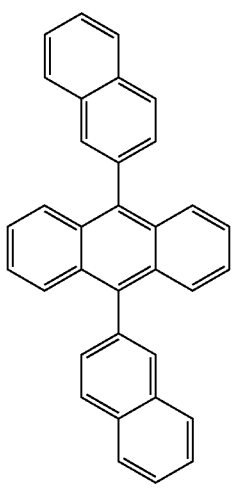
ETL2-14
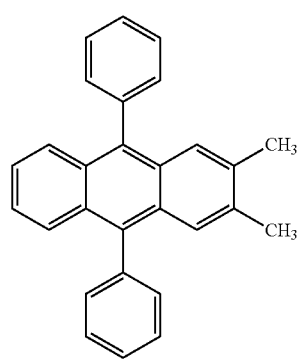
ETL2-15
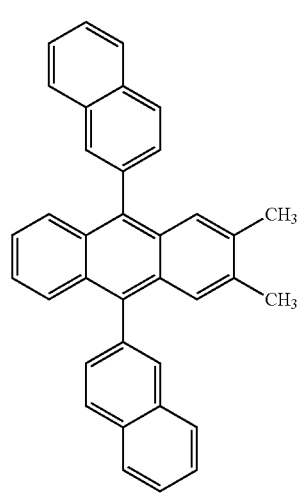
ETL2-16
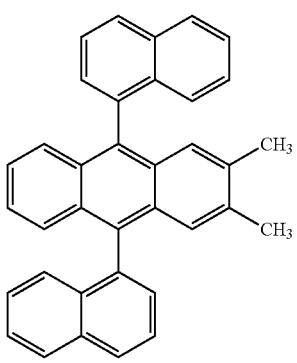
ETL2-17
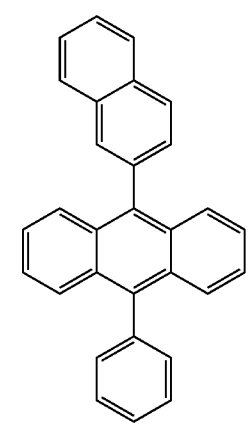
ETL2-18
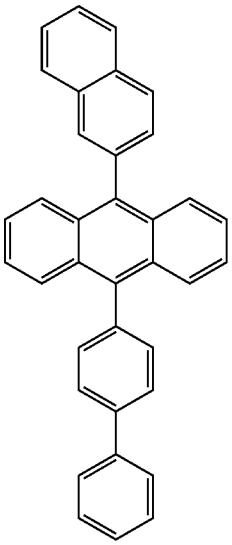

-continued
ETL2-19
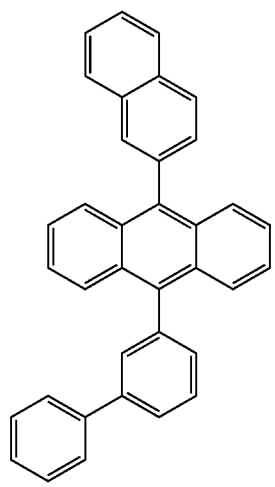
ETL2-20
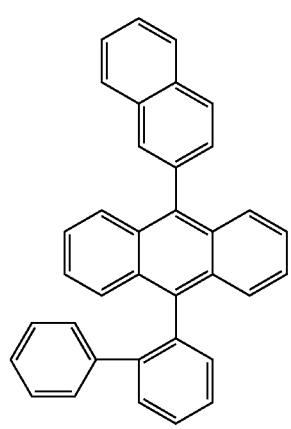
ETL2-21
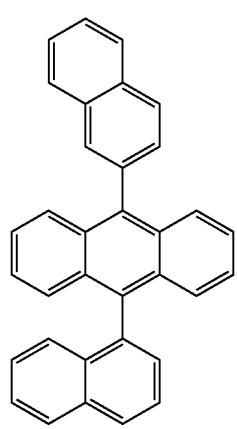
-continued
ETL2-22
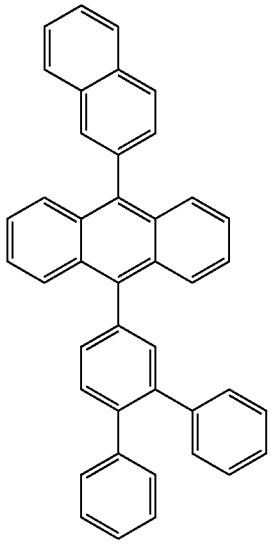
ETL2-23
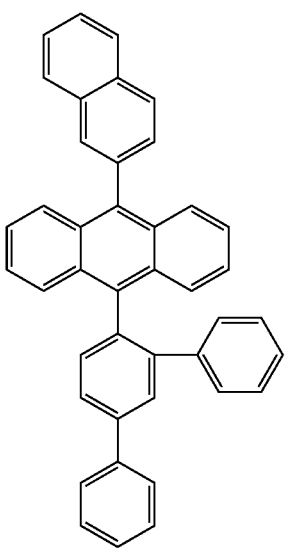
ETL2-24
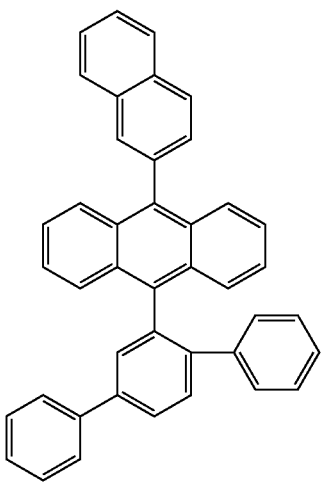

ETL2-25
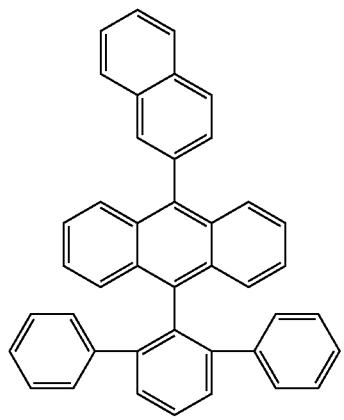
ETL2-26
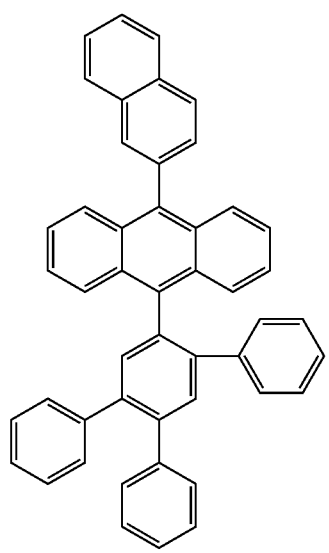
ETL2-27
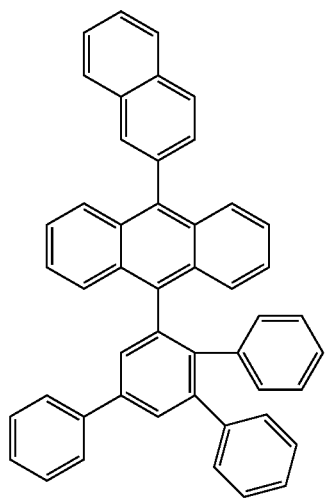
ETL2-28
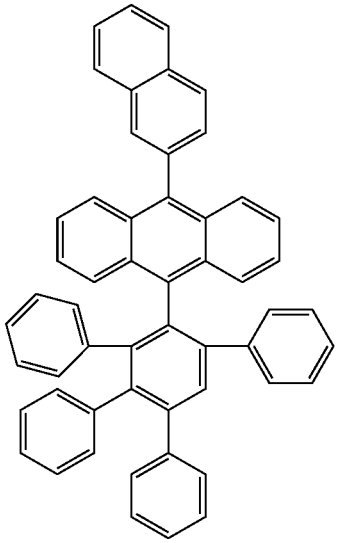
ETL2-29
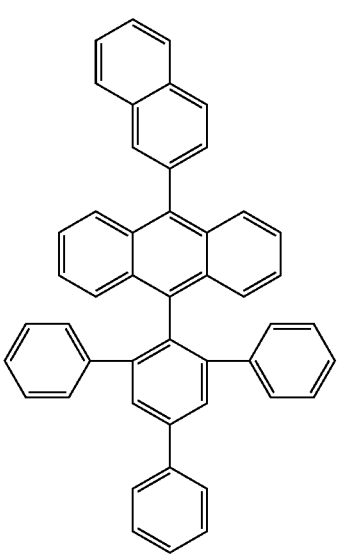

ETL2-30
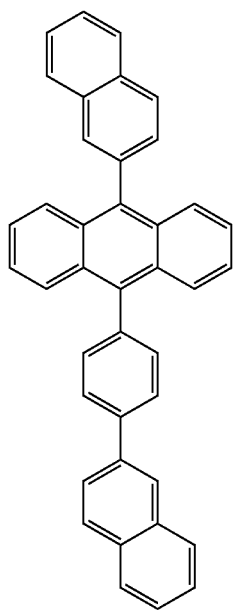
ETL2-31
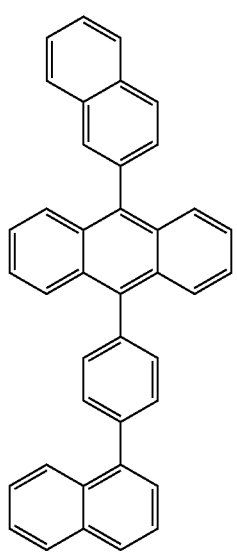
ETL2-32
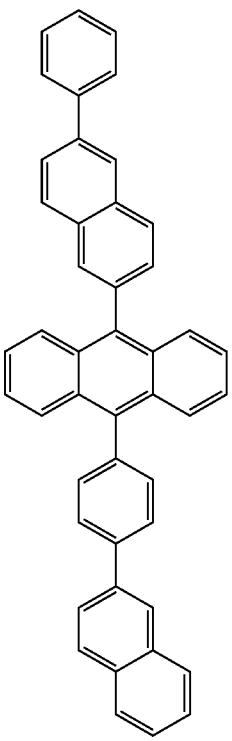
ETL2-33
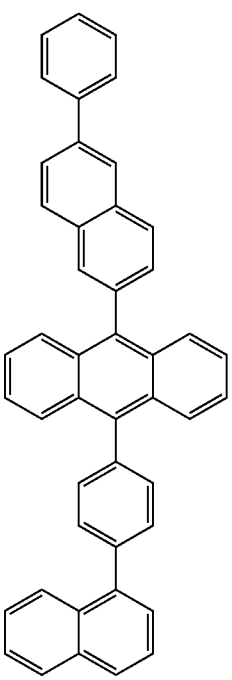

ETL2-34
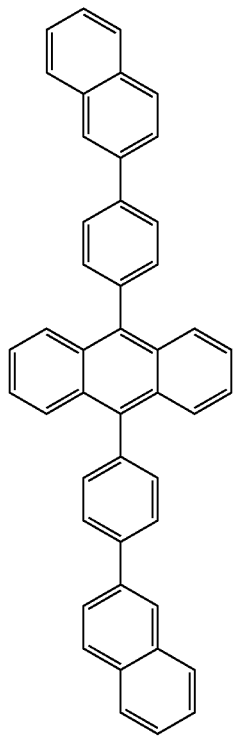
ETL2-35
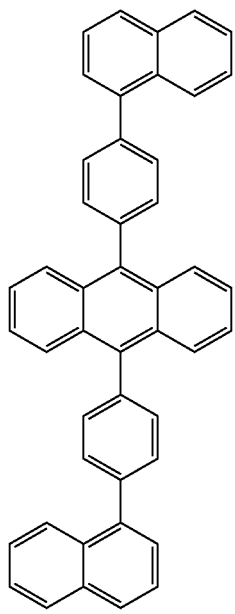
ETL2-36
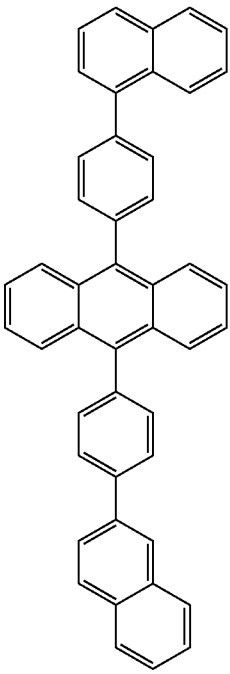
ETL2-37
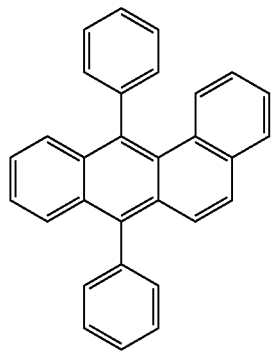
ETL2-38
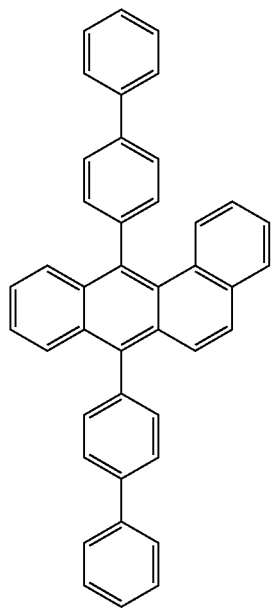

ETL2-39
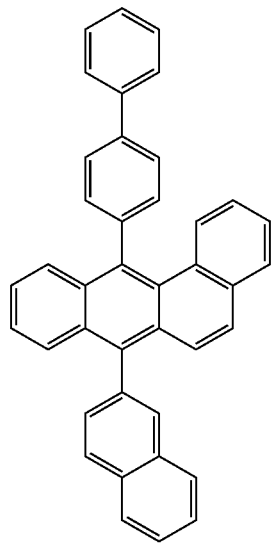
ETL2-40
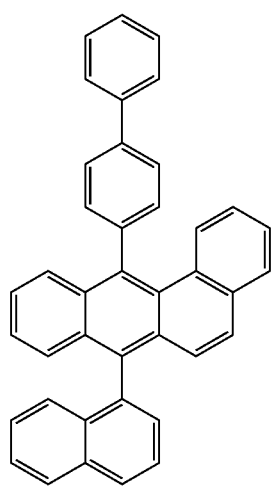
ETL2-41
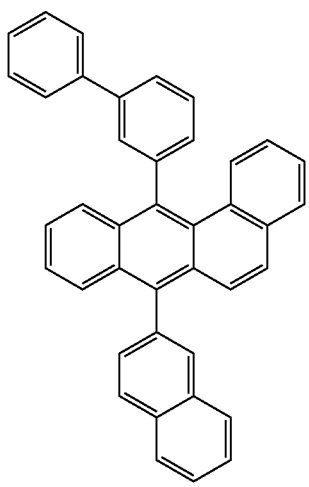
ETL2-42
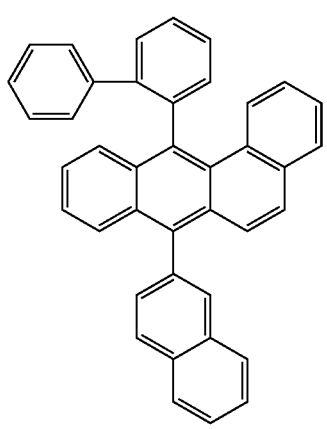
ETL2-43
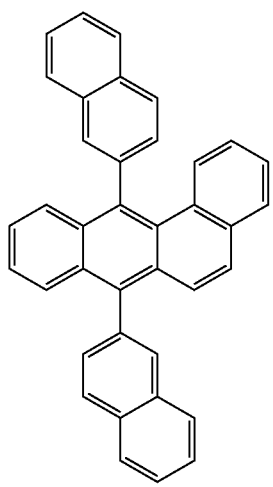
ETL2-44
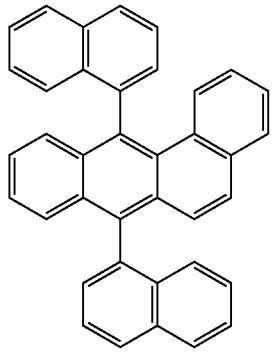

ETL2-45
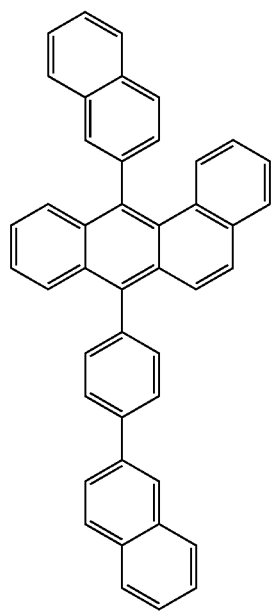
ETL2-46
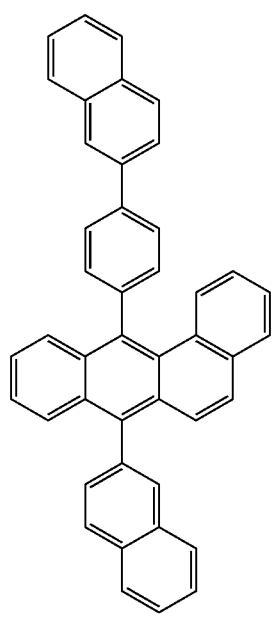
ETL2-47
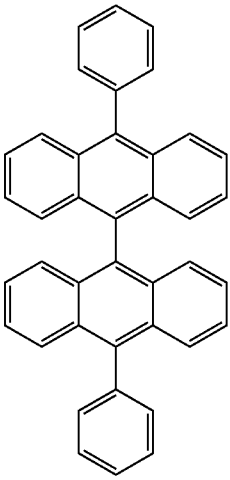
ETL2-48
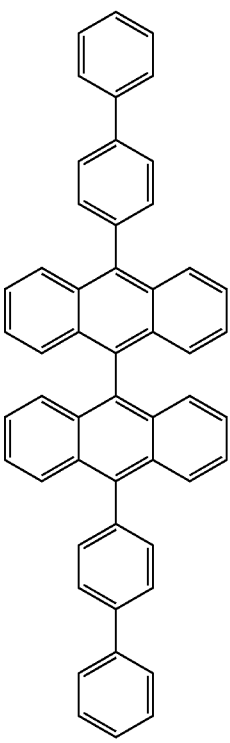

ETL2-49
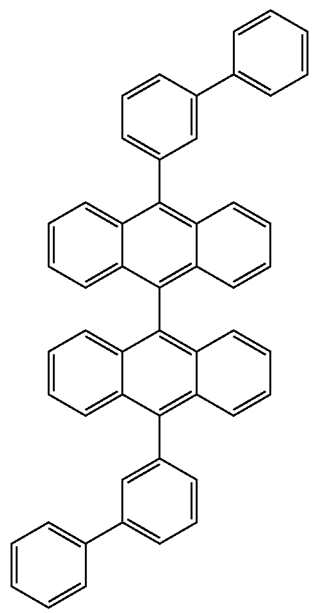
ETL2-50
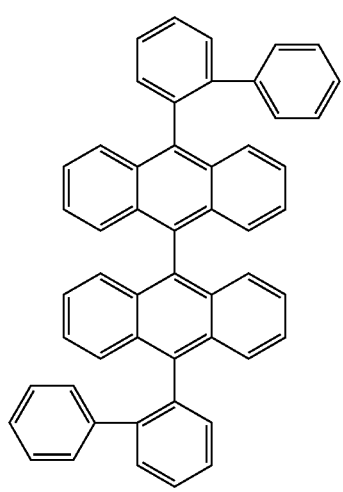
ETL2-51
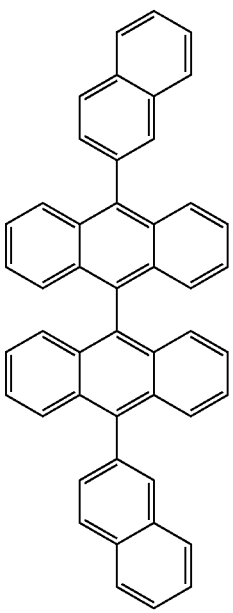
ETL2-52
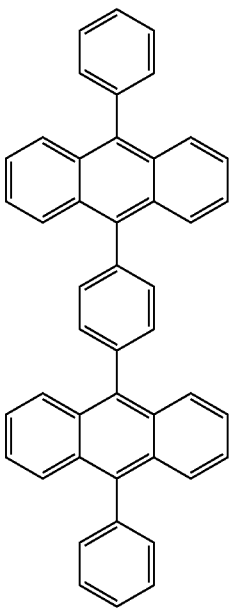

ETL2-53

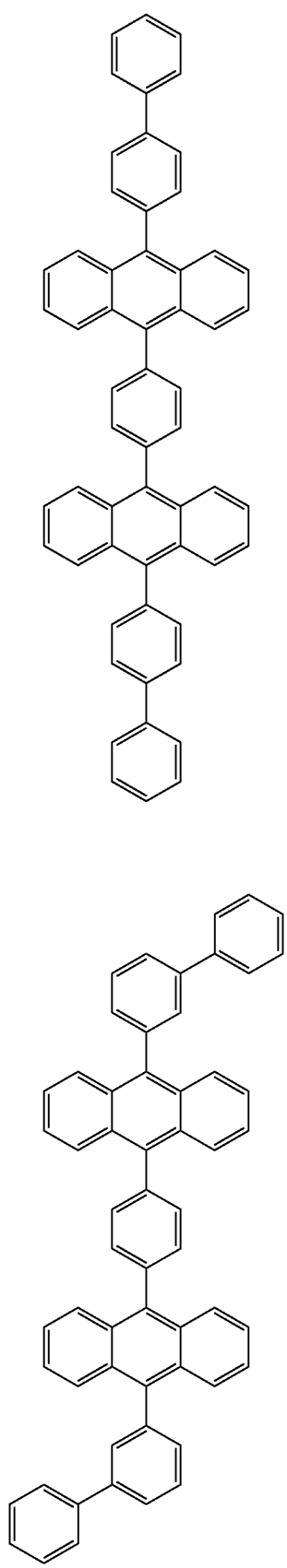

ETL2-54

ETL2-55

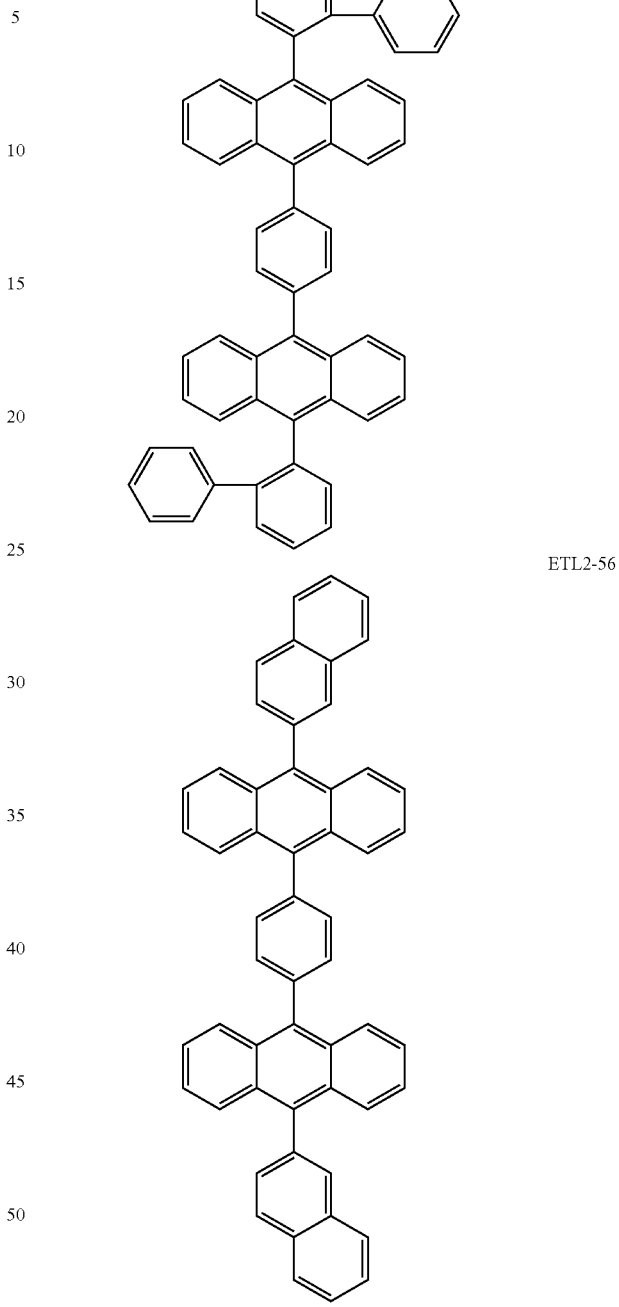

ETL2-56

Also, preferably, the HOMO of the constituent material of the electron transport layer 6 (more specifically, the second electron transport layer 6a) has a difference of at least 0.2 eV from the HOMO of the host material used for the light emission layer 5. This makes it possible to reduce loss of positive holes from the light emission layer 5 to the electron transport layer 6 and to raise the light emission efficiency.

Also, the HOMO of the constituent material of the second electron transport layer 6a is preferably 5.5 eV to 6.0 eV, and the LUMO of the constituent material of the second electron transport layer 6a is preferably 2.5 eV to 3.0 eV.

The HOMO of the constituent material of the first electron transport layer 6b is preferably 5.8 eV to 6.5 eV, and the LUMO of the constituent material of the first electron transport layer 6b is preferably 2.8 eV to 3.5 eV.

The thickness of the second electron transport layer 6a is preferably greater than the thickness of the first electron transport layer 6b. This makes it possible to efficiently transport and inject the electrons to the light emission layer 5 while also keeping the drive voltage of the light-emitting element 1 low, and possible to reduce deterioration of the electron transport layer 6.

The specific thickness of the second electron transport layer 6a is preferably 30 nm to 150 nm, more preferably 70 nm to 90 nm. This makes it possible to efficiently transport and inject the electrons to the light emission layer 5 while also keeping the drive voltage of the light-emitting element 1 low, and possible to reduce deterioration of the electron transport layer 6.

Furthermore, the thickness of the electron transport layer 6 overall is preferably 55 nm to 200 nm, more preferably 70 nm to 95 nm. This makes it possible to efficiently transport and inject the electrons to the light emission layer 5 while also keeping the drive voltage of the light-emitting element 1 low.

The second electron transport layer 6a may be omitted, depending on, inter alia, the combination of the constituent materials of the first electron transport layer 6b and the light emission layer 5.

Electron Injection Layer

The electron injection layer 7 is one that has a function for enhancing the efficiency of electron injection from the negative electrode 8.

Examples of the constituent material of this electron injection layer 7 (an electron injection material) include a variety of inorganic insulating materials and a variety of inorganic semiconductor materials.

Examples of such an inorganic insulating material include alkali metal chalcogenides (oxides, sulfides, selenides, and tellurides), alkaline earth metal chalcogenides, halides of alkali metals, and halides of alkaline earth metals; it would be possible to use one of these species or a combination of two or more of these species. Using same as a principal material to constitute the electron injection layer 7 makes it possible to further enhance the electron injection property. In particular, alkali metal compounds (alkali metal chalcogenides, halides of alkali metals, and the like) have a very small work function, and using same to constitute the electron injection layer 7 would produce a high-luminance light-emitting element 1.

Examples of alkali metal chalcogenides include $Li_2O$, LiO, $Na_2S$, $Na_2Se$, and NaO.

Examples of alkaline earth metal chalcogenides include CaO, BaO, SrO, BeO, BaS, MgO, and CaSe.

Examples of halides of alkali metals include CsF, LiF, NaF, KF, LiCl, KCl, and NaCl.

Examples of halides of alkaline earth metals include $CaF_2$, $BaF_2$, $SrF_2$, $MgF_2$, and $BeF_2$.

Examples of inorganic semiconductor materials include oxides, nitrides, or oxynitrides of at least one element among Li, Na, Ba, Ca, Sr, Yb, Al, Ga, In, Cd, Mg, Si, Ta, Sb, and Zn; it would be possible to use one of these species or a combination of two or more of these species.

Though not particularly limited, the mean thickness of the electron injection layer 7 is preferably about 0.1 nm to 1,000 nm, more preferably about 0.2 nm to 100 nm, even more preferably about 0.2 nm to 50 nm.

The electron injection layer 7 may be omitted, depending on, inter alia, the thickness of the constituent materials of the negative electrode 8 and the electron transport layer 6.

Sealing Member

The sealing member 9 is provided so as to cover the anode 3, the laminate 14, and the negative electrode 8, and has the function of blocking out oxygen and moisture. Providing the sealing member 9 produces such effects as an improvement in the reliability of the light-emitting element 1, and prevention of degeneration and deterioration (improvement of durability).

Examples of the constituent material of the sealing member 9 could include Al, Au, Cr, Nb, Ta, Ti, or alloys comprising same, as well as silicon oxide and a variety of resin materials. In a case where a material that is electro-conductive is used as the constituent material of the sealing member 9, then it would be preferable to provide an insulating film, as needed, between the sealing member 9 and the anode 3, laminate 14, and negative electrode 8, in order to prevent a short circuit.

The sealing member 9 may be made to face the substrate 2 in the form of a flat plate, the space therebetween being sealed with a sealing material such as, for example, a heat-curable resin.

According to the light-emitting element 1 configured as described above, the use of the benzo-bis-thiadiazole-based compound as the light emission material of the light emission layer 5 and the use of the tetracene-based material as the host material of the light emission layer 5 enables light emission in the near-infrared region and also makes it possible to achieve a higher efficiency and longer lifetime.

The light-emitting element 1 as per the above can be manufactured, for example, in the following manner.

[1] First, the substrate 2 is prepared and the anode 3 is formed on the substrate 2.

The anode 3 can be formed using, for example, a method of chemical vapor deposition (CVD) such as plasma CVD or thermal CVD, dry plating such as vacuum deposition, wet plating such as electrolytic plating, thermal spraying, a sol-gel method, an MOD method, bonding of metal foil, or the like.

[2] Next, the hole injection layer 4 is formed on the anode 3.

The hole injection layer 4 is preferably formed by, for example, a gas phase process using CVD, dry plating such as vacuum deposition or sputtering, or the like.

The hole injection layer 4 can also be formed by, for example, supplying a hole injection layer-forming material obtained by when a hole-injecting material is dissolved into a solvent or dispersed into a dispersion medium onto the anode 3 and thereafter drying (removing the solvent or removing the dispersion medium).

Examples that could be used as a method of supplying the hole injection layer-forming material include spin coating, roll coating, inkjet printing, and a variety of other such coating methods. The use of such coating methods makes it possible to form the hole injection layer 4 relatively easily.

Examples of solvents or dispersion mediums that can be used in the preparation of the hole injection layer-forming material include a variety of inorganic solvents, a variety of organic solvents, and mixed solvents comprising same.

The drying can be carried out by, for example, standing in an atmospheric pressure or reduced pressure atmosphere, heat treatment, spraying of inert gas, or the like.

Moreover, prior to this step, an upper surface of the anode 3 may be subjected to an oxygen plasma treatment. This makes it possible to endow the upper surface of the anode 3 with lyophilicity, to remove (wash) organic matter that sticks to the upper surface of the anode 3, and to adjust the work function of the vicinity of the upper surface of the anode 3.

Herein, preferable examples of conditions for the oxygen plasma treatment are a plasma power of about 100 W to 800 W, oxygen gas flow rate of about 50 mL/min to 100 mL/min, rate of conveyance of the member being processed (the anode 3) of about 0.5 mm/sec to 10 mm/sec, and a temperature of the substrate 2 or about 70° C. to 90° C.

[3] Next, the light emission layer 5 is formed on the hole injection layer 4.

The light emission layer 5 can be formed by, for example, a gas phase process using vacuum deposition or another form of dry plating or the like.

[4] Next, the electron transport layer 6 (the first electron transport layer 6b and the second electron transport layer 6a) is formed on the light emission layer 5.

The electron transport layer 6 (the first electron transport layer 6b and the second electron transport layer 6a) can be formed by, for example, a gas phase process using vacuum deposition or another form of dry plating or the like.

The electron transport layer 6 can also be formed by, for example, supplying an electron transport layer-forming material obtained by when an electron-transporting material is dissolved into a solvent or dispersed into a dispersion medium onto the light emission layer 5 and thereafter drying (removing the solvent or removing the dispersion medium).

[5] Next, the electron injection layer 7 is formed on the electron transport layer 6.

In a case where an inorganic material is used as the constituent material of the electron injection layer 7, then the electron injection layer 7 can be formed using, for example, CVD, a gas phase processing using dry plating such as vacuum deposition or sputtering or the like, or coating and firing an inorganic particulate ink, or the like.

[6] Next, the negative electrode 8 is formed on the electron injection layer 7.

The negative electrode 8 can be formed using, for example, vacuum deposition, sputtering, bonding of metal foil, coating and firing of a metal particulate ink, or the like.

Through the above steps, the light-emitting element 1 is obtained.

Finally, the resulting light-emitting element 1 is covered with the sealing member 9 and bonded to the substrate 2.

Light Emission Apparatus

Next, an embodiment of a light emission apparatus of the present invention shall be described.

Figure 2:
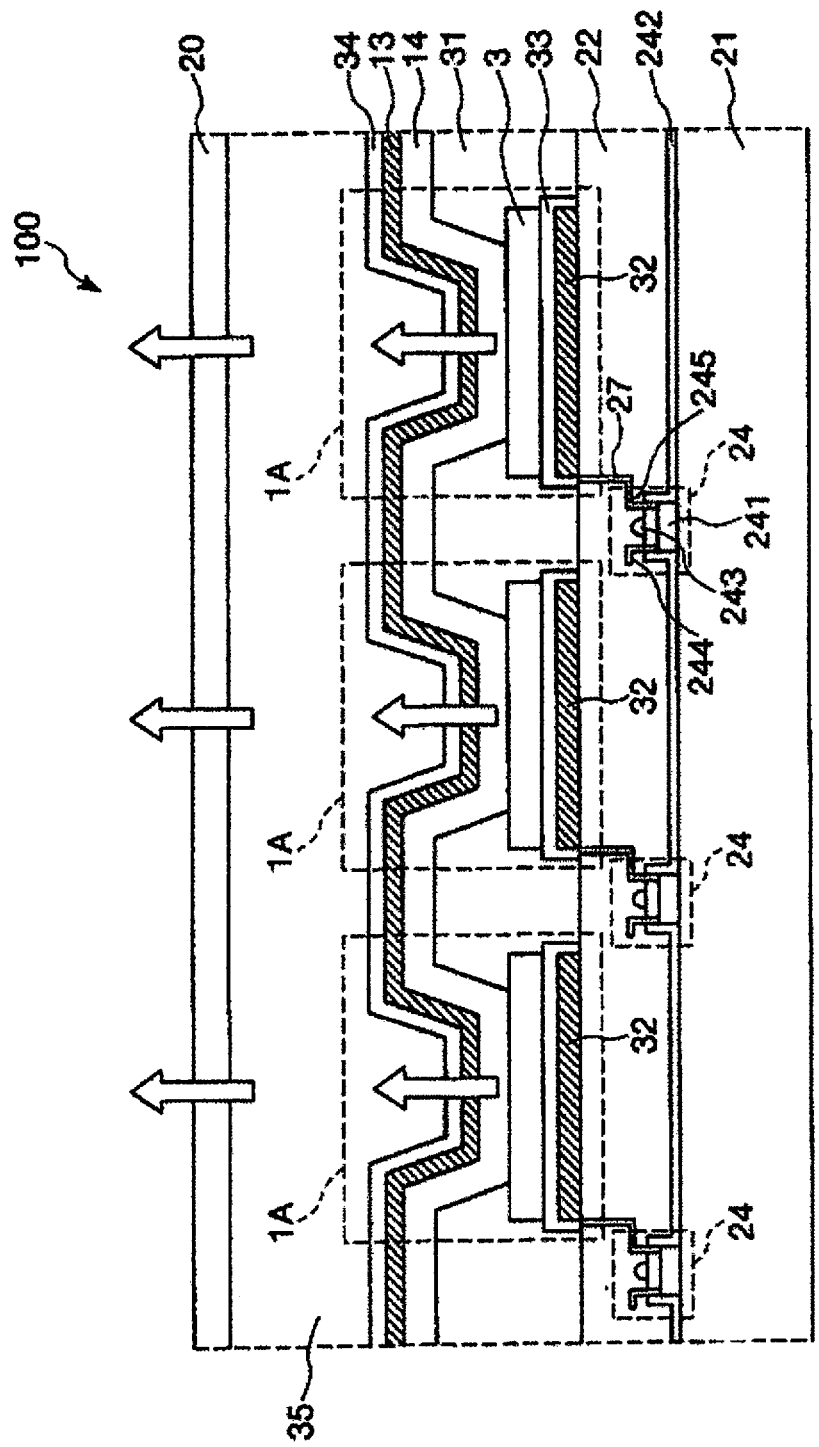
FIG. 2 is a longitudinal cross-sectional view illustrating an embodiment of a display apparatus to which a light emission apparatus of the embodiment has been applied.

FIG. 2 is a longitudinal cross-sectional view illustrating an embodiment of a display apparatus to which a light emission apparatus of the embodiment has been applied.

A display apparatus 100 illustrated in FIG. 2 has a substrate 21, a plurality of light-emitting elements 1A, and a plurality of driving transistors 24 for respectively driving each of the light-emitting elements 1A. Herein, the display apparatus 100 is a display panel of a top emission structure.

On the substrate 21, the plurality of driving transistors 24 are provided and a planarizing layer 22 constituted of an insulating material is formed so as to cover the driving transistors 24.

Each of the driving transistors 24 has a semiconductor layer 241 composed of silicon, a gate insulation layer 242 formed on the semiconductor layer 241, a gate electrode 243 formed on the gate insulation layer 242, a source electrode 244, and a drain electrode 245.

The light-emitting elements 1A are provided on the planarizing layer so as to correspond to each of the driving transistors 24.

The light-emitting elements 1A have a reflective film 32, an anti-corrosion film 33, the anode 3, the laminate (organic EL light-emitting unit) 14, a negative electrode 13, and a negative electrode cover 34, which are layered in the stated order on the planarizing layer 22. In the present embodiment, the anode 3 of each of the light-emitting elements 1A constitutes a pixel electrode and is electrically connected by an electroconductive unit (wiring) 27 to the drain electrode 245 of the respective driving transistor 24. The negative electrodes 13 of the light-emitting elements 1A are regarded as a common electrode.

The light-emitting elements 1A in FIG. 2 are ones that emit light in the near-infrared region.

Partition walls 31 are provided between adjacent light-emitting elements 1A. An epoxy layer 35 constituted of an epoxy resin is formed on the light-emitting elements 1A so as to cover same.

A sealing substrate 20 is provided on the epoxy layer 35 so as to cover same.

The display apparatus 100 as described above can be used as a near-infrared display, for example, in military uses and the like.

According to this display apparatus 100, light can be emitted in the near-infrared region. Also, because the display apparatus 100 is provided with the high-efficiency and long-lasting light-emitting elements 1A, the reliability is excellent.

Authentication Apparatus

Next, an embodiment of an authentication apparatus of the present invention shall be described.

Figure 3:
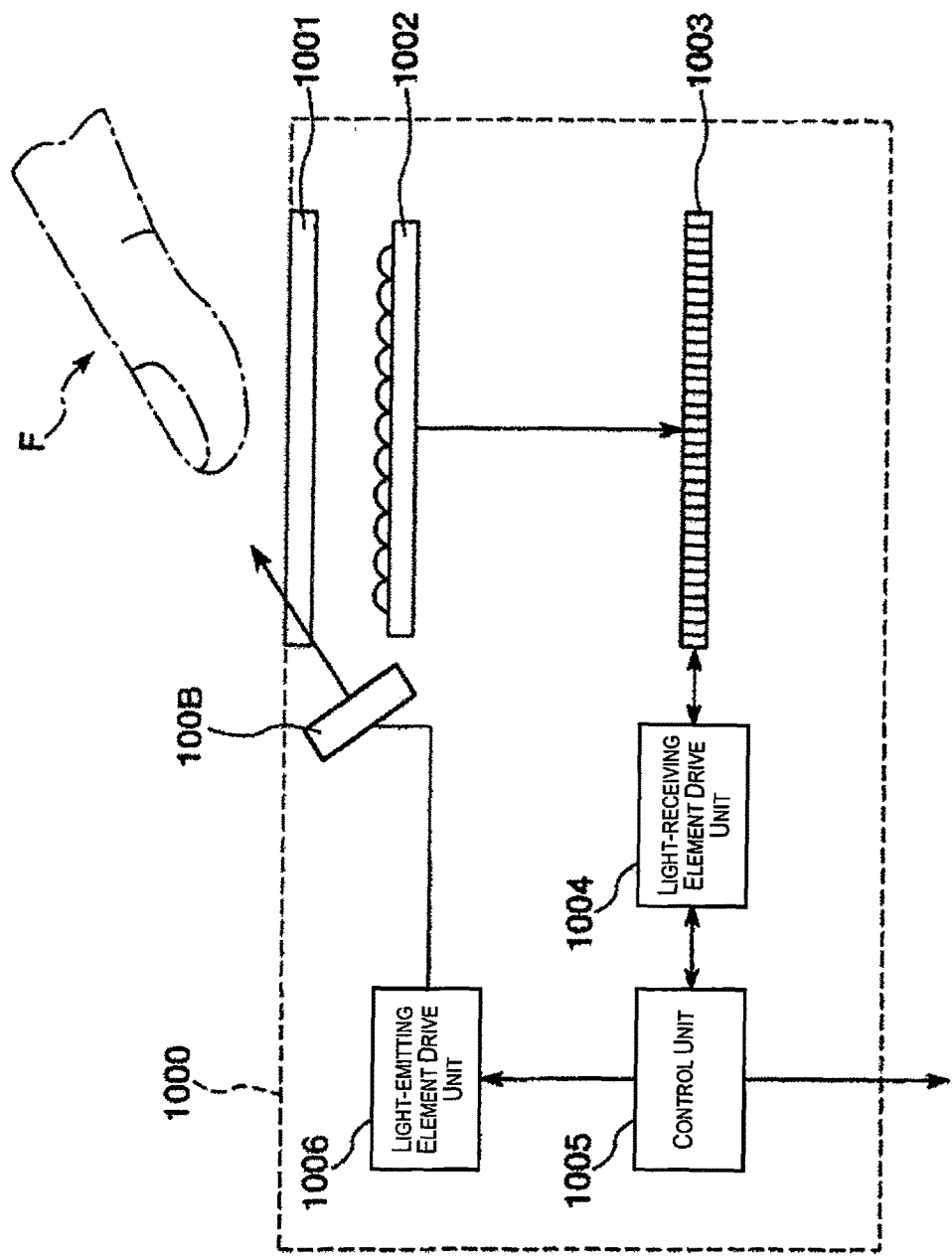
FIG. 3 is a drawing illustrating an embodiment of an authentication apparatus of the embodiment.

FIG. 3 is a drawing illustrating an embodiment of an authentication apparatus of the present invention.

An authentication apparatus 1000 illustrated in FIG. 3 is a biometric authentication apparatus for using biometric information of a biological object F (which, in the present embodiment, is a fingertip) to authenticate an individual person.

This authentication apparatus 1000 has a light source 100B, a cover glass 1001, a micro-lens array 1002, a light-receiving element group 1003, a light-emitting element drive unit 1006, a light-receiving element drive unit 1004, and a control unit 1005.

The light source 100B is one that is provided with a plurality of the light-emitting element 1 described above, and irradiates the biological object F, which is an imaging object, with light of the near-infrared region. For example, the plurality of light-emitting elements 1 of the light source 100B are arranged along the outer periphery of the cover glass 1001.

The cover glass 1001 is a site with which the biological object F makes contact or to which the biological object F is proximal.

The micro-lens array 1002 is provided to an opposite side from the side of the cover glass 1001 where the biological object F is in contact or proximal. The micro-lens array 1002 is configured with a plurality of micro-lenses arranged in the form of a matrix.

The light-receiving element group 1003 is provided to an opposite side from the cover glass 1001 with respect to the micro-lens array 1002. The light-receiving element group 1003 is constituted of a plurality of light-receiving elements that are provided in the form of a matrix so as to correspond to the plurality of micro-lenses of the micro-lens array 1002. It would be possible to use, for example, a charge coupled device (CCD), CMOS, or the like as each of the light-receiving elements of the light-receiving element group 1003.

The light-emitting element drive unit 1006 is a drive circuit for driving the light source 100B.

The light-receiving element drive unit 1004 is a drive circuit for driving the light-receiving element group 1003.

The control unit 1005 is, for example, an MPU, and has the function of controlling the driving of the light-emitting element drive unit 1006 and the light-receiving element drive unit 1004.

The control unit 1005 also has the function of authenticating the biological object F by comparing between a light-receiving result of the light-receiving element group 1003 and biometric authentication information that has been stored in advance.

For example, the control unit 1005 generates an image pattern (for example, a vein pattern) relating to the biological object F on the basis of the light-receiving result of the light-receiving element group 1003. Then, the control unit 1005 compares the image pattern and an image pattern that has been stored in advance as the biometric authentication information, and carries out authentication of the biological object F (for example, vein authentication) on the basis of the comparison result.

According to this authentication apparatus 1000, near-infrared light can be used to carry out biometric authentication. Also, because the authentication apparatus 1000 is provided with the high-efficiency and long-lasting light-emitting elements 1, the reliability is excellent.

This authentication apparatus 1000 could be incorporated into a variety of electronic machines.
Electronic Machine FIG. 4 is a perspective view illustrating the configuration of a mobile-type (or laptop-type) personal computer to which an electronic machine of the embodiment has been applied.

Figure 4:
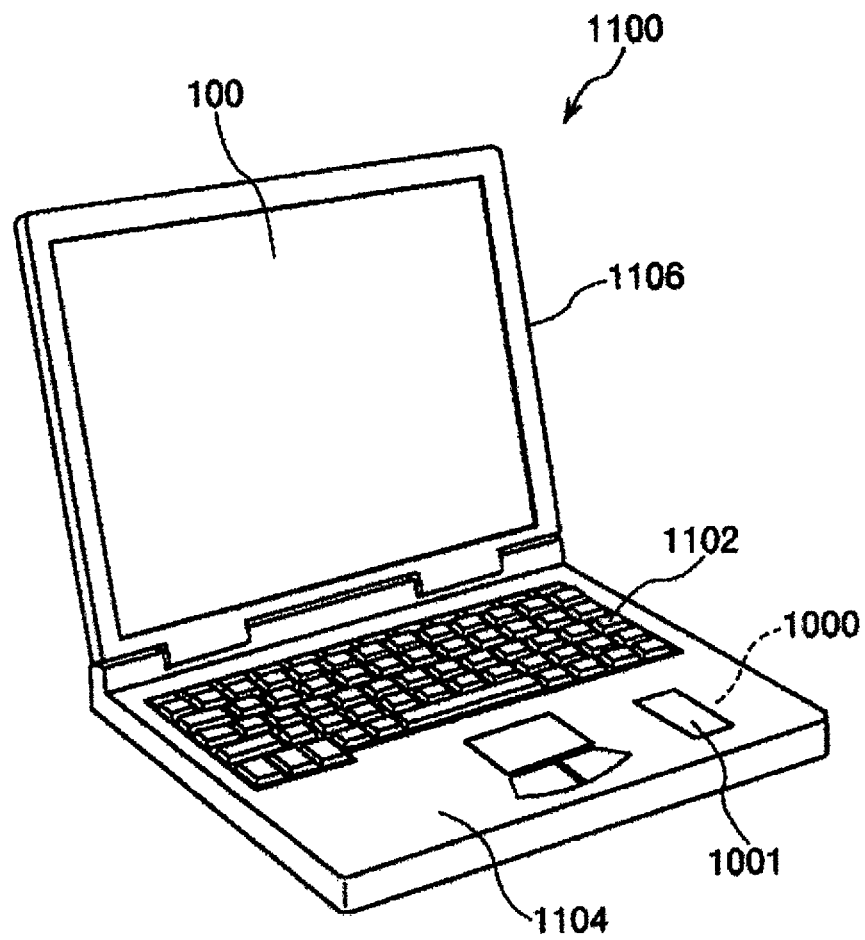
FIG. 4 is a perspective view illustrating the configuration of a mobile-type (or laptop-type) personal computer to which an electronic machine of the embodiment has been applied.

In FIG. 4, a personal computer 1100 is constituted of a main body 1104 provided with a keyboard 1102, and a display unit 1106 provided with a display section; the display unit 1106 is rotatably supported via a hinge structure with respect to the main body 1104.

In this personal computer 1100, the authentication apparatus 1000 described above is provided to the main body 1104.

Because this personal computer 1100 is provided with the high-efficiency and long-lasting light-emitting element 1, the reliability is excellent.

Beyond the personal computer (mobile-type personal computer) of FIG. 4, the electronic machine of the embodiment could be applied to, for example, a mobile phone, a digital still camera, a television, a video camera, a view finder-type or monitor direct-view-type video tape recorder, a laptop-type personal computer, a car navigation apparatus, a pager, an electronic notebook (including those having a communication function), an electronic dictionary, a calculator, an electronic game machine, a word processor, a workstation, a videophone, a security television monitor, electronic binoculars, a POS terminal, a machine provided with a touch panel (for example, a cash dispenser of a financial institution, or an automatic ticket vending machine), a medical machine (for example, an electronic thermometer, a sphygmomanometer, a blood sugar meter, a pulse measurement apparatus, a pulse wave measurement apparatus, an electrocardiogram display apparatus, an ultrasonic diagnostic apparatus, or an endoscopic display apparatus), a fishfinder, a variety of measurement machines, an instrument (for example, an instrument for a vehicle, aircraft, or ship), a flight simulator, a variety of other monitors, a projection-type display apparatus such as a projector, or the like.

A light-emitting element, a light emission apparatus, an authentication apparatus, and an electronic machine of the embodiment have been described above on the basis of the depicted embodiments, but the embodiment is in no way limited thereto.

For example, the light-emitting element and the light emission apparatus of the embodiment may be used as a light source for illumination.

WORKING EXAMPLES

Specific working examples of the embodiment shall be described next.

1. Manufacture of Light Emission Material

A benzo-bis-thiadiazole-based compound represented in the aforementioned formula IRD-1 was synthesized by the following steps 1 to 6.
Step 1

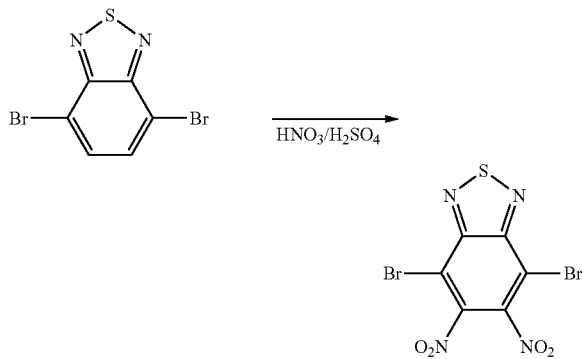

First, 345 mL of fuming nitric acid (97%) was fed into a 1-L three-necked flask and cooled to an internal temperature of 5° C. Concentrated sulfuric acid (95%) (345 mL) was slowly added portionwise thereto, with an internal temperature not greater than 10° C. After completion of the addition, the system was allowed to stand at room temperature, and stirred overnight.

Next, the reaction solution was poured into ice water (1 liter) and the solid was filtered. Toluene (100 mL) was added to the resulting solid (30 g), and recrystallization produced a target product (absolute yield 16 g, percent yield 33%).
Step 2

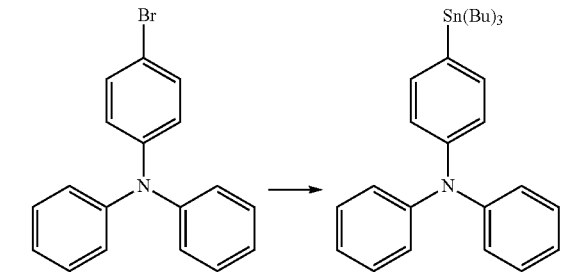

First, 4-bromotriphenylamine (25 g, 77 mmol) was dissolved in dehydrated THF (500 mL) in a 1-L three-necked flask under Ar gas, and cooled to −78° C. A 1.6M n-BuLi hexane solution (52.5 mL, 84.5 mmol) was added dropwise at an internal temperature not greater than −60° C., and the system was stirred for 30 minutes without other alteration. Thereafter, tributyltin (IV) chloride (25.1 g, 77 mmol) was added dropwise at an internal temperature not greater than −60° C. After the dropwise addition, the temperature was allowed to rise to room temperature, and the system was stirred overnight.

Next, NaF (4.20 g, 100 mmol) was dissolved in water (500 mL) and the reaction solution was poured thereinto. Toluene (250 mL) was added and the system was stirred for one hour, following which an organic layer was separated, and an organic layer was again washed using water (250 mL×2). Subjecting the resulting organic layer to a concentration operation under reduced pressure produced a target product (absolute yield 42 g).

Step 3

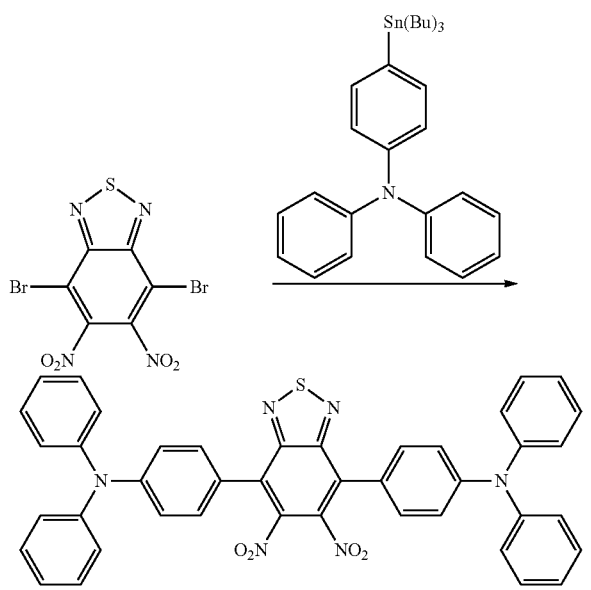

A dibromo body (7.5 g, 19.5 mmol) and tin body (the outcome of step 2) (25.1 g, 50 mmol) were dissolved in dioxane (350 mL) in a 500-mL three-necked flask under Ar gas; Pd(PPh3)4 (1.13 g, 0.975 mmol) was added thereto, the temperature was raised to an internal temperature of 95° C., and the system was stirred overnight.

Next, cooling to room temperature was followed by concentration of the reaction solution under reduced pressure. The resulting solid was washed with toluene, and subsequent recrystallization using 400 mL of toluene produced a target product (absolute yield 7.8 g, percent yield 56%).

Step 4

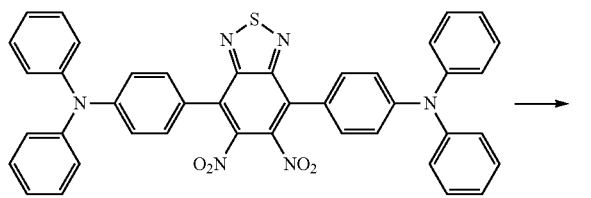

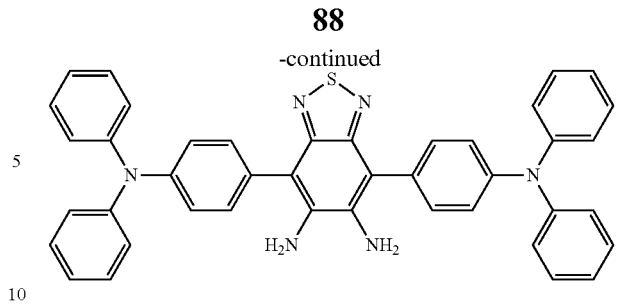

First, acetic acid (200 mL) and Fe (10.2 g, 182 mmol) was added to a 300-mL three-necked flask under Ar gas, and the temperature was raised to an internal temperature of 65° C. The dinitro body obtained in step 3 (10.1 g, 14.2 mmol) was slowly added portionwise thereto, the temperature was raised to 80° C., and the system was stirred for three hours without other alteration.

Next, the reaction solution was cooled to room temperature, and thereafter poured into water (300 mL). The solid (including Fe) was later filtered. THF (300 mL) was used to extract organic matter from this solid, and same was then concentrated under reduced pressure. Toluene (150 mL) was added to the resulting residue, and another round of concentration under reduced pressure produced a target product (absolute yield 7.2 g, percent yield 78%).

Step 5

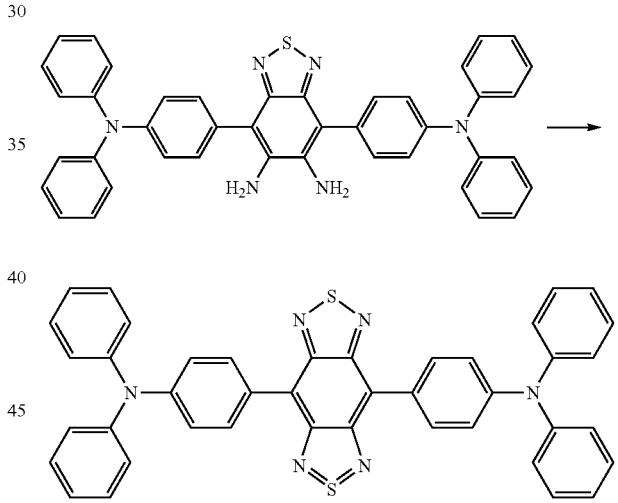

The amino body obtained in step 4 (7.21 g, 11.0 mmol) was dissolved in dehydrated pyridine (180 mL) in a 300-mL three-necked flask under Ar gas, and N-thionyl aniline (1.69 g, 12 mmol) and trimethylsilyl chloride (2.4 g, 22 mmol) were added. Thereafter, the system was heated to an internal temperature of 80° C. and stirred overnight.

The reaction solution was cooled to room temperature, and then poured into water (200 mL). The precipitated crystals were filtered and collected by filtration and the solid (the crystals) was washed with THF, producing 3.8 of solid.

Purification was carried out by silica gel chromatography (silica gel 100 g, developing solvent chlorobenzene).

Finally, purification by re-precipitation using xylene produced a compound represented by the chemical formula IRD-1, which is a target product (absolute yield 2.2 g, percent yield 30%).

2. Manufacture of Light-Emitting Element

Working Example 1

<1> First, a transparent glass substrate having a mean thickness of 0.5 mm was prepared. Next, an ITO electrode (anode) having a mean thickness of 100 nm was formed on this substrate by sputtering.

Then, the substrate was immersed in acetone and 2-propanol, in the stated order, and cleaned ultrasonically, following which an oxygen plasma treatment and argon plasma treatment were carried out. These plasma treatments were each carried out at a plasma power of 100 W, gas flow rate of 20 sccm, and treatment duration of 5 sec in a state where the substrate was heated to 70° C. to 90° C.

<2> Next, a compound represented by the formula HIL-1 was deposited by vacuum deposition onto the ITO electrode, to form a hole injection layer having a mean thickness of 70 nm.

<3> Next, the constituent material of a light emission layer was deposited by vacuum deposition onto the hole injection layer, to form a light emission layer having a mean thickness of 25 nm. As the constituent material of the light emission layer, a compound represented by the formula IRD-1 (benzo-bis-thiadiazole-based compound) was used as the light emission material (guest material), and a compound represented by the formula H-5 (tetracene-based material) was used as the host material. The content (doping concentration) of the light emission material (dopant) in the light emission layer was set to 2.0 wt %.

<4> Next, a film of a compound represented by the formula ETL1-3 (azaindolizine-based compound) was formed by vacuum deposition on the light emission layer, to form an electron transport layer having a mean thickness of 95 nm (first electron transport layer).

<5> Next, a film of lithium fluoride (LiF) was formed by vacuum deposition on the electron transport layer, to form an electron injection layer having a mean thickness of 1 nm.

<6> Next, a film of Al was formed by vacuum deposition on the electron injection layer. A negative electrode having a mean thickness of 100 nm constituted of Al was thereby formed.

<7> Next, the layers that had been formed were covered by a protective cover (sealing member) made of glass, fixed and sealed by an epoxy resin. By the above steps, a light-emitting element was manufactured.

Working Example 2

A light-emitting element was manufactured in a manner similar to the working example 1 described above, except in that the content (doping concentration) of the light emission material (dopant) in the light emission layer was set to 1.0 wt %.

Working Example 3

A light-emitting element was manufactured in a manner similar to the working example 1 described above, except in that the content (doping concentration) of the light emission material (dopant) in the light emission layer was set to 0.5 wt %.

Working Example 4

A light-emitting element was manufactured in a manner similar to the working example 1 described above, except in that a compound represented by the formula IRD-3 was used as the light emission material of the light emission layer, instead of the compound represented by the formula IRD-1.

Working Example 5

A light-emitting element was manufactured in a manner similar to the working example 2 described above, except in that a compound represented by the formula IRD-3 was used as the light emission material of the light emission layer, instead of the compound represented by the formula IRD-1.

Working Example 6

A light-emitting element was manufactured in a manner similar to the working example 3 described above, except in that a compound represented by the formula IRD-3 was used as the light emission material of the light emission layer, instead of the compound represented by the formula IRD-1.

Working Example 7

A light-emitting element was manufactured in a manner similar to the working example 3 described above, except in that a compound represented by the formula H-13 was used as the host material of the light emission layer, instead of the compound represented by the formula H-5.

Working Example 8

A light-emitting element was manufactured in a manner similar to the working example 2 described above, except in that the thickness of the light emission layer was set to 10 nm and the thickness of the electron transport layer was set to 110 nm.

Working Example 9

A light-emitting element was manufactured in a manner similar to the working example 2 described above, except in that the thickness of the light emission layer was set to 50 nm and the thickness of the electron transport layer was set to 70 nm.

Working Example 10

A light-emitting element was manufactured in a manner similar to the working example 2 described above, except in that a second electron transport layer was provided between the light emission layer and the electron transport layer (a first electron transport layer).

The second electron transport layer was formed by vacuum deposition to form a film of a compound represented by the formula ETL2-30 (anthracene-based compound) on the first electron transport layer. The thickness of the first electron transport layer was set to 65 nm, and the thickness of the second electron transport layer was set to 30 nm.

Working Example 11

A light-emitting element was manufactured in a manner similar to the working example 10 described above, except in that the thickness of the first electron transport layer was set to 25 nm and the thickness of the second electron transport layer was set to 70 nm.

Working Example 12

A light-emitting element was manufactured in a manner similar to the working example 10 described above, except in that the thickness of the first electron transport layer was set to 5 nm and the thickness of the second electron transport layer was set to 90 nm.

Working Example 13

A light-emitting element was manufactured in a manner similar to the working example 12 described above, except in that a compound represented by formula IRD-4 was used as the light emission material of the light emission layer, instead of the compound represented by the formula IRD-1.

IRD-4

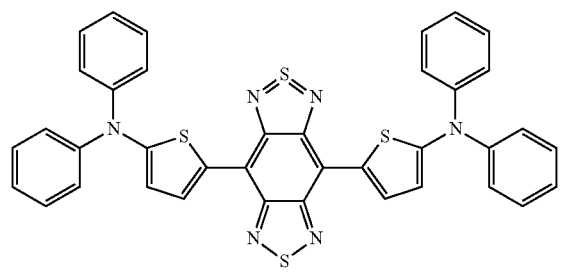

Working Example 14

A light-emitting element was manufactured in a manner similar to the working example 12 described above, except in that a compound represented by the formula IRD-5 was used as the light emission material of the light emission layer, instead of the compound represented by the formula IRD-1.

IRD-5

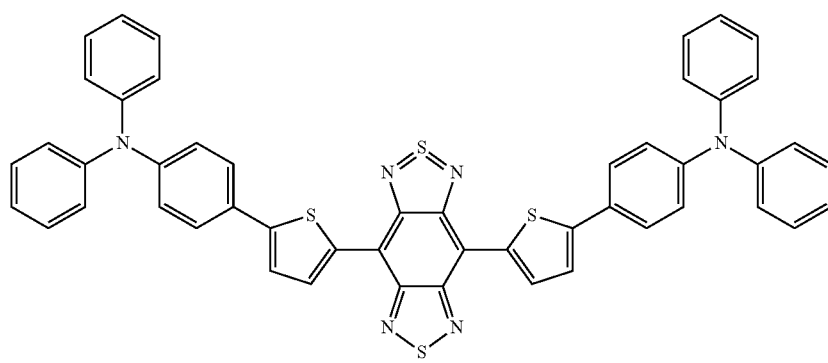

Comparative Example 1

A light-emitting element was manufactured in a manner similar to the working example 1 described above, except in that Alq3 was used as the host material of the light emission layer.

Comparative Example 2

A light-emitting element was manufactured in a manner similar to the working example 1 described above, except in that an anthracene-based compound represented by the formula ETL2-30 was used as the host material of the light emission layer.

Comparative Example 3

A light-emitting element was manufactured in a manner similar to the working example 1 described above, except in that a pentacene-based compound represented by formula DB-Penta below was used as the host material of the light emission layer.

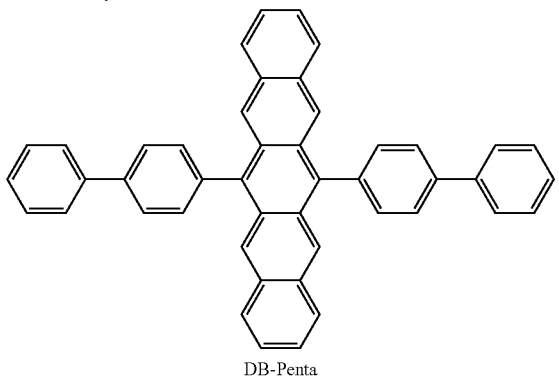

DB-Penta

Comparative Example 4

A light-emitting element was manufactured in a manner similar to the working example 4 described above, except in that Alq3 was used as the host material of the light emission layer.

3. Assessment

For each of the working examples and each of the comparative examples, a constant current source (KEITHLEY 2400 from Toyo Corp.) was used to pass a constant current of 100 mA/cm$^2$ to the light-emitting element, and the spectrum such as the light emission peak wavelength at the time was measured using a small fiber optic spectrometer listed in Table 2. The light emission power PW (mW/cm$^2$) was measured using an optical power measuring device listed in Table 2. The voltage value (drive voltage) at the time was also measured. The external quantum efficiency EQE (%) in the wavelength range of 650 nm and higher at the time was also measured.

Moreover, a constant current of 400 mA/cm$^2$ was passed to the light-emitting element and the lifetime was assessed by measuring the duration (LT80) where the luminance reached 80% of the initial luminance was measured.

Figure 5:
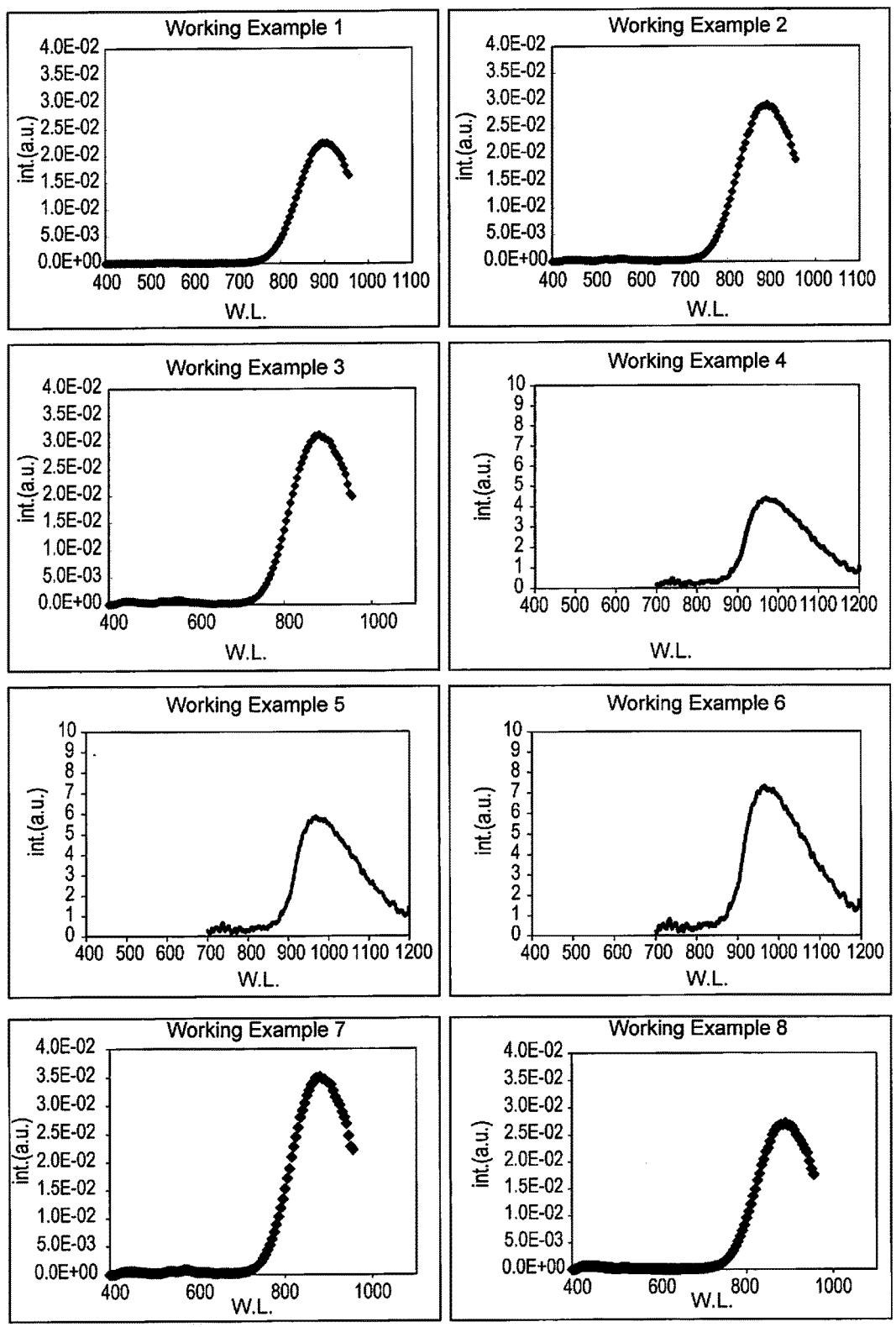
FIG. 5 is graphs illustrating a light emission spectrum of a light-emitting element as in working examples 1 to 8 of the embodiment.
Figure 6:
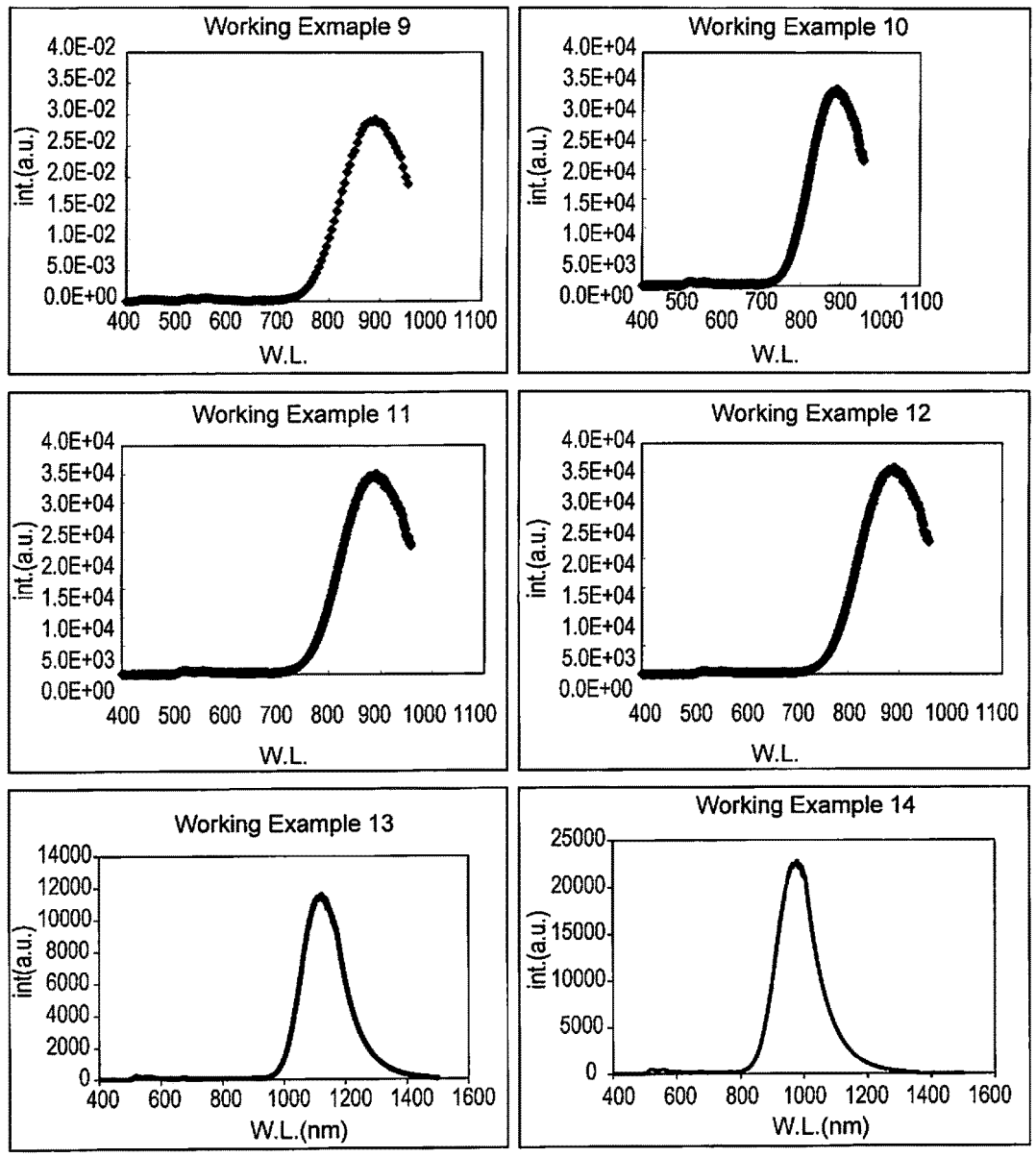
FIG. 6 is graphs illustrating a light emission spectrum of a light-emitting element as in working examples 9 to 14 of the embodiment.
Figure 7:
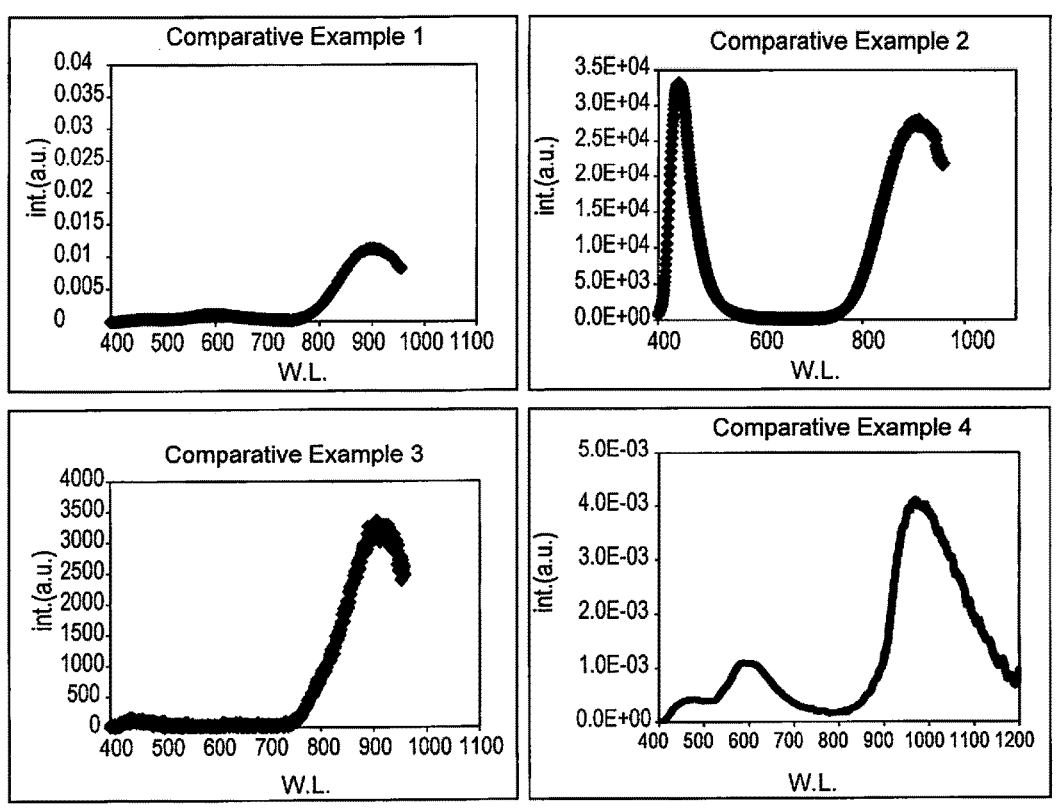
FIG. 7 is a graph illustrating a light emission spectrum of a light-emitting element as in comparative examples 1 to 4.

These measurement results are indicated in Table 1 and FIGS. 5, 6, and 7.

TABLE 1

Element configuration: HIL (70)/Host:Dopant = 100:X(Y)/ETL2(Z)/ETL1(120 − Y − Z)/LiF(1)/Al(100)

| | Y value (light emission layer film thickness) | Z value (ETL2 film thickness) | ETL1 film thickness | HIL | Host | Light emission material | ETL2 | ETL-1 | Doping density (X wt %) | Current density (mA/cm$^2$) | Peak wavelength (nm) | Voltage (V) | PW (mW/cm$^2$) | EQE (%) | Lifetime assessment @ 400 mA/cm$^2$ |
|---|---|---|---|---|---|---|---|---|---|---|---|---|---|---|---|
| Working example 1 | 25 | 0 | 95 | HIL-1 | H-5 | IRD-1 | n/a | ETL1-3 | 2.0 | 100 | 890 | 5.5 | 1.10 | 0.6 | 600 |
| Working example 2 | 25 | 0 | 95 | | | | | | 1.0 | 100 | 888 | 5.6 | 1.50 | 0.9 | 350 |
| Working example 3 | 25 | 0 | 95 | | | | | | 0.5 | 100 | 885 | 5.6 | 1.70 | 1.0 | 230 |
| Working example 4 | 25 | 0 | 95 | | | IRD-3 | | | 2.0 | 100 | 970 | 6.0 | 0.25 | 0.2 | 500 |
| Working example 5 | 25 | 0 | 95 | | | | | | 1.0 | 100 | 968 | 5.9 | 0.40 | 0.3 | 280 |
| Working example 6 | 25 | 0 | 95 | | | | | | 0.5 | 100 | 965 | 6.6 | 0.46 | 0.4 | 200 |
| Working example 7 | 25 | 0 | 95 | | H-13 | IRD-1 | | | 0.5 | 100 | 885 | 5.5 | 1.90 | 1.1 | 150 |
| Working example 8 | 10 | 0 | 110 | | H-5 | IRD-1 | | | 1.0 | 100 | 888 | 5.4 | 1.40 | 0.8 | 340 |
| Working example 9 | 50 | 0 | 70 | | | | | | 1.0 | 100 | 888 | 5.8 | 1.50 | 0.9 | 350 |
| Working example 10 | 25 | 30 | 65 | | | | ETL2-30 | | 1.0 | 100 | 888 | 5.6 | 1.50 | 0.9 | 800 |
| Working example 11 | 25 | 70 | 25 | | | | | | 1.0 | 100 | 888 | 5.6 | 1.50 | 0.9 | 2000 |
| Working example 12 | 25 | 90 | 5 | | | | | | 1.0 | 100 | 888 | 5.7 | 1.50 | 0.9 | 3000 |
| Working example 13 | 25 | 90 | 5 | | | IRD-4 | | | 1.0 | 100 | 1120 | 5.8 | 0.69 | 0.6 | 2000 |
| Working example 14 | 25 | 90 | 5 | | | IRD-5 | | | 1.0 | 100 | 960 | 5.8 | 0.94 | 0.7 | 2000 |
| Comparative example 1 | 25 | 0 | 95 | | Alq$_3$ | IRD-1 | n/a | | 2.0 | 100 | 890 | 7.3 | 0.52 | 0.30 | 150 |
| Comparative example 2 | 25 | 0 | 95 | | ETL2-30 | | | | 2.0 | 100 | 440, 888 | 8.4 | 0.80 | — | <50 |
| Comparative example 3 | 25 | 0 | 95 | | DB-Penta | | | | 2.0 | 100 | 910 | 6.2 | 0.20 | 0.06 | 150 |
| Comparative example 4 | 25 | 0 | 95 | | Alq$_3$ | IRD-3 | | | 2.0 | 100 | 970 | 7.7 | 0.13 | 0.10 | 200 |

TABLE 2

| | Light emission material | PW measurement | Spectrum measurement |
|---|---|---|---|
| Working example 1 | IRD-1 | 8230 optical power meter from ADC Co., Ltd. | S2000 from Ocean Optics Co. |
| Working example 2 | | | |
| Working example 3 | | | |
| Working example 4 | IRD-3 | | Yokogawa spectrum analyzer AQ6370 |
| Working example 5 | | | |
| Working example 6 | | | |
| Working example 7 | IRD-1 | | S2000 from Ocean Optics Co. |
| Working example 8 | | | |
| Working example 9 | | | |
| Working example 10 | | | |
| Working example 11 | | | |
| Working example 12 | | | |
| Working example 13 | IRD-4 | PD300R-IR from Ophir Japan Co., Ltd. | S-9000 from Soma Optics, Co., Ltd. |
| Working example 14 | IRD-5 | | |
| Comparative example 1 | IRD-1 | 8230 optical power meter from ADC Co., Ltd. | S2000 from Ocean Optics Co. |
| Comparative example 2 | | | |
| Comparative example 3 | | | |

TABLE 2-continued

| | Light emission material | PW measurement | Spectrum measurement |
|---|---|---|---|
| Comparative example 4 | IRD-3 | | Yokogawa spectrum analyzer AQ6370 |

As is apparent from table 1, the light-emitting elements of each of the working examples emit light in the near-infrared region, and have a superior balance between light emission efficiency and lifetime as compared to the light-emitting elements of the comparative examples.

Also, as is illustrated in FIGS. 5 and 6, the light-emitting elements of each of the working examples had substantially no light emission outside the near-infrared region. By contrast, as is illustrated in FIG. 7, the light-emitting elements of each of the comparative examples had relatively strong light emission observed outside the near-infrared region. This is presumably because the host material does not emit light in the light-emitting elements of each of the working examples, whereas the host material does emit light in the light-emitting elements of each of the comparative examples.

Moreover, as is illustrated in Table 1, when the light-emitting elements of the working examples 1 to 3 (and in particular, working example 1) and the light-emitting element of the comparative example 1 were compared, the light-emitting elements of the working examples 1 to 3 (and in particular, working example 1) had a higher external quantum efficiency and allowed for a greater reduction in concentration quenching as compared to the light-emitting element of the comparative example 1.

Additionally, in the working example 13 in which the formula IRD-4 was used as the light emission material and in the working example 14 in which the formula IRD-5 was used as the light emission material, the light emission lifetime is long and the light emission peak wavelength is obtained in the near-infrared wavelength range of 960 nm and higher. Therefore, it is useful for analyzing and determining the blood component such as hemoglobin in which light is absorbed in the near-infrared wavelength range of 960 nm and higher.

A light-emitting element of one embodiment includes an anode, a cathode, and a light emission layer. The light emission layer is arranged between the anode and the cathode and configured to emit light by energization between the anode and the cathode. The light emission layer includes a compound represented by a general formula (NIR-D) as a light emission material and a compound represented by a formula IRH-1 as a host material of the light emission material. The general formula (NIR-D) is

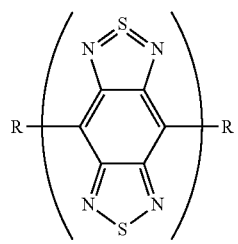

wherein each R independently indicates group comprising a phenyl group, a thiophenyl group, a furyl group, or at least one species of derivatives thereof. The formula IRH-1 is

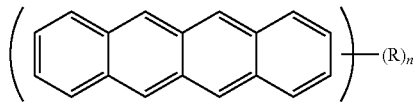

wherein n indicates a natural number 1 to 12, and each R independently indicates a hydrogen atom, an alkyl group, an optionally substituted aryl group, or an arylamino group.

According to the light-emitting element configured in this manner, a compound represented by the general formula (NIR-D) (a benzo-bis-thiadiazole-based compound) is used as the light emission material, and therefore it is possible to obtain light emission in a wavelength range of 700 nm and greater (a near-infrared region).

Also, a tetracene-based material is used as the host material, and therefore energy can be efficiently transferred from the host material to the light emission material. For this reason, the light-emitting element can be endowed with excellent light emission efficiency.

Moreover, the tetracene-based material has excellent stability (resistance) to electrons and holes, and therefore the lifetime of the light emission layer can be extended, thus also making it possible to extend the lifetime of the light-emitting element.

In the light-emitting element of one embodiment, preferably, the host material is a compound represented by formula IRH-2, which is

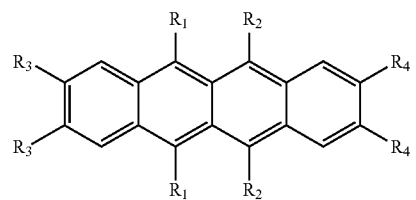

wherein $R_1$ to $R_4$ each independently indicate a hydrogen atom, an alkyl group, an optionally substituted aryl group, or an arylamino group, and $R_1$ to $R_4$ are the same as one another or different from one another.

This makes it possible to suppress a rise in voltage during continuous operation, and makes it possible to endow the light-emitting element with even higher light emission efficiency as well as to extend the lifetime of the light-emitting element.

In the light-emitting element of one embodiment, preferably, the host material is a compound represented by formula IRH-3, which is

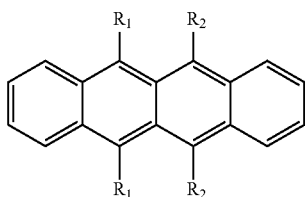

wherein $R_1$ and $R_2$ each independently indicate a hydrogen atom, an alkyl group, an optionally substituted aryl group, or an arylamino group, and $R_1$ and $R_2$ are the same as one another or different from one another.

This makes it possible to suppress a rise in voltage during continuous operation, and makes it possible to endow the light-emitting element with even higher light emission efficiency as well as to extend the lifetime of the light-emitting element.

In the light-emitting element of one embodiment, preferably, the host material is constituted of carbon atoms and hydrogen atoms.

This makes it possible to prevent the occurrence of undesirable interactions between the host material and the light emission material. Therefore, the light emission efficiency of the light-emitting element can be increased. Additionally, the resistance of the host material to electrons and positive holes can be raised. Therefore, the lifetime of the light-emitting element can be extended.

In the light-emitting element of one embodiment, preferably, a content of the light emission material in the light emission layer is 0.5 wt % to 5.0 wt %.

This makes it possible to give the light-emitting element an excellent balance between light emission efficiency and longevity.

In the light-emitting element of one embodiment, preferably, the light-emitting element further includes an electron transport layer arranged between the light emission layer and the cathode and including a compound that has an anthracene skeleton.

This makes it possible to efficiently transport and inject electrons to the light emission layer. As a result, the light emission efficiency of the light-emitting element can be raised.

In light-emitting element of one embodiment, preferably, the electron transport layer has a first electron transport layer including an azaindolizine-based compound that has an azaindolizine skeleton and the anthracene skeleton in a molecule, and a second electron transport layer arranged between the first electron transport layer and the light emission layer and including an anthracene-based compound that has an anthracene skeleton in a molecule and is constituted of carbon atoms and hydrogen atoms.

This makes it possible to efficiently transport and inject electrons to the light emission layer, as well as to reduce deterioration of the electron transport layer. As a result, the light-emitting element can be given a higher light emission efficiency and the lifetime of the light-emitting element can be extended.

In the light-emitting element of one embodiment, preferably, a thickness of the second electron transport layer is greater than a thickness of the first electron transport layer.

This makes it possible to efficiently transport and inject the electrons to the light emission layer while also keeping the drive voltage of the light-emitting element low, and possible to reduce deterioration of the electron transport layer.

In the light-emitting element of one embodiment, preferably, a thickness of the second electron transport layer is 30 nm to 150 nm.

This makes it possible to efficiently transport and inject the electrons to the light emission layer while also keeping the drive voltage of the light-emitting element low, and possible to reduce deterioration of the electron transport layer.

In the light-emitting element of one embodiment, preferably, a thickness of the electron transport layer is 55 nm to 200 nm.

This makes it possible to efficiently transport and inject the electrons to the light emission layer while also keeping the drive voltage of the light-emitting element low.

In the light-emitting element of one embodiment, preferably, a thickness of the light emission layer is 10 nm to 50 nm.

This makes it possible to extend the lifetime of the light-emitting element, even while also keeping the drive voltage of the light-emitting element low.

A light emission apparatus of one embodiment is characterized by including the light-emitting element of the embodiment.

Such a light emission apparatus is able to emit light in the near-infrared region. Also, because the light emission apparatus is provided with the high-efficiency and long-lasting light-emitting elements, the reliability is excellent.

An authentication apparatus of one embodiment is characterized by including with the light-emitting element of one embodiment.

Such an authentication apparatus is able to use near-infrared light to carry out biometric authentication. Also, because the authentication apparatus is provided with the high-efficiency and long-lasting light-emitting elements 1, the reliability is excellent.

In the light-emitting element of the present invention, the light emission material is characterized by being a compound represented by formula IRD-4.

IRD-4

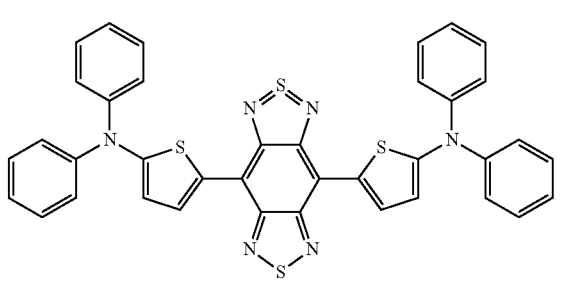

Also, in the light-emitting element of the present invention, the light emission material may be a compound represented by formula IRD-5.

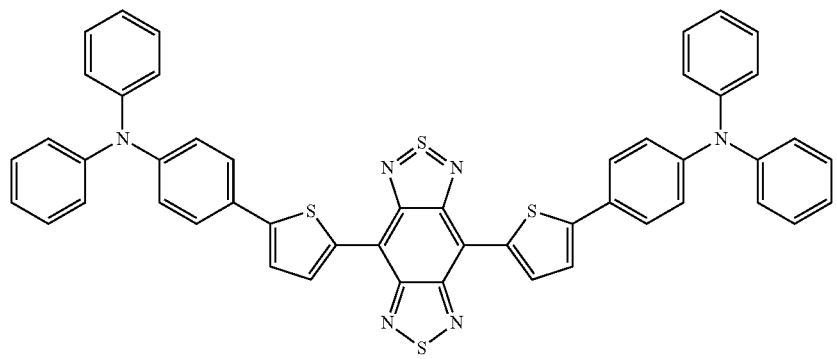

IRD-5

An electronic machine of one embodiment is characterized by including with the light-emitting element of one embodiment.

Because such an electronic machine is provided with the high-efficiency and long-lasting light-emitting element, the reliability is excellent.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A light-emitting element comprising:
   an anode;
   a cathode; and
   a light emission layer arranged between the anode and the cathode and configured to emit light by energization between the anode and the cathode,
   the light emission layer including a compound represented by a general formula NIR-D as a light emission material and a compound represented by a formula IRH-1 as a host material of the light emission material,
   the general formula NIR-D being

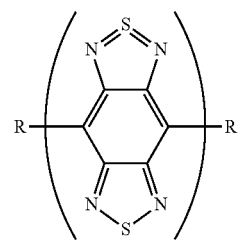

wherein each R independently indicates group comprising a phenyl group, a thiophenyl group, a furyl group, or at least one species of derivatives thereof,
   the formula IRH-1 being

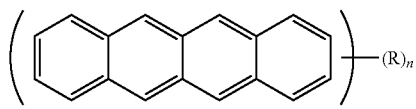

wherein n indicates a natural number 1 to 12, and each R independently indicates a hydrogen atom, an alkyl group, an optionally substituted aryl group, or an arylamino group.

2. The light-emitting element as set forth in claim 1, wherein
   the host material is a compound represented by a formula IRH-2, which is

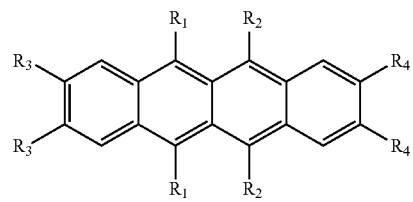

wherein $R_1$ to $R_4$ each independently indicate a hydrogen atom, an alkyl group, an optionally substituted aryl group, or an arylamino group, and $R_1$ to $R_4$ are the same as one another or different from one another.

3. The light-emitting element as set forth in claim 1, wherein
   the host material is a compound represented by a formula IRH-3, which is

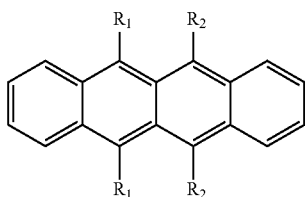

wherein $R_1$ and $R_2$ each independently indicate a hydrogen atom, an alkyl group, an optionally substituted aryl group, or an arylamino group, and $R_1$ and $R_2$ are the same as one another or different from one another.

4. The light-emitting element as set forth in claim 1, wherein
the host material is constituted of carbon atoms and hydrogen atoms.

5. The light-emitting element as set forth in claim 1, wherein
a content of the light emission material in the light emission layer is 0.5 wt % to 5.0 wt %.

6. The light-emitting element as set forth in claim 1, further comprising
an electron transport layer arranged between the light emission layer and the cathode and including a compound that has an anthracene skeleton.

7. The light-emitting element as set forth in claim 6, wherein
the electron transport layer has a first electron transport layer including an azaindolizine-based compound that has an azaindolizine skeleton and the anthracene skeleton in a molecule, and a second electron transport layer arranged between the first electron transport layer and the light emission layer and including an anthracene-based compound that has an anthracene skeleton in a molecule and is constituted of carbon atoms and hydrogen atoms.

8. The light-emitting element as set forth in claim 7, wherein
a thickness of the second electron transport layer is greater than a thickness of the first electron transport layer.

9. The light-emitting element as set forth in claim 7, wherein
a thickness of the second electron transport layer is 30 nm to 150 nm.

10. The light-emitting element as set forth in claim 6, wherein
a thickness of the electron transport layer is 55 nm to 200 nm.

11. The light-emitting element as set forth in claim 1, wherein
a thickness of the light emission layer is 10 nm to 50 nm.

12. The light-emitting element as set forth in claim 1, wherein
the light emission material is a compound represented by a formula IRD-4, which is

IRD-4

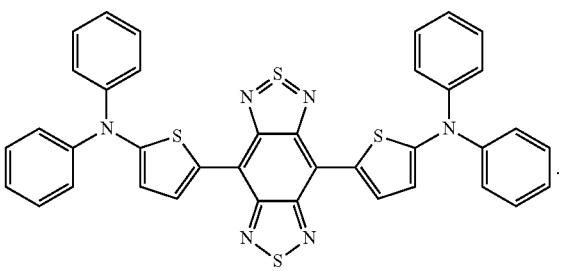

13. The light-emitting element as set forth in claim 1, wherein
the light emission material is a compound represented by a formula IRD-5, which is

IRD-5

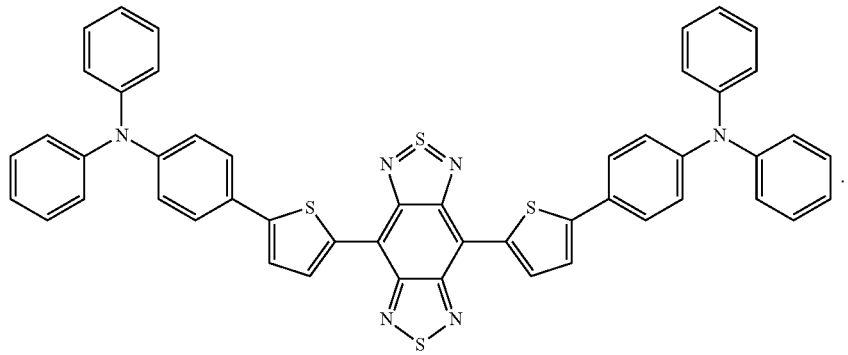

14. A light emission apparatus comprising the light-emitting element as set forth in claim 1.

15. An authentication apparatus comprising the light-emitting element as set forth in claim 1.

16. An electronic machine comprising the light-emitting element as set forth in claim 1.

* * * * *